US009526292B2

(12) United States Patent
Waters

(10) Patent No.: US 9,526,292 B2
(45) Date of Patent: Dec. 27, 2016

(54) POWER MODULES AND HEADGEAR

(71) Applicant: Michael Waters, Aspen, CO (US)

(72) Inventor: Michael Waters, Aspen, CO (US)

(*) Notice: Subject to any disclaimer, the term of this patent is extended or adjusted under 35 U.S.C. 154(b) by 770 days.

(21) Appl. No.: 13/725,558

(22) Filed: Dec. 21, 2012

(65) Prior Publication Data

US 2013/0198935 A1  Aug. 8, 2013

Related U.S. Application Data

(63) Continuation-in-part of application No. 11/941,558, filed on Nov. 16, 2007, now Pat. No. 8,388,164,
(Continued)

(51) Int. Cl.
*A42B 1/24* (2006.01)
*A42C 5/00* (2006.01)
(Continued)

(52) U.S. Cl.
CPC . *A42C 5/00* (2013.01); *A42B 1/24* (2013.01); *A42B 1/244* (2013.01); *G02C 11/04* (2013.01);
(Continued)

(58) Field of Classification Search
CPC ........... A42C 5/00; A42B 1/244; A42B 1/242; H05K 5/023; A45F 2200/0508
(Continued)

(56) References Cited

U.S. PATENT DOCUMENTS 645,984 A   3/1900  Tournier
909,742 A   1/1909  Borchert
(Continued)

FOREIGN PATENT DOCUMENTS

AU   11785/76    9/1977
AU   63109/94   11/1994
(Continued)

OTHER PUBLICATIONS

Docket report of *Waters Industries, Inc. v. Totes Isotoner Corporation*, et al., United States District Court for the Northern District of Illinois, Case No. 1:10-cv-04487 filed Jul. 19, 2010 (4 pages).
(Continued)

*Primary Examiner* — Katherine Moran
(74) *Attorney, Agent, or Firm* — Fitch, Even, Tabin & Flannery LLP

(57) ABSTRACT

A power module assembly for being mounted to headgear is provided. The power module assembly can include a housing member and a cover member configured to mount thereto. The housing member and cover member can have a generally curved profile configured for fitting against a user's head. The housing member can be generally rigid, and the cover member generally flexible and resilient, so that the cover member can mount to the housing member with a snap fit connection therebetween. The housing member can further include a plurality of handles, so that straps of the headgear can extend through openings between the handles corresponding surfaces of the housing member to secure the power module assemble to the headgear.

17 Claims, 37 Drawing Sheets

Related U.S. Application Data which is a continuation-in-part of application No. PCT/US2006/018968, filed on May 17, 2006.

(60) Provisional application No. 61/580,165, filed on Dec. 23, 2011, provisional application No. 60/681,852, filed on May 17, 2005, provisional application No. 60/746,217, filed on May 2, 2006.

(51) Int. Cl.
  *H05K 5/00* (2006.01)
  *H05K 5/02* (2006.01)
  *H05K 5/03* (2006.01)
  *G02C 11/04* (2006.01)

(52) U.S. Cl.
  CPC ............ *H05K 5/0086* (2013.01); *H05K 5/023* (2013.01); *H05K 5/03* (2013.01); *A45F 2200/0508* (2013.01)

(58) Field of Classification Search
  USPC ........... 2/209.13, 209.14, 6.2, 416, 422, 425
  See application file for complete search history.

(56) References Cited

U.S. PATENT DOCUMENTS

| | | |
|---|---|---|
| 1,098,628 A | 6/1914 | Hyman |
| 1,109,415 A | 9/1914 | Harris |
| 1,261,824 A | 1/1918 | La Vine |
| 1,255,265 A | 2/1918 | Zachara |
| 1,323,822 A | 12/1919 | Bramming |
| D58,302 S | 7/1921 | Batholomew |
| 1,438,586 A | 12/1922 | Eaton |
| 1,448,353 A | 3/1923 | Barany |
| 1,475,653 A | 11/1923 | Rosenberg |
| 1,572,210 A | 2/1926 | Kolibas |
| 1,615,067 A | 1/1927 | Boerman |
| 1,744,777 A | 1/1930 | Lundgren |
| 1,749,998 A | 3/1930 | Collins |
| 1,879,512 A | 9/1932 | Rotea |
| 1,883,756 A | 10/1932 | Bloom |
| D114,980 S | 1/1939 | Wengen |
| 2,196,543 A | 4/1940 | Anderson |
| D137,375 S | 2/1944 | Heit |
| 2,369,829 A | 2/1945 | Johnson |
| 2,373,553 A | 4/1945 | Fetterman |
| 2,461,254 A | 2/1949 | Bassett |
| 2,473,394 A | 6/1949 | Scott |
| 2,531,585 A | 11/1950 | Pope |
| 2,540,435 A | 2/1951 | Ferguson |
| 2,552,764 A | 5/1951 | Bedford, Jr |
| 2,567,046 A | 9/1951 | Anderson |
| 2,591,112 A | 4/1952 | Zwierzynski |
| 2,638,532 A | 5/1953 | Brady |
| 2,640,980 A | 6/1953 | Prupis |
| 2,705,751 A | 4/1955 | Harris et al. |
| 2,730,720 A | 1/1956 | Saunders |
| 2,788,439 A | 4/1957 | Hesse |
| 2,904,670 A | 9/1959 | Calmes |
| 2,966,580 A | 12/1960 | Taylor |
| 2,978,696 A | 4/1961 | Keller et al. |
| 3,008,040 A | 11/1961 | Moore |
| 3,032,647 A | 5/1962 | Wansky et al. |
| 3,040,881 A | 6/1962 | McNeil |
| 3,057,992 A | 10/1962 | Baker |
| 3,060,308 A | 10/1962 | Fortuna |
| 3,123,208 A | 3/1964 | Barnum et al. |
| 3,184,058 A | 5/1965 | Crowther |
| 3,201,771 A | 8/1965 | Proulx |
| D207,919 S | 6/1967 | Fai |
| 3,350,552 A | 10/1967 | Lawrence |
| 3,358,137 A | 12/1967 | Sinclair et al. |
| 3,447,164 A | 6/1969 | Greenhouse |
| D215,751 S | 10/1969 | Castelliano |
| 3,491,374 A | 1/1970 | Frangos |
| 3,535,282 A | 10/1970 | Mallory |
| 3,537,909 A | 11/1970 | Horton |
| 3,602,759 A | 8/1971 | Evans et al. |
| 3,634,676 A | 1/1972 | Castellano |
| 3,647,059 A | 3/1972 | Humphreys |
| 3,666,901 A | 5/1972 | Weinhart |
| 3,683,168 A | 8/1972 | Tatje |
| 3,749,902 A | 7/1973 | Drew |
| 3,769,663 A | 11/1973 | Perl |
| D229,975 S | 1/1974 | Klugmann |
| 3,793,517 A | 2/1974 | Carlini |
| 3,845,389 A | 10/1974 | Phillips et al. |
| 3,947,676 A | 3/1976 | Battilana et al. |
| 3,963,917 A | 6/1976 | Romano |
| 4,005,776 A | 2/1977 | Seeley |
| 4,011,600 A | 3/1977 | Malk |
| 4,053,688 A | 10/1977 | Perkins et al. |
| 4,092,704 A | 5/1978 | Malm |
| 4,176,932 A | 12/1979 | Young et al. |
| 4,186,429 A | 1/1980 | Johnston |
| 4,210,952 A | 7/1980 | Ressmeyer |
| 4,231,079 A | 10/1980 | Heminover |
| 4,254,451 A | 3/1981 | Cochran, Jr. |
| 4,268,894 A | 5/1981 | Bartunek et al. |
| 4,270,227 A | 6/1981 | Wolfe |
| 4,283,127 A | 8/1981 | Rosenwinkel et al. |
| 4,298,913 A | 11/1981 | Lozar |
| 4,317,162 A | 2/1982 | Richards et al. |
| 4,332,007 A | 5/1982 | Gibstein et al. |
| 4,364,107 A | 12/1982 | Wieczorek et al. |
| 4,392,183 A | 7/1983 | Ostlund et al. |
| 4,398,237 A | 8/1983 | Doyel |
| 4,406,040 A | 9/1983 | Cannone |
| 4,425,531 A | 1/1984 | Holmes |
| D272,733 S | 2/1984 | Cosmos et al. |
| 4,430,532 A | 2/1984 | Matsumoto |
| 4,442,478 A | 4/1984 | Stansbury |
| 4,462,064 A | 7/1984 | Schweitzer |
| 4,470,263 A | 9/1984 | Lehovec et al. |
| 4,483,021 A | 11/1984 | McCall |
| 4,516,157 A | 5/1985 | Campbell |
| 4,521,831 A | 6/1985 | Thayer |
| 4,541,698 A | 9/1985 | Lerner |
| 4,551,857 A | 11/1985 | Galvin |
| 4,559,516 A | 12/1985 | Schott et al. |
| 4,570,206 A | 2/1986 | Deutsch |
| 4,602,191 A | 7/1986 | Davila |
| 4,604,760 A | 8/1986 | Coin |
| 4,616,297 A | 10/1986 | Liu |
| 4,631,644 A | 12/1986 | Dannhauer |
| 4,638,410 A | 1/1987 | Barker |
| 4,641,647 A | 2/1987 | Behan |
| 4,642,817 A | 2/1987 | Ferstenfeld |
| 4,665,568 A | 5/1987 | Stutes |
| 4,667,274 A | 5/1987 | Daniel |
| 4,669,610 A | 6/1987 | Lindsey et al. |
| 4,680,815 A | 7/1987 | Hirsch et al. |
| 4,774,643 A | 9/1988 | McGinnis et al. |
| 4,794,496 A | 12/1988 | Lanes et al. |
| 4,817,212 A | 4/1989 | Benoit |
| 4,822,160 A | 4/1989 | Tsai |
| 4,822,161 A | 4/1989 | Jimmy |
| 4,827,384 A | 5/1989 | Von Schlemmer |
| 4,829,285 A | 5/1989 | Brand et al. |
| 4,872,218 A | 10/1989 | Holt |
| 4,875,147 A | 10/1989 | Auer |
| 4,884,067 A | 11/1989 | Nordholm et al. |
| 4,901,210 A | 2/1990 | Hanabusa |
| 4,901,211 A | 2/1990 | Shen |
| 4,902,119 A | 2/1990 | Porsche |
| 4,904,078 A | 2/1990 | Gorike |
| 4,920,466 A | 4/1990 | Liu |
| 4,945,458 A | 7/1990 | Batts et al. |
| 4,951,068 A | 8/1990 | Ichikawa et al. |
| 4,959,760 A | 9/1990 | Wu |
| 4,963,045 A | 10/1990 | Willcox |
| 4,991,068 A | 2/1991 | Mickey |
| 4,998,187 A | 3/1991 | Herrick |

(56) References Cited

U.S. PATENT DOCUMENTS

| | | | |
|---|---|---|---|
| 5,003,640 A * | 4/1991 | Pizzacar | A42B 1/248 |
| | | | 2/181.4 |
| D316,932 S | 5/1991 | Escher, Jr. | |
| 5,039,829 A | 8/1991 | Brucksch | |
| 5,060,814 A | 10/1991 | Oglesbee | |
| 5,068,771 A | 11/1991 | Savage, Jr. | |
| 5,070,436 A | 12/1991 | Alexander et al. | |
| 5,088,127 A | 2/1992 | Thornock | |
| 5,111,366 A | 5/1992 | Rife et al. | |
| 5,113,325 A | 5/1992 | Eisenbraun | |
| 5,117,510 A | 6/1992 | Broussard et al. | |
| 5,122,943 A | 6/1992 | Pugh | |
| 5,138,538 A | 8/1992 | Sperling | |
| 5,140,116 A | 8/1992 | Schmitt-Walter | |
| 5,140,220 A | 8/1992 | Hasegawa | |
| 5,143,443 A | 9/1992 | Madsen | |
| 5,158,356 A | 10/1992 | Guthrie | |
| 5,163,420 A | 11/1992 | Van Dear Bel | |
| 5,164,749 A | 11/1992 | Shelton | |
| 5,165,789 A | 11/1992 | Womack | |
| 5,183,326 A | 2/1993 | Case | |
| 5,189,512 A | 2/1993 | Cameron et al. | |
| 5,193,220 A | 3/1993 | Ichinohe et al. | |
| 5,193,347 A | 3/1993 | Apisdorm | |
| 5,207,500 A | 5/1993 | Rios et al. | |
| 5,218,385 A | 6/1993 | Lii | |
| 5,224,772 A | 7/1993 | Fustos | |
| 5,230,558 A | 7/1993 | Jong | |
| 5,238,344 A | 8/1993 | Nagayama | |
| 5,245,516 A | 9/1993 | de Haas et al. | |
| 5,249,675 A | 10/1993 | Strauss et al. | |
| D343,470 S | 1/1994 | Yuen | |
| 5,278,734 A | 1/1994 | Ferber | |
| D349,123 S | 7/1994 | Cooley et al. | |
| 5,329,637 A | 7/1994 | Walker | |
| 5,331,333 A | 7/1994 | Tagawa et al. | |
| 5,331,357 A | 7/1994 | Cooley et al. | |
| 5,353,205 A | 10/1994 | Hudak | |
| 5,357,409 A | 10/1994 | Glatt | |
| 5,363,291 A | 11/1994 | Steiner | |
| 5,367,345 A | 11/1994 | da Silva | |
| 5,404,593 A | 4/1995 | Kronenberger | |
| 5,408,393 A | 4/1995 | Becker | |
| 5,410,746 A | 4/1995 | Gelber | |
| 5,412,545 A | 5/1995 | Rising | |
| 5,418,565 A | 5/1995 | Smith | |
| 5,423,419 A | 6/1995 | Wentz et al. | |
| 5,438,698 A | 8/1995 | Burton et al. | |
| 5,452,190 A | 9/1995 | Priesemuth | |
| 5,460,346 A | 10/1995 | Hirsch | |
| 5,463,538 A | 10/1995 | Womack | |
| 5,467,992 A | 11/1995 | Harkness | |
| 5,485,358 A | 1/1996 | Chien | |
| 5,488,361 A | 1/1996 | Perry | |
| 5,503,637 A | 4/1996 | Kyricos et al. | |
| 5,508,900 A | 4/1996 | Norman | |
| 5,510,961 A | 4/1996 | Peng | |
| 5,541,767 A | 7/1996 | Murphy et al. | |
| 5,541,816 A | 7/1996 | Miserendino | |
| 5,542,627 A | 8/1996 | Crenshaw et al. | |
| 5,546,099 A | 8/1996 | Quint et al. | |
| 5,564,128 A | 10/1996 | Richardson | |
| 5,567,038 A | 10/1996 | Lary | |
| D375,372 S | 11/1996 | Allen | |
| 5,575,554 A | 11/1996 | Guritz | |
| 5,601,358 A | 2/1997 | Chien | |
| 5,606,743 A | 2/1997 | Vogt et al. | |
| 5,608,808 A | 3/1997 | da Silva | |
| 5,610,678 A | 3/1997 | Tsuboi et al. | |
| 5,644,189 A | 7/1997 | Busby | |
| 5,655,374 A | 8/1997 | Santilli | |
| D383,754 S | 9/1997 | Yuen | |
| D383,863 S | 9/1997 | Yuen | |
| 5,667,291 A | 9/1997 | Caplan et al. | |
| 5,667,292 A | 9/1997 | Sabalvaro, Jr. | |
| 5,676,449 A | 10/1997 | Newsome | |
| 5,677,079 A | 10/1997 | DeZorzi | |
| 5,680,718 A | 10/1997 | Ratcliffe et al. | |
| 5,688,039 A | 11/1997 | Johnson | |
| D388,113 S | 12/1997 | Feinbloom | |
| 5,692,244 A | 12/1997 | Johnson et al. | |
| 5,708,449 A | 1/1998 | Heacock et al. | |
| 5,709,464 A | 1/1998 | Tseng | |
| 5,718,335 A | 2/1998 | Boudreaux | |
| 5,722,762 A | 3/1998 | Soll | |
| 5,730,290 A | 3/1998 | Futo | |
| 5,741,060 A | 4/1998 | Johnson | |
| 5,743,621 A | 4/1998 | Mantha et al. | |
| 5,758,947 A | 6/1998 | Glatt | |
| 5,774,338 A | 6/1998 | Wessling, III | |
| 5,786,665 A | 7/1998 | Ohtsuki et al. | |
| 5,800,278 A | 9/1998 | Varriano | |
| 5,806,961 A | 9/1998 | Dalton et al. | |
| 5,822,636 A | 10/1998 | Cho | |
| 5,829,063 A | 11/1998 | Cheng | |
| 5,829,860 A | 11/1998 | Lawther et al. | |
| 5,836,673 A | 11/1998 | Lo | |
| 5,845,778 A | 12/1998 | Hickey, Jr. | |
| 5,845,987 A | 12/1998 | Painter | |
| 5,857,220 A | 1/1999 | Erny et al. | |
| 5,865,333 A | 2/1999 | Wolfe | |
| 5,871,271 A | 2/1999 | Chien | |
| D407,187 S | 3/1999 | Makki | |
| 5,876,241 A | 3/1999 | Frantz | |
| 5,893,631 A | 4/1999 | Padden | |
| 5,894,604 A | 4/1999 | Crabb et al. | |
| 5,918,966 A | 7/1999 | Arnold | |
| 5,920,910 A | 7/1999 | Calvo | |
| 5,921,674 A | 7/1999 | Koczi | |
| 5,922,489 A | 7/1999 | Adachi | |
| 5,931,693 A | 8/1999 | Yamazaki | |
| 5,946,071 A | 8/1999 | Feldman | |
| 5,982,969 A | 11/1999 | Sugiyama et al. | |
| 5,997,165 A | 12/1999 | Lehrer | |
| 6,005,536 A | 12/1999 | Beadles et al. | |
| 6,007,212 A | 12/1999 | Chan | |
| 6,007,213 A | 12/1999 | Baumgartner | |
| 6,009,563 A | 1/2000 | Swanson et al. | |
| 6,012,822 A | 1/2000 | Robinson | |
| 6,012,827 A | 1/2000 | Caplan et al. | |
| D420,035 S | 2/2000 | Hartman | |
| D420,207 S | 2/2000 | Barton et al. | |
| 6,021,525 A | 2/2000 | Mertins | |
| 6,023,788 A | 2/2000 | McCallum et al. | |
| 6,028,627 A | 2/2000 | Helmsderfer | |
| 6,032,291 A | 3/2000 | Asenguah et al. | |
| 6,032,293 A | 3/2000 | Makki | |
| 6,056,413 A | 5/2000 | Urso | |
| D428,431 S | 7/2000 | Jordan | |
| 6,086,214 A | 7/2000 | Ridge | |
| 6,087,037 A | 7/2000 | Rieder | |
| 6,088,053 A | 7/2000 | Hammack et al. | |
| 6,094,749 A | 8/2000 | Proctor | |
| 6,113,243 A | 9/2000 | Saul | |
| 6,113,244 A | 9/2000 | Baumgartner | |
| 6,116,745 A | 9/2000 | Yei | |
| 6,124,056 A | 9/2000 | Kimura | |
| 6,126,294 A | 10/2000 | Koyama et al. | |
| 6,167,570 B1 | 1/2001 | Su | |
| 6,168,286 B1 | 1/2001 | Duffy | |
| 6,172,657 B1 | 1/2001 | Kamakura et al. | |
| 6,174,075 B1 | 1/2001 | Fuwausa | |
| 6,176,601 B1 | 1/2001 | Nester | |
| 6,206,543 B1 | 3/2001 | Henry | |
| 6,236,007 B1 | 5/2001 | Ho | |
| 6,237,147 B1 | 5/2001 | Brockman | |
| 6,240,566 B1 | 6/2001 | Scantlin | |
| 6,244,721 B1 | 6/2001 | Rodriguez et al. | |
| 6,250,769 B1 | 6/2001 | Kirk | |
| D445,928 S | 7/2001 | Sharrah et al. | |
| 6,256,795 B1 | 7/2001 | Habel | |
| D446,324 S | 8/2001 | Lynch et al. | |
| 6,290,368 B1 | 9/2001 | Lehrer | |
| 6,299,323 B1 | 10/2001 | Yu et al. | |

(56) References Cited

U.S. PATENT DOCUMENTS

| | | |
|---|---|---|
| 6,302,570 B1 | 10/2001 | Petell et al. |
| 6,306,538 B1 | 10/2001 | Saitoh et al. |
| 6,307,526 B1 | 10/2001 | Mann |
| 6,311,350 B1 | 11/2001 | Kaiserman et al. |
| 6,311,837 B1 | 11/2001 | Blaustein et al. |
| 6,320,822 B1 | 11/2001 | Okeya et al. |
| 6,325,521 B1 | 12/2001 | Gregg et al. |
| 6,328,454 B1 | 12/2001 | Davis |
| 6,340,234 B1 | 1/2002 | Brown, Jr. |
| 6,345,716 B1 | 2/2002 | Chapman |
| 6,347,410 B1 | 2/2002 | Lee |
| 6,363,537 B1 | 4/2002 | Park |
| 6,366,344 B1 | 4/2002 | Lach |
| 6,367,949 B1 | 4/2002 | Pederson |
| D457,670 S | 5/2002 | Allen |
| 6,382,407 B1 | 5/2002 | Chao |
| 6,386,701 B1 | 5/2002 | Khulusi |
| 6,390,640 B1 | 5/2002 | Wong et al. |
| 6,398,386 B1 | 6/2002 | Huang |
| 6,416,199 B1 | 7/2002 | Heine |
| 6,431,904 B1 | 8/2002 | Berelsman |
| 6,439,738 B1 | 8/2002 | Matthews et al. |
| 6,442,764 B1 | 9/2002 | Badillo et al. |
| 6,457,838 B1 | 10/2002 | Dugmore et al. |
| 6,461,015 B1 | 10/2002 | Welch |
| 6,461,025 B1 | 10/2002 | Payne |
| 6,474,830 B1 | 11/2002 | Hansen |
| 6,476,391 B1 | 11/2002 | Zhang |
| 6,497,493 B1 | 12/2002 | Theisen |
| D469,198 S | 1/2003 | Olson |
| 6,504,099 B2 | 1/2003 | Huang |
| 6,523,973 B2 | 2/2003 | Galli |
| 6,538,567 B2 | 3/2003 | Stewart |
| D473,890 S | 4/2003 | Waters |
| 6,549,231 B1 | 4/2003 | Matsui |
| 6,553,570 B1 | 4/2003 | Flynn |
| 6,554,444 B2 | 4/2003 | Shimada et al. |
| 6,578,982 B1 | 6/2003 | Lynch |
| D477,432 S | 7/2003 | Parsons |
| 6,598,991 B2 | 7/2003 | Altman |
| 6,604,837 B2 | 8/2003 | Sandberg |
| 6,612,695 B2 | 9/2003 | Waters |
| 6,612,696 B2 | 9/2003 | Waters |
| 6,616,293 B2 | 9/2003 | Mickey |
| 6,634,031 B1 * | 10/2003 | Schlapkohl ............ A42B 1/242 2/209.13 |
| 6,642,667 B2 | 11/2003 | Avis |
| D483,928 S | 12/2003 | Mansell et al. |
| 6,659,618 B2 | 12/2003 | Waters |
| D484,905 S | 1/2004 | Waters |
| 6,679,615 B2 | 1/2004 | Spearing |
| 6,704,044 B1 | 3/2004 | Foster et al. |
| 6,709,142 B2 | 3/2004 | Gyori |
| 6,713,956 B2 | 3/2004 | Hsing Chen et al. |
| 6,715,309 B1 | 4/2004 | Junkins |
| 6,719,437 B2 | 4/2004 | Lary et al. |
| 6,721,962 B1 | 4/2004 | Polaire |
| D489,165 S | 5/2004 | Waters |
| 6,733,150 B1 | 5/2004 | Hanley |
| 6,749,166 B2 | 6/2004 | Valentine et al. |
| 6,760,925 B1 | 7/2004 | Maxwell |
| 6,764,194 B1 | 7/2004 | Cooper |
| 6,802,636 B1 | 10/2004 | Bailey, Jr. |
| 6,808,284 B2 | 10/2004 | Chao |
| 6,811,441 B2 | 11/2004 | Simpson |
| 6,817,711 B2 | 11/2004 | Schubert |
| 6,830,357 B2 | 12/2004 | Lopez |
| D501,266 S | 1/2005 | Harris, Jr. et al. |
| 6,837,590 B2 | 1/2005 | Marston |
| 6,857,739 B1 | 2/2005 | Watson |
| 6,860,628 B2 | 3/2005 | Robertson et al. |
| 6,863,416 B2 | 3/2005 | Waters |
| 6,865,285 B1 | 3/2005 | Villa-Aleman |
| 6,880,989 B2 | 4/2005 | Sotome |
| 6,908,208 B1 | 6/2005 | Hyde et al. |
| D507,368 S | 7/2005 | Waters |
| D507,369 S | 7/2005 | Waters |
| 6,918,678 B2 | 7/2005 | McClanahan |
| 6,923,322 B2 | 8/2005 | Lenker |
| 6,929,375 B2 | 8/2005 | Satomi |
| 6,929,878 B2 | 8/2005 | Chen et al. |
| 6,932,216 B2 | 8/2005 | Blaustein et al. |
| 6,935,761 B2 | 8/2005 | Vanderschuit |
| 6,941,583 B2 | 9/2005 | Yan |
| 6,966,668 B2 | 11/2005 | Cugini et al. |
| 6,969,178 B2 | 11/2005 | Zuloff |
| 6,977,776 B2 | 12/2005 | Volkenandt et al. |
| 6,993,803 B2 | 2/2006 | Chan |
| 6,994,445 B1 | 2/2006 | Pomes |
| 6,997,552 B1 | 2/2006 | Hung |
| 7,000,841 B2 | 2/2006 | Becker |
| 7,003,353 B1 | 2/2006 | Parkhouse |
| 7,004,439 B1 | 2/2006 | Taylor et al. |
| 7,004,582 B2 | 2/2006 | Jannard et al. |
| 7,008,074 B1 | 3/2006 | Halm |
| 7,021,790 B2 | 4/2006 | Parsons |
| D520,460 S | 5/2006 | Wadsworth et al. |
| 7,052,154 B2 | 5/2006 | Vanderschuit |
| 7,055,179 B2 | 6/2006 | Warner et al. |
| 7,086,749 B1 | 8/2006 | Hanley |
| 7,094,981 B2 | 8/2006 | Sorrentino et al. |
| 7,104,670 B2 | 9/2006 | Waters |
| 7,105,939 B2 | 9/2006 | Bednyak |
| 7,111,956 B2 | 9/2006 | Brown |
| 7,114,823 B2 | 10/2006 | McCullough et al. |
| 7,118,241 B2 | 10/2006 | Sohn |
| 7,118,262 B2 | 10/2006 | Negley |
| 7,128,434 B1 | 10/2006 | Nally et al. |
| 7,147,324 B2 | 12/2006 | Jannard et al. |
| 7,147,338 B2 | 12/2006 | Gregg |
| 7,150,526 B2 | 12/2006 | Jannard et al. |
| 7,163,309 B2 | 1/2007 | Sohn |
| 7,182,478 B2 | 2/2007 | Marston |
| 7,186,159 B1 | 3/2007 | Baxter |
| 7,192,151 B2 | 3/2007 | Clupper et al. |
| 7,209,652 B2 | 4/2007 | Uenaka |
| 7,213,917 B2 | 5/2007 | Jannard et al. |
| 7,216,973 B2 | 5/2007 | Jannard et al. |
| 7,226,180 B2 | 6/2007 | Sung |
| 7,234,831 B1 | 6/2007 | Hanley |
| 7,255,437 B2 | 8/2007 | Howell et al. |
| 7,264,350 B2 | 9/2007 | Jannard et al. |
| D553,177 S | 10/2007 | Chen |
| 7,278,734 B2 | 10/2007 | Jannard et al. |
| 7,281,826 B2 | 10/2007 | Huang |
| 7,318,654 B2 | 1/2008 | McClanahan |
| 7,331,064 B1 | 2/2008 | Quintal |
| D566,044 S | 4/2008 | D'Arco et al. |
| D568,922 S | 5/2008 | Anderl |
| 7,369,174 B2 | 5/2008 | Olita et al. |
| 7,377,664 B2 | 5/2008 | Waters |
| 7,427,149 B2 | 9/2008 | Sohn |
| 7,431,472 B2 | 10/2008 | Becker |
| 7,438,409 B2 | 10/2008 | Jordan |
| 7,457,536 B2 | 11/2008 | Hamada et al. |
| 7,461,764 B2 | 12/2008 | Thompson |
| 7,466,040 B2 | 12/2008 | Bruwer |
| 7,470,022 B2 | 12/2008 | Lerner |
| 7,506,992 B2 | 3/2009 | Carter |
| D591,675 S | 5/2009 | Waters |
| 7,562,979 B2 | 7/2009 | Waters |
| 7,576,800 B2 | 8/2009 | Swain |
| D600,208 S | 9/2009 | Waters |
| D600,738 S | 9/2009 | Su et al. |
| 7,598,928 B1 | 10/2009 | Buskop |
| 7,607,775 B2 | 10/2009 | Hermanson et al. |
| 7,609,295 B2 | 10/2009 | Aridome et al. |
| 7,611,255 B1 | 11/2009 | Lagassey |
| 7,621,000 B1 | 11/2009 | Fulton |
| D605,381 S | 12/2009 | Mastrantonio et al. |
| 7,661,818 B2 | 2/2010 | Waters |
| D611,086 S | 3/2010 | Meng-Suen |
| 7,677,751 B2 | 3/2010 | Kinsman et al. |
| 7,699,486 B1 | 4/2010 | Beiner |

(56) References Cited

U.S. PATENT DOCUMENTS

| | | |
|---|---|---|
| D617,826 S | 6/2010 | Waters |
| 7,753,547 B2 | 7/2010 | Waters |
| 7,755,219 B2 | 7/2010 | Bruwer |
| 7,784,960 B2 | 8/2010 | Lahtinen |
| 7,862,979 B2 | 1/2011 | Morris et al. |
| 7,934,846 B1 | 5/2011 | Schwanz |
| 7,938,553 B1 | 5/2011 | Beiner |
| 7,942,543 B2 | 5/2011 | Ritter |
| 8,002,437 B2 | 8/2011 | Sohn |
| 8,075,153 B2 | 12/2011 | Werner |
| 8,141,395 B2 | 3/2012 | Dillavou |
| 8,157,403 B2 | 4/2012 | Lau |
| D659,351 S | 5/2012 | Benkendorfer |
| 8,333,485 B2 | 12/2012 | Waters |
| 8,364,220 B2 | 1/2013 | Sandmore |
| 8,388,164 B2 | 3/2013 | Waters |
| 8,491,145 B2 | 7/2013 | Waters |
| 8,550,651 B2 | 10/2013 | Waters |
| 8,698,027 B2 | 4/2014 | Anderst |
| 8,757,931 B2 | 6/2014 | Püttmann |
| 8,769,723 B1 | 7/2014 | Ilges et al. |
| 8,774,420 B2 | 7/2014 | Belafonte et al. |
| 8,813,268 B1 | 8/2014 | Fitzgerald et al. |
| 8,919,984 B1 | 12/2014 | Fitzgerald |
| 8,950,012 B2 | 2/2015 | Ilges et al. |
| D734,925 S | 7/2015 | Waters |
| 9,101,174 B2 | 8/2015 | Waters |
| 2001/0024365 A1 | 9/2001 | Aknine |
| 2002/0027777 A1 | 3/2002 | Takasu |
| 2002/0129989 A1 | 9/2002 | Parsons |
| 2002/0131275 A1 | 9/2002 | Yamamoto et al. |
| 2002/0159250 A1 | 10/2002 | Kuo et al. |
| 2002/0163800 A1 | 11/2002 | Hansen |
| 2002/0186557 A1 | 12/2002 | Lary et al. |
| 2002/0187806 A1 | 12/2002 | Jang |
| 2003/0079387 A1 | 5/2003 | Derose |
| 2003/0106918 A1 | 6/2003 | Hung |
| 2003/0122958 A1 | 7/2003 | Olita et al. |
| 2003/0151910 A1 | 8/2003 | Marston |
| 2003/0169207 A1 | 9/2003 | Beigel |
| 2003/0189824 A1 | 10/2003 | Meeder et al. |
| 2003/0231489 A1 | 12/2003 | Hsiao |
| 2004/0001150 A1 | 1/2004 | Schindler, II et al. |
| 2004/0008157 A1 | 1/2004 | Brubaker et al. |
| 2004/0085745 A1 | 5/2004 | Yoshihara |
| 2004/0128737 A1 | 7/2004 | Gesten |
| 2004/0141312 A1 | 7/2004 | Henning et al. |
| 2004/0141316 A1 | 7/2004 | Twardawski |
| 2004/0165109 A1 | 8/2004 | Lee |
| 2004/0222638 A1 | 11/2004 | Bednyak |
| 2004/0240067 A1 | 12/2004 | Marusi et al. |
| 2004/0240204 A1 | 12/2004 | Russ et al. |
| 2004/0264176 A1 | 12/2004 | Vanderschuit |
| 2005/0001433 A1 | 1/2005 | Seelin |
| 2005/0035925 A1 | 2/2005 | Ostromek et al. |
| 2005/0047116 A1 | 3/2005 | Gagne |
| 2005/0066422 A1 | 3/2005 | Yan |
| 2005/0072458 A1 | 4/2005 | Goldstein |
| 2005/0078473 A1 | 4/2005 | Zuloff |
| 2005/0083676 A1 | 4/2005 | VanderSchuit |
| 2005/0099799 A1 | 5/2005 | Cugini et al. |
| 2005/0105285 A1 | 5/2005 | Maden |
| 2005/0161313 A1 | 7/2005 | Sorrentino et al. |
| 2005/0174753 A1 | 8/2005 | Cao et al. |
| 2005/0204490 A1 | 9/2005 | Kemp et al. |
| 2005/0211187 A1 | 9/2005 | Harman et al. |
| 2005/0211574 A1 | 9/2005 | Reeve |
| 2005/0213340 A1 | 9/2005 | Suzuki et al. |
| 2005/0219837 A1 | 10/2005 | Brown |
| 2005/0237479 A1 | 10/2005 | Rose |
| 2005/0248932 A1 | 11/2005 | Waters |
| 2005/0254238 A1 | 11/2005 | Parker et al. |
| 2005/0265015 A1 | 12/2005 | Salazar |
| 2006/0012974 A1 | 1/2006 | Su |
| 2006/0012975 A1 | 1/2006 | Huttner et al. |
| 2006/0037125 A1 | 2/2006 | McDowell |
| 2006/0091784 A1 | 5/2006 | Conner et al. |
| 2006/0092621 A1 | 5/2006 | Lai |
| 2006/0107952 A1 | 5/2006 | Schlosser |
| 2006/0125624 A1 | 6/2006 | Ostrovsky et al. |
| 2006/0126323 A1 | 6/2006 | Pomes |
| 2006/0138440 A1 | 6/2006 | Jyo |
| 2006/0141828 A1 | 6/2006 | Dean et al. |
| 2006/0157569 A1 | 7/2006 | Becker |
| 2006/0158895 A1 | 7/2006 | Brands et al. |
| 2006/0165160 A1 | 7/2006 | Winningstad et al. |
| 2006/0198122 A1 | 9/2006 | Senter et al. |
| 2006/0212994 A1 | 9/2006 | Proctor |
| 2006/0215393 A1 | 9/2006 | VanderSchuit |
| 2006/0232955 A1 | 10/2006 | Labine |
| 2006/0238995 A1 | 10/2006 | Wang |
| 2006/0239018 A1 | 10/2006 | Jardin |
| 2006/0263677 A1 | 11/2006 | Tsai |
| 2006/0285315 A1 | 12/2006 | Tufenkjian |
| 2006/0286443 A1 | 12/2006 | Huang |
| 2006/0291193 A1 | 12/2006 | Hill |
| 2007/0003826 A1 | 1/2007 | Hsu |
| 2007/0030442 A1 | 2/2007 | Howell et al. |
| 2007/0048598 A1 | 3/2007 | Huang |
| 2007/0053179 A1 | 3/2007 | Pang et al. |
| 2007/0058361 A1 | 3/2007 | Sevilla |
| 2007/0064413 A1 | 3/2007 | Slater |
| 2007/0072655 A1 | 3/2007 | Cascone |
| 2007/0074752 A1 | 4/2007 | Shau et al. |
| 2007/0086182 A1* | 4/2007 | Kelly .................. A01K 27/006 362/108 |
| 2007/0097668 A1 | 5/2007 | Choi |
| 2007/0140675 A1 | 6/2007 | Yanagi |
| 2007/0145746 A1 | 6/2007 | Biamonte |
| 2007/0153537 A1 | 7/2007 | Scott et al. |
| 2007/0159810 A1 | 7/2007 | Kim |
| 2007/0159823 A1 | 7/2007 | Ho et al. |
| 2007/0171628 A1 | 7/2007 | Seade |
| 2007/0189003 A1 | 8/2007 | Daley |
| 2007/0206373 A1 | 9/2007 | Whiteside et al. |
| 2007/0236915 A1 | 10/2007 | Chen |
| 2007/0236916 A1 | 10/2007 | Hsu |
| 2008/0049963 A1 | 2/2008 | Mann et al. |
| 2008/0069391 A1 | 3/2008 | Steyn et al. |
| 2008/0130272 A1 | 6/2008 | Waters |
| 2008/0152482 A1 | 6/2008 | Patel |
| 2008/0186705 A1 | 8/2008 | Liu |
| 2008/0263750 A1 | 10/2008 | Chen et al. |
| 2008/0266839 A1 | 10/2008 | Claypool et al. |
| 2009/0010474 A1 | 1/2009 | Ouryouji |
| 2009/0126076 A1 | 5/2009 | Ochoa |
| 2009/0147503 A1 | 6/2009 | Bennett |
| 2009/0148149 A1 | 6/2009 | Chishima |
| 2009/0193566 A1 | 8/2009 | Waters |
| 2009/0268936 A1 | 10/2009 | Goldberg et al. |
| 2009/0323317 A1* | 12/2009 | Spartano ............... F21V 14/065 362/105 |
| 2010/0024091 A1 | 2/2010 | Mehtab et al. |
| 2010/0095431 A1 | 4/2010 | Liao |
| 2010/0134761 A1 | 6/2010 | Johns et al. |
| 2010/0182563 A1 | 7/2010 | Waters |
| 2010/0214767 A1 | 8/2010 | Waters |
| 2010/0242155 A1 | 9/2010 | Carullo |
| 2010/0307931 A1 | 12/2010 | Waters |
| 2010/0313335 A1 | 12/2010 | Waters |
| 2011/0013135 A1 | 1/2011 | Waters |
| 2011/0075095 A1 | 3/2011 | Waters |
| 2011/0122601 A1 | 5/2011 | Waters |
| 2011/0187989 A1 | 8/2011 | Waters |
| 2011/0210685 A1 | 9/2011 | Liao |
| 2011/0211156 A1 | 9/2011 | Beiner |
| 2011/0228211 A1 | 9/2011 | Waters |
| 2012/0014095 A2 | 1/2012 | Waters |
| 2013/0025612 A1 | 1/2013 | Hunter |
| 2013/0111651 A1 | 5/2013 | Waters |
| 2013/0192961 A1 | 8/2013 | Waters |
| 2013/0198935 A1 | 8/2013 | Waters |
| 2014/0049947 A1 | 2/2014 | Lombard et al. |
| 2014/0101827 A1 | 4/2014 | Dennis |

(56) References Cited

U.S. PATENT DOCUMENTS

| | | | |
|---|---|---|---|
| 2014/0173807 A1 | 6/2014 | Waters | |
| 2014/0237706 A1 | 8/2014 | O'Conner | |
| 2014/0268683 A1 | 9/2014 | Waters | |
| 2014/0270685 A1 | 9/2014 | Letke | |
| 2015/0358515 A1 | 12/2015 | Resnick | |

FOREIGN PATENT DOCUMENTS

| | | |
|---|---|---|
| AU | 199940150 | 2/2000 |
| AU | 199959545 | 3/2000 |
| AU | 2002100976 | 6/2003 |
| AU | 2003100277 | 7/2003 |
| AU | 2003248016 | 11/2004 |
| CA | 2029772 | 5/1991 |
| CA | 2198625 | 2/1997 |
| CA | 2184336 | 5/1997 |
| CA | 2406450 | 11/2001 |
| CA | 2466175 | 5/2003 |
| CA | 2608746 A1 | 11/2006 |
| CA | 2610073 A1 | 5/2008 |
| CN | 86208973 | 10/1987 |
| CN | 2173427 | 8/1994 |
| CN | 2239167 | 11/1996 |
| CN | 2423761 | 3/2001 |
| CN | 2433836 | 6/2001 |
| CN | 2458892 | 11/2001 |
| CN | 2508592 | 9/2002 |
| CN | 2544551 | 4/2003 |
| CN | 1462597 | 12/2003 |
| CN | 1603677 | 4/2005 |
| CN | 101950091 A | 1/2011 |
| CN | 301445845 S | 1/2011 |
| DE | 3043007 | 6/1982 |
| DE | 8230583 | 9/1983 |
| DE | 9410886 | 9/1994 |
| DE | 29808222 | 11/1998 |
| DE | 19837151 | 4/2000 |
| DE | 20007738 | 9/2000 |
| DE | 29915607 | 9/2000 |
| DE | 20017922 | 2/2001 |
| DE | 20020515 | 8/2001 |
| DE | 20101380 | 8/2001 |
| DE | 20106261 | 9/2001 |
| DE | 20111815 | 11/2001 |
| DE | 10046295 | 3/2002 |
| DE | 20117740 | 4/2002 |
| DE | 20201557 | 5/2002 |
| DE | 20200058 | 6/2002 |
| DE | 10103591 | 8/2002 |
| DE | 20110124 | 8/2002 |
| DE | 10057388 | 9/2002 |
| DE | 20209115 | 10/2002 |
| DE | 20210806 | 10/2002 |
| DE | 10216152 | 12/2002 |
| DE | 20209611 | 1/2003 |
| DE | 20313629 | 12/2003 |
| DE | 10330589 | 1/2004 |
| DE | 20319297 | 2/2004 |
| DE | 20318860 | 4/2004 |
| DE | 20318949 | 4/2004 |
| DE | 202004004960 | 9/2005 |
| DE | 10 2007 006 860 A1 | 8/2007 |
| EP | 1072204 | 1/2001 |
| EP | 1374707 | 1/2004 |
| EP | 2290433 A1 | 3/2011 |
| EP | 2299311 A1 | 3/2011 |
| FR | 1221782 | 6/1960 |
| FR | 2798721 | 3/2001 |
| FR | 2824709 | 11/2002 |
| FR | 2829365 | 3/2003 |
| FR | 2833068 | 6/2003 |
| FR | 2833069 | 6/2003 |
| GB | 2268043 | 1/1994 |
| GB | 2272073 A | 5/1994 |
| GB | 2316293 | 2/1998 |
| GB | 2358575 | 8/2001 |
| GB | 2363314 | 12/2001 |
| GB | 2374401 | 10/2002 |
| GB | 2378117 | 2/2003 |
| GB | 2378118 | 2/2003 |
| GB | 2388298 | 11/2003 |
| JP | S61-006304 | 1/1986 |
| JP | 4289602 | 10/1992 |
| JP | H08-027610 A | 1/1996 |
| JP | H08-298004 A | 11/1996 |
| JP | H09-209210 A | 8/1997 |
| JP | H09-296319 A | 11/1997 |
| JP | H10-081275 A | 3/1998 |
| JP | H10-331019 A | 12/1998 |
| JP | 2001-131818 A | 5/2001 |
| JP | 3084061 | 11/2001 |
| JP | 3090973 | 10/2002 |
| JP | 2004-207580 | 7/2004 |
| JP | 2004346470 | 12/2004 |
| JP | 2005-216832 A | 8/2005 |
| JP | 2006-097156 A | 4/2006 |
| JP | 2007119980 | 5/2007 |
| JP | 2008542558 | 11/2008 |
| KR | 20-0164075 | 2/2000 |
| KR | 20-0168822 Y1 | 2/2000 |
| KR | 200168826 | 2/2000 |
| KR | 200260980 | 1/2002 |
| KR | 20020065405 | 8/2002 |
| KR | 200331201 | 10/2003 |
| TW | 241462 | 2/1995 |
| TW | 275188 | 5/1996 |
| TW | 286489 | 9/1996 |
| TW | 324234 | 1/1998 |
| TW | 329607 | 4/1998 |
| TW | 386364 | 4/2000 |
| WO | 94/02043 | 2/1994 |
| WO | 97/04434 | 2/1997 |
| WO | 0113033 A1 | 2/2001 |
| WO | 0177575 A1 | 10/2001 |
| WO | 02/44611 | 6/2002 |
| WO | 02/062165 | 8/2002 |
| WO | 02/074398 | 9/2002 |
| WO | 02/077520 | 10/2002 |
| WO | 03/040808 | 5/2003 |
| WO | 03/047377 | 6/2003 |
| WO | 03/083811 | 10/2003 |
| WO | 2004/000054 | 12/2003 |
| WO | 2004/064555 | 5/2004 |
| WO | 2004/103104 | 12/2004 |
| WO | 2005/002378 | 1/2005 |
| WO | 2005/005882 | 1/2005 |
| WO | 2005/038337 | 4/2005 |
| WO | 2005/096856 | 10/2005 |
| WO | 2005/098314 | 10/2005 |
| WO | 2006/037845 | 4/2006 |
| WO | 2006/124928 | 11/2006 |
| WO | 2007/073047 | 6/2007 |
| WO | 2007/073219 | 6/2007 |
| WO | 2007/089236 | 8/2007 |
| WO | 2007/093348 | 8/2007 |
| WO | 2007/112338 | 10/2007 |
| WO | 2008/011750 | 1/2008 |
| WO | 2009/079656 | 6/2009 |
| WO | 2010/099504 | 9/2010 |
| WO | 2011041591 A1 | 4/2011 |
| WO | 2011100471 A1 | 8/2011 |
| WO | 2011/137400 | 11/2011 |
| WO | 2011/137406 | 11/2011 |
| WO | 2013/096895 | 6/2013 |
| WO | 2013/096904 | 6/2013 |
| ZA | 20043826 A | 9/2005 |

OTHER PUBLICATIONS

"Complaint", *Waters Industries, Inc.* v. *Totes Isotoner Corporation, et al.*, United States District Court for the Northern District of Illinois, Case No. 1:10-cv-04487 (26 pages).

(56) References Cited

OTHER PUBLICATIONS

Docket report of *Waters Industries, Inc.* v. *Outdoor Cap Co., Inc.*, United States District Court for the Northern District of Oklahoma, Case No. 4:13-cv-00665-CVE-FHM, filed Oct. 8, 2013 (7 pages).
"Plaintiff's Complaint" with Exhibit A, *Waters Industries, Inc.* v. *Outdoor Cap Co., Inc.*, United States District Court for the Northern District of Illinois, Case No. 1:13-cv-07191, 7 pages (Document No. 1, Oct. 8, 2013).
"Declaratory Judgment Complaint" with Exhibit A and Exhibit B, *Waters Industries, Inc.* v. *Outdoor Cap Co., Inc.*, United States District Court for the Northern District of Illinois, Case No. 4:13-cv-00665-CVE-FHM, 52 pages (Document No. 2, Oct. 8, 2013).
"Plaintiff's First Amended Complaint" with Exhibit A and Exhibit B, *Waters Industries, Inc.* v. *Outdoor Cap Co., Inc.*, United States District Court for the Northern District of Illinois, Case No. 4:13-cv-00665-CVE-FHM, 51 pages (Document No. 11, Oct. 10, 2013).
"Answer and Counterclaim of Defendant Outdoor Cap Co., Inc.," *Waters Industries, Inc.* v. *Outdoor Cap Co., Inc.*, United States District Court for the Northern District of Illinois, Case No. 1:13-cv-07191, 11 pages (Document No. 13, Oct. 30, 2013).
"Waters Industries' Answer to Defendant's Counterclaims," *Waters Industries, Inc.* v. *Outdoor Cap Co., Inc.*, United States District Court for the Northern District of Illinois, Case No. 1:13-cv-07191, 5 pages (Document No. 28, Nov. 20, 2013).
"Plaintiffs Initial Infringement Contentions Under Local Patent Rule 2.2" with Appendix A, Figures 1-5, and Exhibits 1-3, *Waters Industries, Inc.* v. *Outdoor Cap Co., Inc.*, United States District Court for the Northern District of Illinois, Case No. 1:13-cv-07191, 58 pages (Nov. 27, 2013).
"First Amended Answer and Counterclaim of Defendant Outdoor Cap Co., Inc." with Exhibit A through G, *Waters Industries, Inc.* v. *Outdoor Cap Co., Inc.*, United States District Court for the Northern District of Illinois, Case No. 1:13-cv-07191, 201 pages (Document No. 34, Dec. 11, 2013).
"Initial Non-Infringement, Invalidity and Unenforceability, Contentions" with Exhibit A, Exhibits B-1 and B-2, and Exhibits C-1 through C7, *Waters Industries, Inc.* v. *Outdoor Cap Co., Inc.*, United States District Court for the Northern District of Illinois, Case No. 1:13-cv-07191, 263 pages (Dec. 18, 2013).
"Waters Industries' Answer to Defendant's Amended Counterclaims", *Waters Industries, Inc.* v. *Outdoor Cap Co., Inc.*, United States District Court for the Northern District of Illinois, Case No. 1:13-cv-07191, 12 pages (Document No. 38, Dec. 18, 2013).

\* cited by examiner

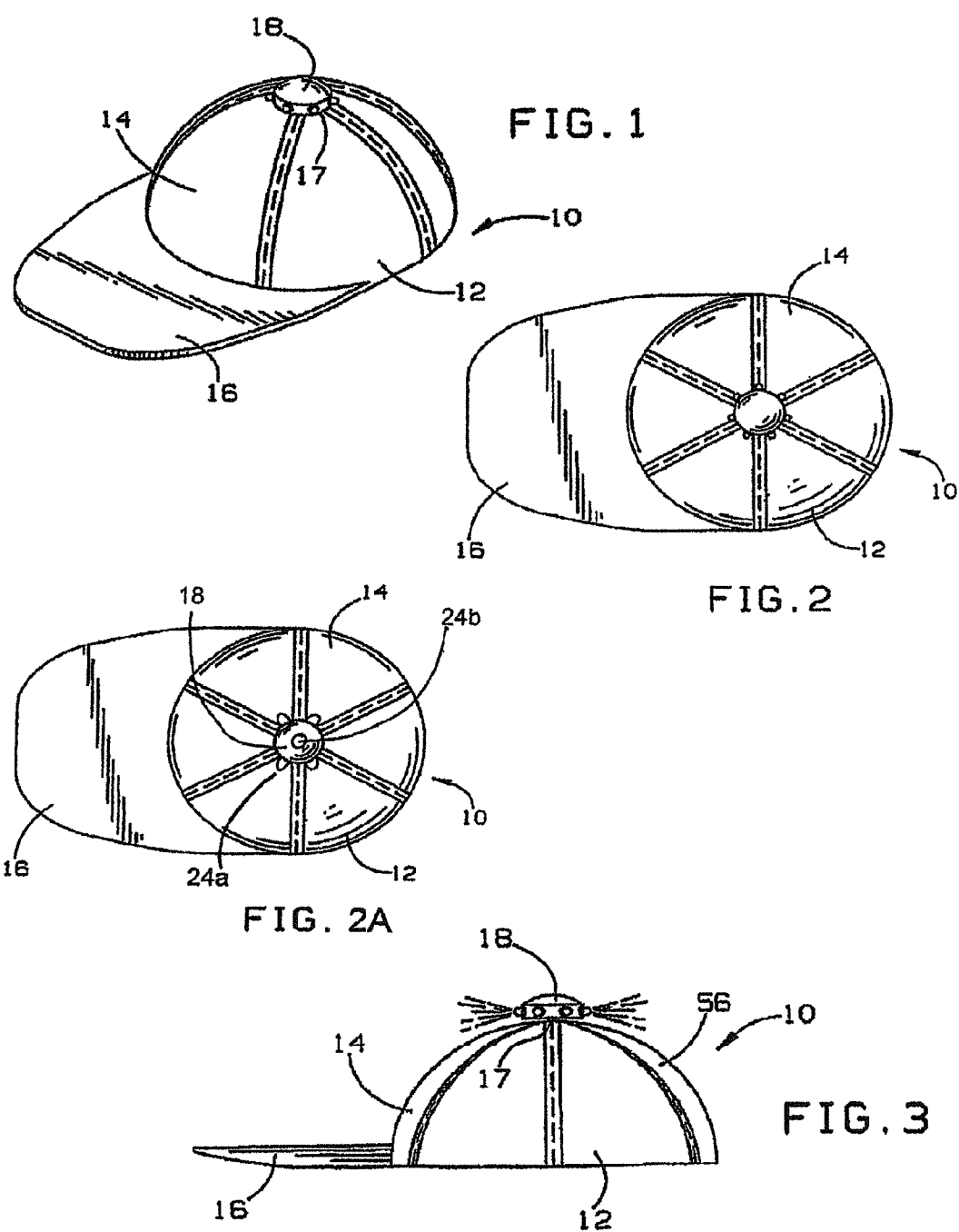

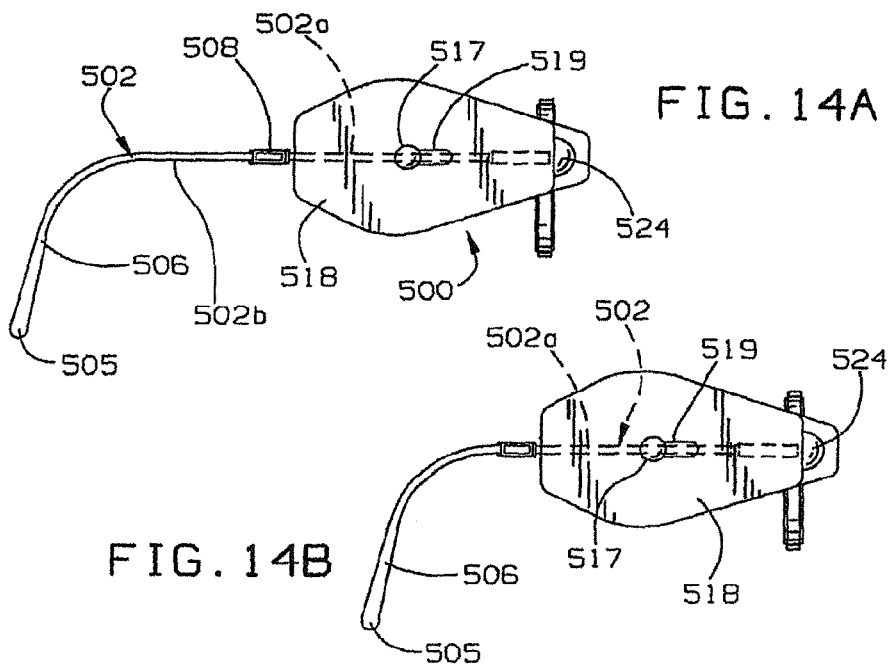
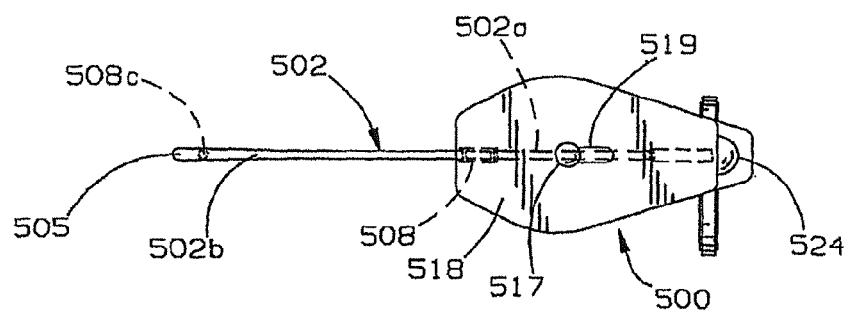
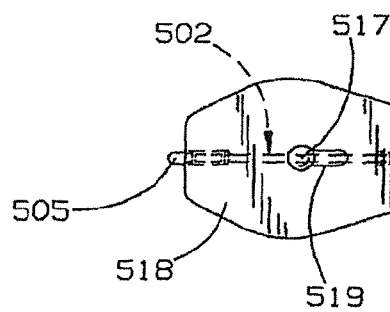
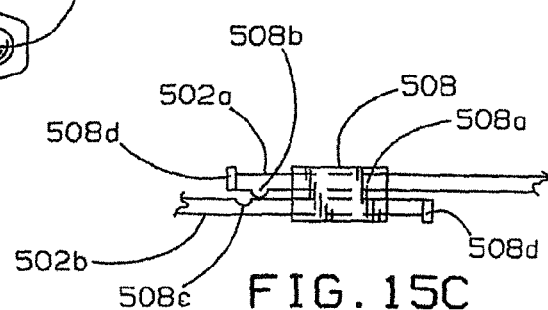

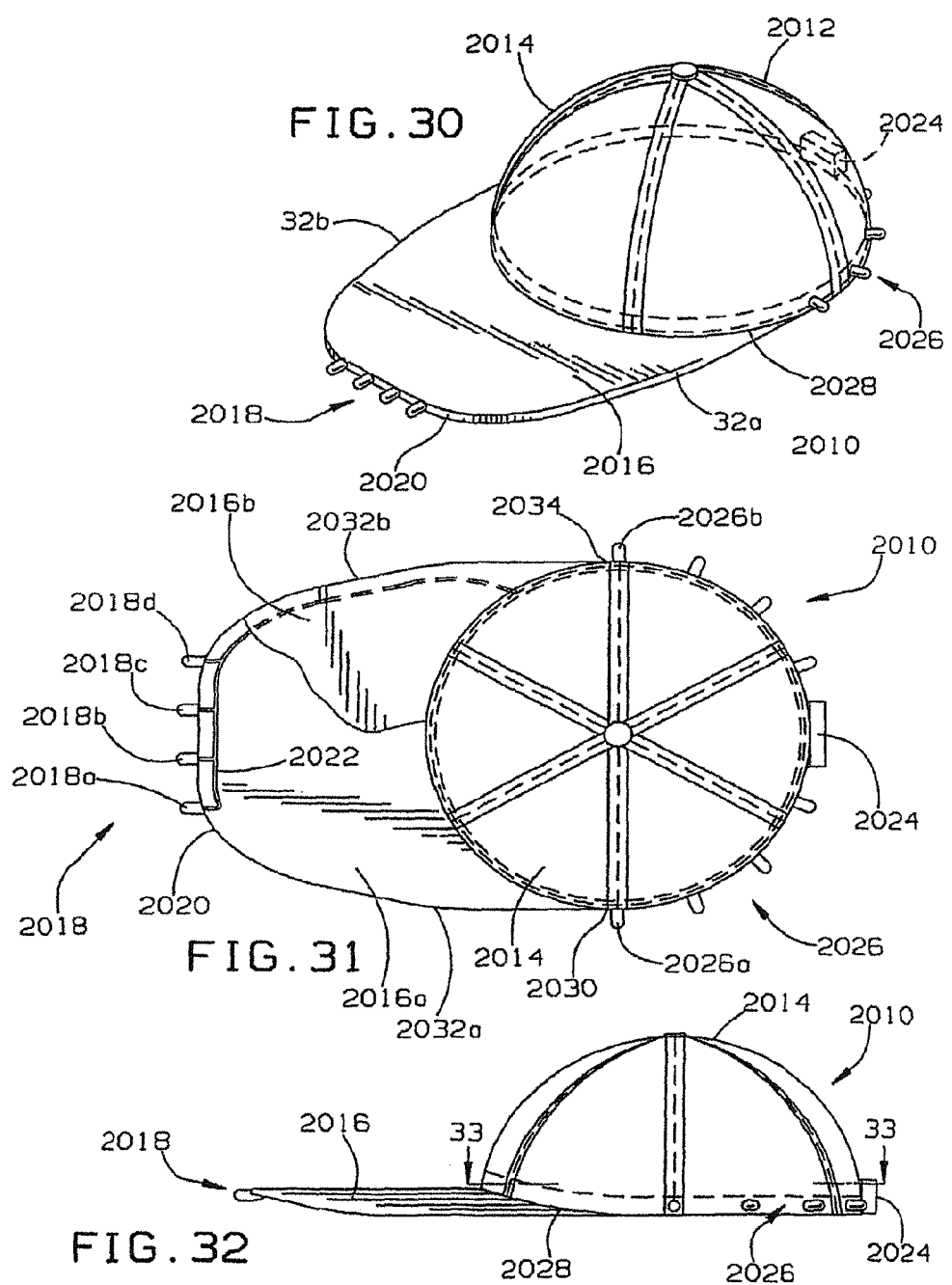

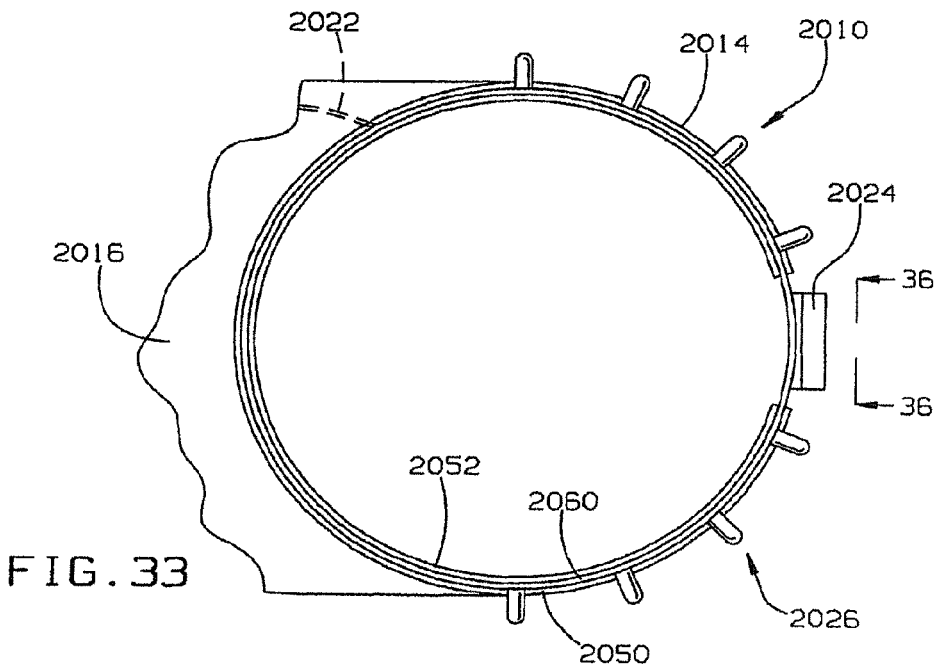
FIG. 33
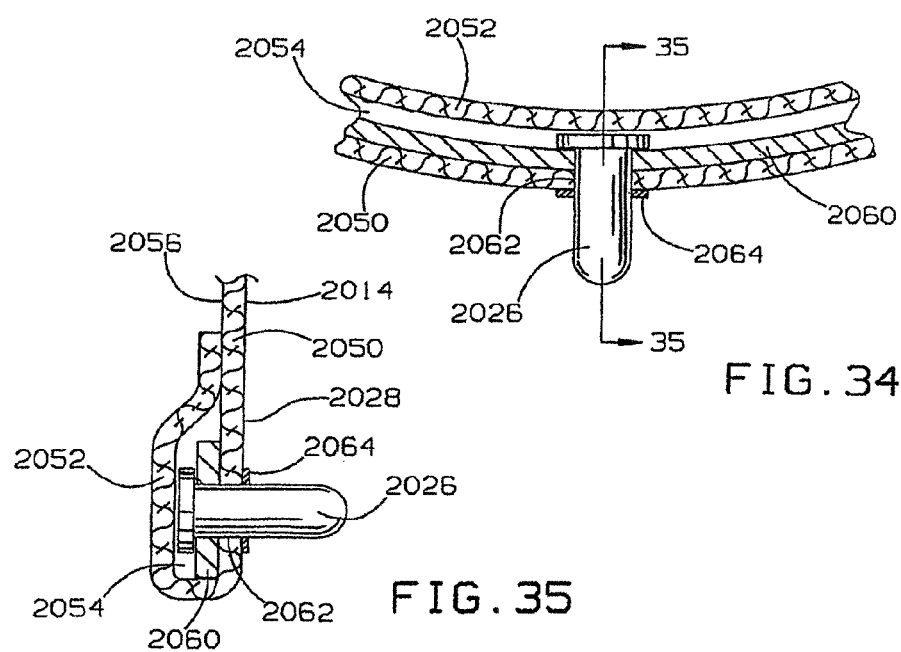
FIG. 34
FIG. 35

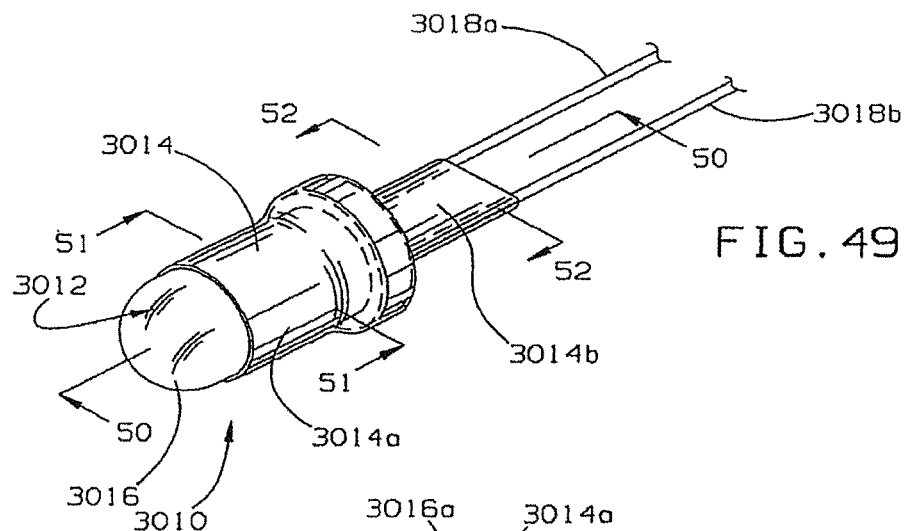
FIG. 49
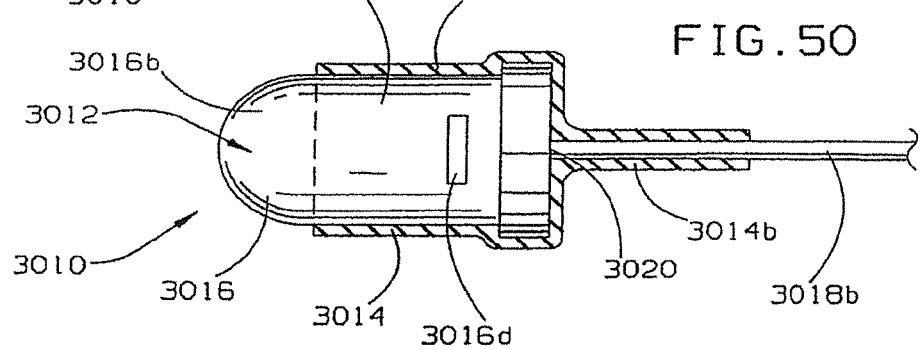
FIG. 50
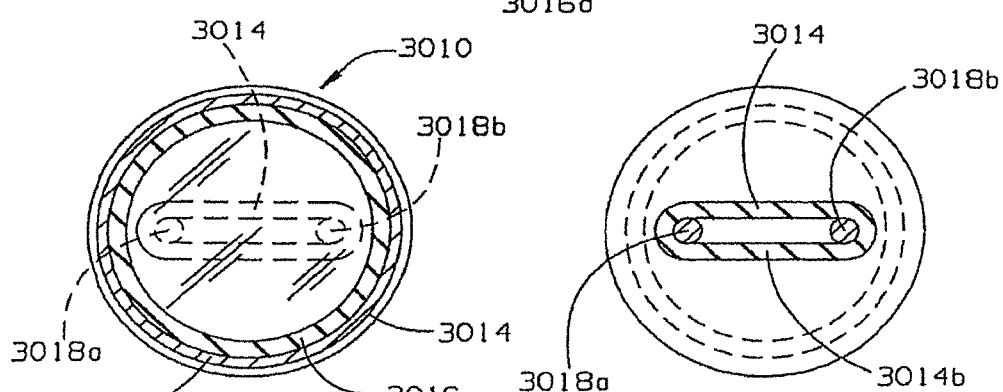
FIG. 51
FIG. 52

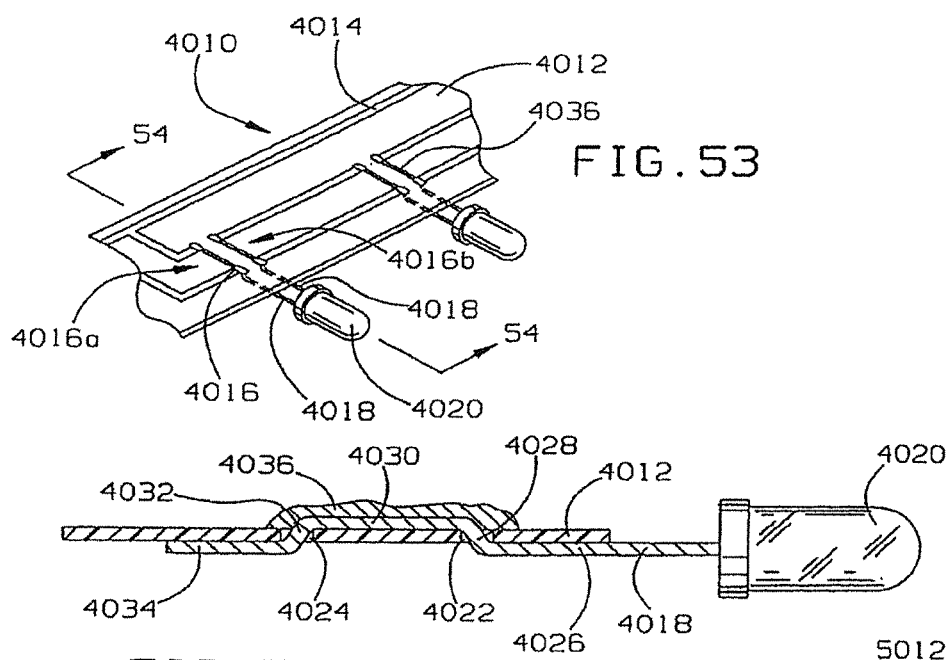
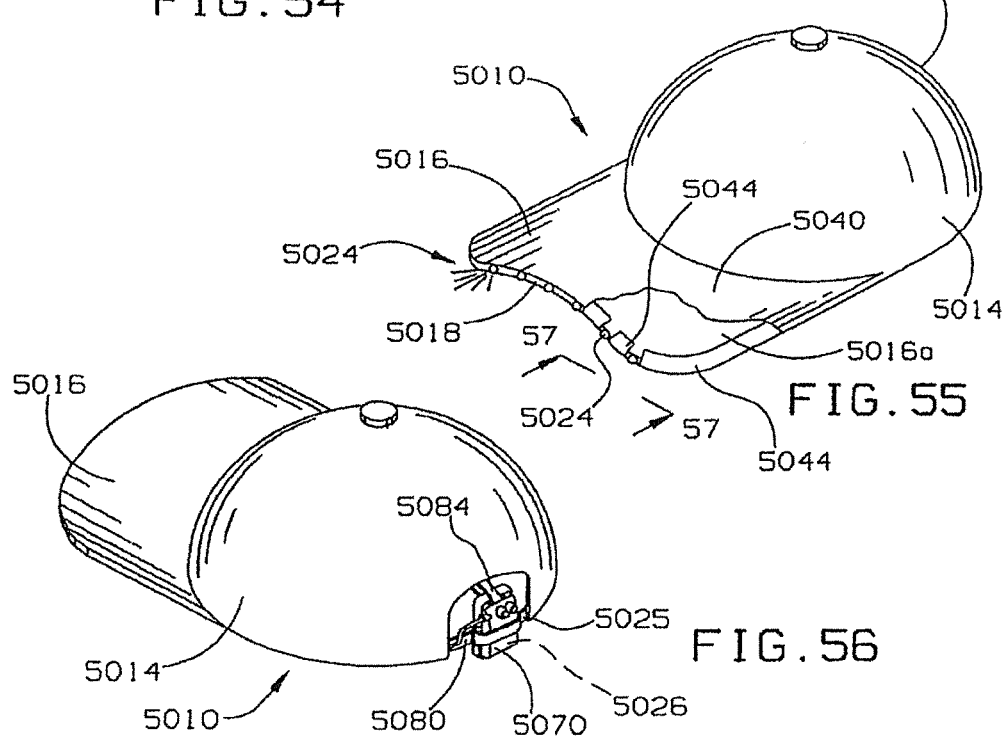

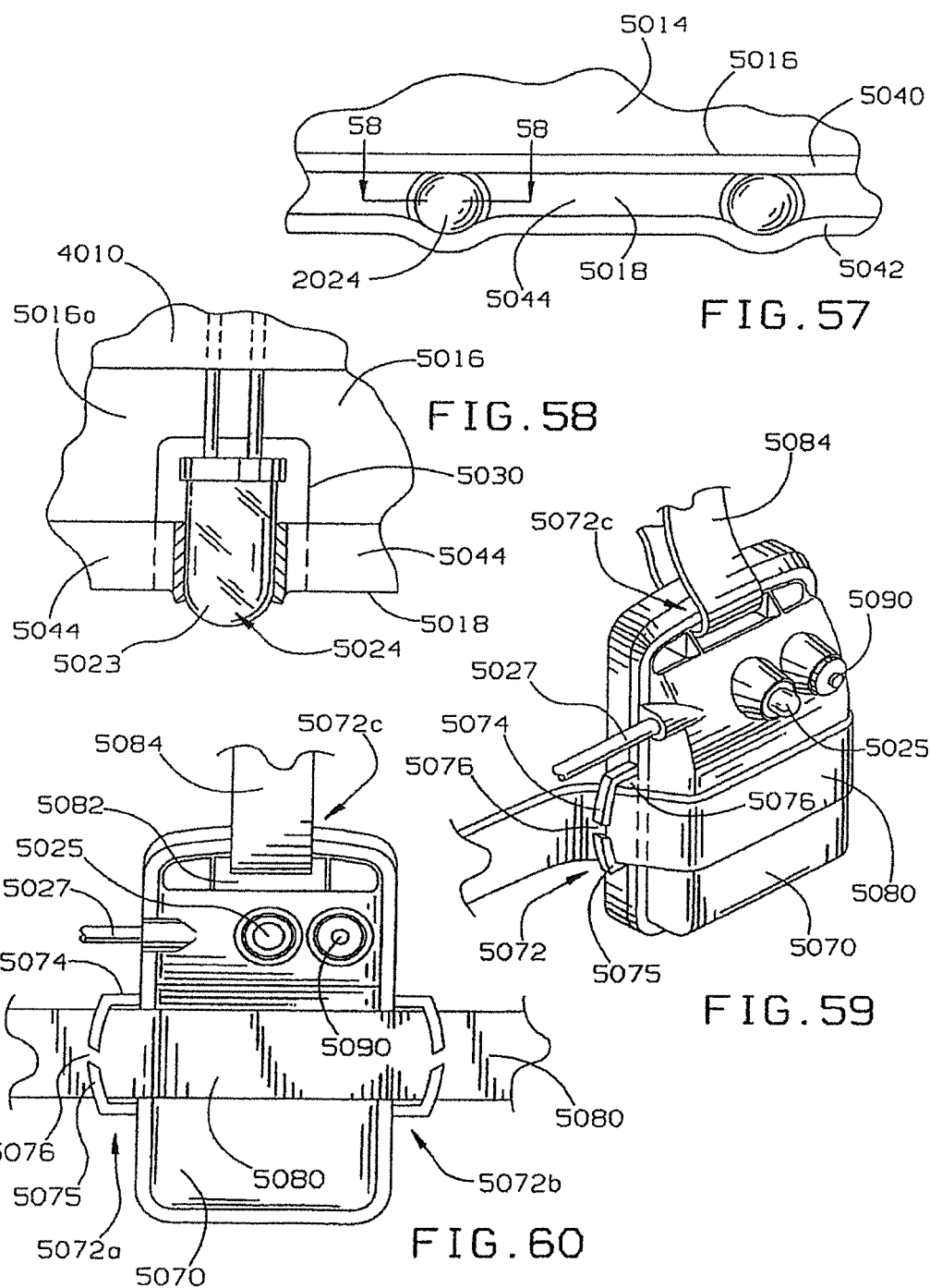

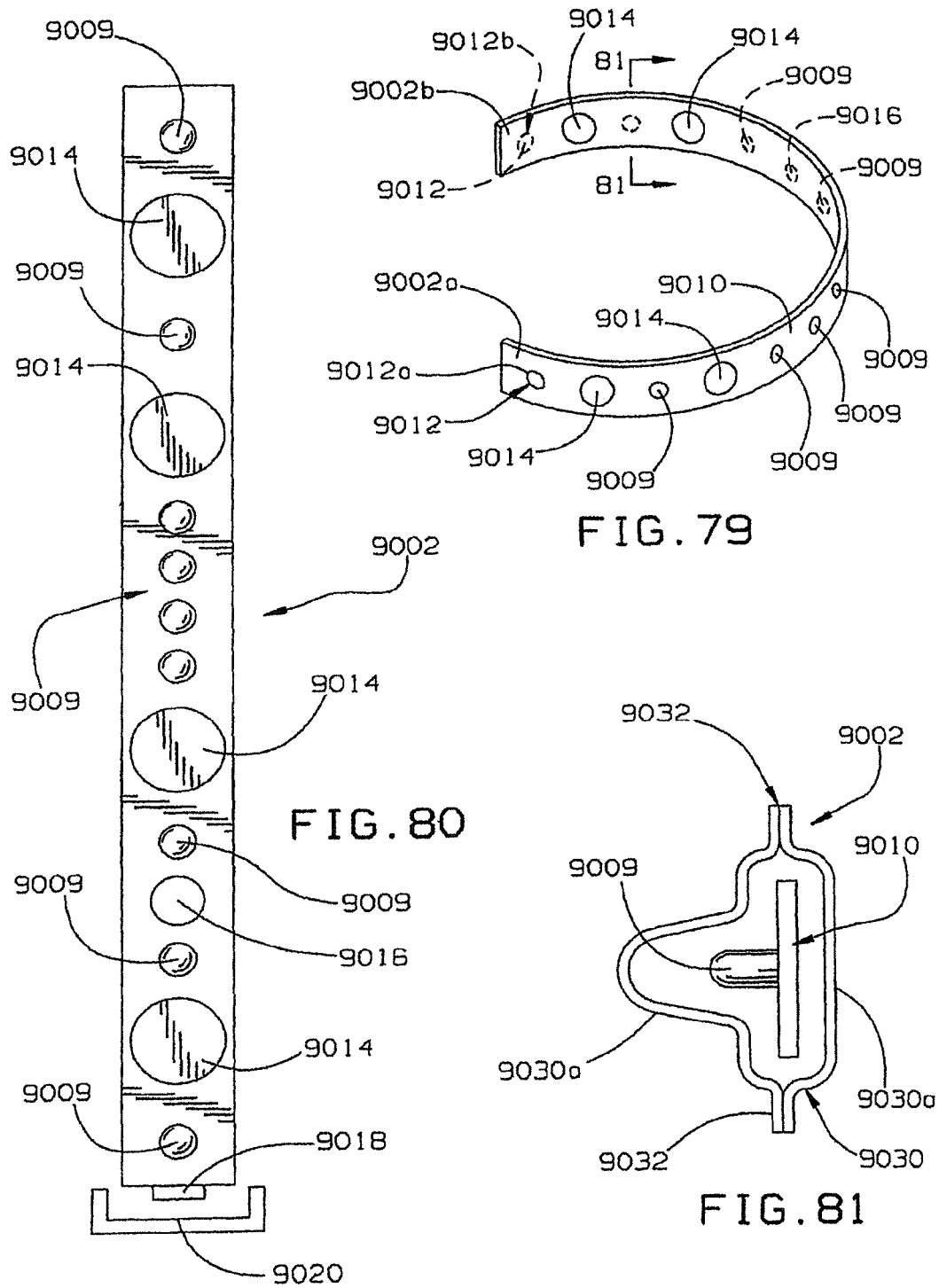

POWER MODULES AND HEADGEAR

CROSS-REFERENCE TO RELATED APPLICATIONS

This application claims the benefit of U.S. Provisional Application No. 61/580,165, filed Dec. 23, 2011 and is a continuation-in-part of U.S. application Ser. No. 11/941,558, filed Nov. 16, 2007, which is a continuation-in-part of International Application Number PCT/US2006/018968, filed May 17, 2006, which claims the benefit of U.S. Provisional Application No. 60/681,852, filed May 17, 2005, and U.S. Provisional Application No. 60/746,217, filed May 2, 2006, all of which are hereby incorporated herein by reference in their entirety.

FIELD OF THE INVENTION

This application relates to power modules and, in particular, to power modules configured to be mounted to headgear.

BACKGROUND OF THE INVENTION

Often an individual desires a light source focused to illuminate an area while performing a task or a light source directed in a general outward direction for visibility. Holding a flashlight is an option, but such lighting devices are often cumbersome and may detract from the task being completed because the flashlight must be held. As a result, hands-free lighting is often used because the individual desiring illumination does not need to hold the light source. Common types of hand-free lighting include light sources mounted to headgear or eyeglasses.

Lighted headgear may include illumination sources mounted to hats. Often the light source is oriented outwardly in such a manner so that the wearer can be seen by others or oriented downward to provide light forwardly of the wearer so as to illuminate an area in the wearer's field of view. Applicant's U.S. Pat. No. 6,659,618 and U.S. Pat. No. 6,733,150 to Hanley provide examples of such lighted hats. Often, the light source is one or more LEDs. Such LED lighted headgear, which may include LEDs mounted to a typical baseball-style cap, are convenient for hands-free lighting in a number of recreational activities, such as camping, hunting, fishing, jogging, or the like. Lighted headgear often include separate components such as one housing to hold the battery and other electrical components and a separate housing or assembly to contain the illumination source. Such separate housings may detract from the traditional style of the hat or create a profile that is different than traditional hats. In addition, lighted headgear also requires the use of batteries to illuminate the light source; however, such traditional batteries eventually need to be replaced.

Light sources on eyeglasses, on the other hand, usually include mounting arrangements of the light source, which may also be an LED, on either the cross-frame or temple of the eyeglass so as to provide illumination forwardly of the wearer. In such configuration, lighted eyeglasses are typically used to provide directed or focused light so that an area immediately forward of the wearer, e.g., 12-24 inches from their eyes, can be illuminated such as for reading typical sized print rather than used to direct light further beyond this reading distance, such as for safety purposes.

Eyeglass frames, however, are often fragile, bulky, and elongated. Such configuration results in a structure that is difficult to carry and easily broken. Such is the case with lighted eyeglasses because such frames are usually carried in a pocket until the hands-free lighting is needed. While the temples of the eyeglass frames usually pivot inwardly toward the cross-frame members and/or lenses so that the frame may be folded up in a more compact size, the folded frame is still elongated and fragile and often broken if kept in pockets of clothes that are being worn.

SUMMARY OF THE INVENTION

There is provided a power module for mounting to headgear to provide power to electrical devices mounted to the headgear or external thereto. The power module can include a housing portion configured to receive a power source therein, such as cylindrical batteries, rechargeable batteries, coin cell batteries, or the like. The housing portion further includes a pair of handle portions disposed on opposite sides thereof that create openings between the handle portions and the corresponding surface of the opposite sides of the housing portion. The openings are configured to receive a strap of the headgear therethrough to mount the housing portion to the headgear.

In a further aspect, the power module assembly can also include a cover portion configured to mount to the housing portion. In order to mount the cover portion to the housing portion in a snap fit configuration therebetween, the cover portion can include an inwardly extending lip and the housing portion can include an outwardly facing channel sized to receive the lip of the cover portion therein. Moreover, the housing portion can be generally rigid and the cover portion generally flexible and resilient, so that the cover can deflect over the housing portion to fit the lip thereof within the channel.

In another form, the power module includes a housing assembly that includes a housing member and a cover member. A power source compartment of the housing member is sized to receive a power source therein. The cover member includes a main outer surface that has a generally curved configuration, so that when the housing assembly is mounted to headgear, the curved configuration of the main outer surface of the cover can rest against a user's head.

In a different aspect, headgear is provided that includes a head fitting portion configured for being received on a user's head. A power module is configured to mount to the head fitting portion so that there are three points of securement therebetween. By one approach, the power module includes two opposing sidewall portions and an end wall portion extending therebetween. The power module includes sidewall handles that extend from outer surfaces of the sidewall portions thereof. To mount the power module to the head fitting portion, a laterally extending strap of the head fitting portion is received through openings between the sidewall handles and the corresponding outer surface of the sidewall portions of the power module to provide two points of securement. The power module can further include an end wall handle that extends from an outer surface of the end wall portion thereof. As such, a longitudinally extending strap of the head fitting portion is received through an opening between the end wall handle and the outer surface of the end wall portion of the power module to provide a third point of securement. In one approach, the laterally extending strap is an adjustment strap that allows the head fitting portion to be received on heads having different circumferences and can be undone. As such, even if the laterally extending strap is removed from the power module, the longitudinally extending strap would still secure the power module to the head fitting portion.

BRIEF DESCRIPTION OF THE DRAWINGS

FIGS. 1-3 are views of a lighted hat in accordance with the present invention showing an LED module including a plurality of LED lights for being positioned around the top of the crown of the hat;

FIG. 14A is a side elevational view of lighted eyeglass frames in accordance with the present invention showing one of the temple arms in an extended position and a light module attached to the arm;

FIG. 14B is a side elevational view of the lighted eyeglass frames of FIG. 14A showing the arm in a retracted position;

FIG. 15A is a side elevational view of alternative, lighted eyeglass frames in accordance with the present invention showing one of the temple arms in an extended position and a light module attached to the arm;

FIG. 15B is a side elevational view of the lighted eyeglass frames of FIG. 15A showing the arm in a retracted position;

FIG. 15C is an enlarged, fragmentary view of the temple arms of FIGS. 14A, 14B, 15A, and 15B showing a releasable locking structure between forward and rearward segments of the arm;

FIG. 30 is a perspective view of an exemplary lighted hat embodying features of the present invention showing LEDs in a hat brim and LEDs in a hat crown;

FIG. 31 is a plan view of the hat of FIG. 30 showing electrical connections to the brim mounted LEDs;

FIG. 32 is an elevational view of the hat of FIG. 30;

FIG. 33 is a cross-sectional view of the hat of FIG. 32 generally taken along the line 33-33 and showing LEDs protruding through the hat crown with a flexible circuit board supporting the LEDs;

FIG. 34 is a partial, cross-sectional view of one of the LEDs from the hat of FIG. 33 showing a crown outer surface, an LED protruding through the crown outer surface, a flexible circuit board, and an inner hat headband;

FIG. 35 is a partial, cross-sectional view of the LED and circuit board of FIG. 34 generally taken along line 35-35;

FIG. 49 is a perspective view of a LED embodying features of the present invention showing a lens and pair of lead surrounded by a protective covering;

FIG. 50 is a cross-sectional view of the LED in FIG. 49 generally taken along lines 50-50 showing the protective covering surrounding the LED;

FIG. 51 is a cross-sectional view of the LED in FIG. 49 generally taken along lines 51-51 showing the protective covering surrounding the LED lens;

FIG. 52 is a cross-sectional view of the LED in FIG. 49 generally taken along lines 52-52 showing the protective covering surrounding the LED leads;

FIG. 53 is a partial perspective view of a printed circuit board having LEDs threaded through holes in the circuit board;

FIG. 54 is a cross-sectional view of the printed circuit board of FIG. 53 showing the threaded configuration;

FIG. 55 is a perspective view of another lighted hat embodying features of the present invention;

FIG. 56 is a perspective view of rear of the lighted hat of FIG. 55 showing an alternative power module mounted to the rear thereof;

FIG. 57 is a partial elevational view of the lighted hat of FIG. 55 generally taken along lines 57-57 of FIG. 55 showing piping material along a brim edge between upper and lower brim coverings;

FIG. 58 is a partial cross-sectional view of the lighted hat of FIG. 57 generally taken along lines 58-58 showing the LED mounted in the brim;

FIG. 59 is a perspective view of the alternative power module from FIG. 56;

FIG. 60I is a rear elevational view of a hat having the power source assembly of FIGS. 60A-60I mounted to a rear portion of the hat;

FIG. 60J is a partial top plan view of the power source assembly mounted to the rear portion of the hat illustrating a curved profile corresponding to the profile of the hat;

FIG. 79 is a perspective view of the lighted headband of FIG. 78 shown removed from the hat;

FIG. 80 is an elevational view of the lighted headband of FIG. 78 showing details of the headband; and FIG. 81 is a cross-sectional view of the lighted headband of FIG. 78 showing a cover material forming a seal thereabout.

DETAILED DESCRIPTION OF THE PREFERRED EMBODIMENTS

Figure 4:
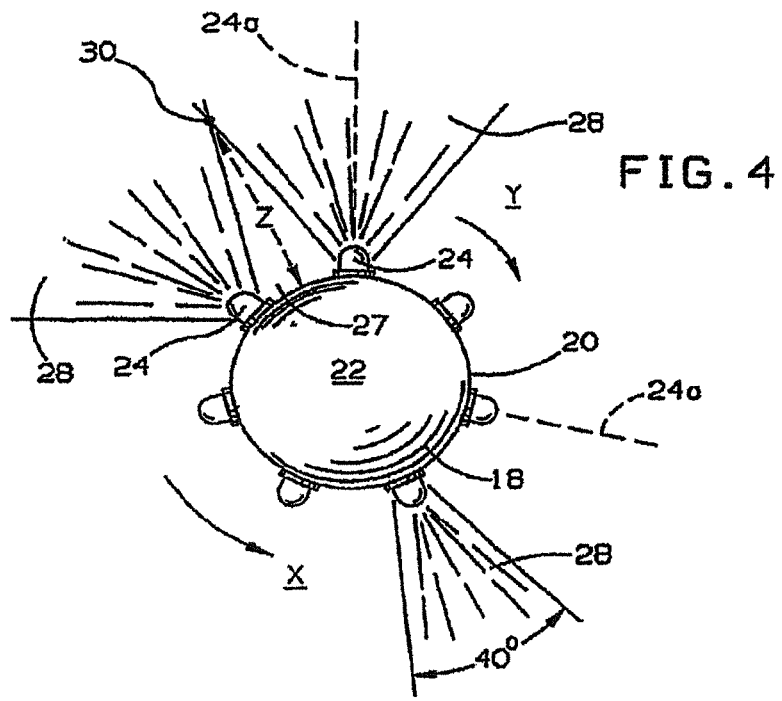
FIG. 4 is an enlarged plan view of the LED light module of FIGS. 1-3.

In general, the invention relates to hands-free lighting. As further described below, the hands-free lighting may be lighted headgear including hats such as baseball caps or hoods, lighted eyeglass frames that may or may not include lenses attached thereto, lighted clothing items having the lights positioned thereon to provide lighting forwardly of the wearer, and lighted headbands that may be wrapped around a wearer's head or around a crown portion of a hat.

Referring to FIGS. 1-13, hands-free lighting embodied in a lighted hat will first be described. In general, the lighted hat or other headgear described herein includes a variety of different illumination sources, which are preferably LEDs, mounted on different locations on the hat. To energize these illumination sources, a variety of different power assemblies are also disclosed that employ varying mechanisms to generate energy. For instance, the power generators may use renewable energy, such as solar, wind, or kinetic energy, to generate electrical power that ultimately energizes the variety of light sources that may be included on the disclosed hats. While the following description and illustrations may describe a specific power assembly with a specific hat and lighting configuration, the various power assemblies described herein may be included in any of the hat embodiments. In addition, while the preferred headgear is a baseball-type cap, the power assemblies and illumination sources may also be mounted to any suitable headgear, such as visors, helmets, caps, hats, headbands, hoods, or the like.

More specifically, referring to FIGS. 1-5, an exemplary lighted hat 10 is illustrated embodying features of an aspect of the invention. The hat 10 is illustrated as a baseball-type cap 12 having a crown 14 and a brim 16 projecting forwardly from a lower, forward edge portion of the crown 14. In this embodiment, the hat 10 is designed to provide illumination from a light module 18 mounted on the cap 10. In the illustrated embodiment, the lighted hat 10 is best used as a visibility source such that a wearer can be identified in the dark, as when running or jogging at night. For example, when the light module 18 is energized and providing illumination, the hat 10 would create attention directed towards the wearer so that they would be visible, particularly in poor lighting conditions such as during evening jogging or bike riding. Preferably, the light module 18 is mounted to the top or apex 17 of the crown 14 of the hat 10 such that light may be projected in multiple directions at the same time without obstruction as shown in FIG. 3.

Figure 5:
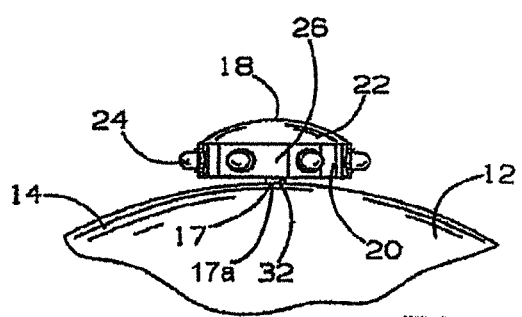
FIG. 5 is a side elevational view of the LED light module of FIG. 4 shown mounted to the crown of the hat.

Referring to FIGS. 4 and 5, the light module 18 comprises a cylindrical member 20 that is capped by a dome member 22. The cylindrical member 20 includes a light source preferably in the form of a plurality of circumferentially spaced LEDs 24 disposed along an annular surface 26 thereof. Preferably, the light module 18 includes at least seven equally spaced LEDs 24 about the annular surface 26. In such form, the light module 18 is configured to provide substantially continuous illumination or a substantially continuous light beam in all directions. That is, the light module 18 generally provides illumination in about 360 degrees around the hat wearer.

In an alternative embodiment as shown in FIG. 2A, the light module 18 includes four equally and circumspatially spaced LEDs 24a about the annular surface 26 and at least one LED 24b located on the dome member 22. The four equally and circumspatially spaced LEDs 24a can be configured and disposed to provide illumination in about 360 degrees around the hat wearer. The LED 24b can be configured and disposed to provide illumination an orthogonal direction to the illumination provided by LEDS 24a.

To achieve such substantially continuous illumination, each LED 24 preferably generates a predetermined beam or cone of light 28, as illustrated in FIG. 4, that combines with a light cone 28 of an adjacent LED 24 to form the continuous light beam. Preferably, each LED 24 has a light beam or light cone 28 of about 40 degrees, which is the angle or span that a beam of light is projected outwardly away from the LED, i.e., 20 degrees on either side of an LED central axis 24a. If each light source 24 is a similar LED, then the light module 18 will form a substantially continuous light beam at a radial distance Z spaced from the light module 18 where each light cone 28 intersects. That is, each adjacent LED 24 that is circumferentially spaced about the annular wall 26 will have a light cone 28 that will intersect the light cone of an adjacent LED 24 at a point 30, which is at the predetermined distance Z away from the surface 26 of the light module 18. Beyond the intersection point 30, the light cones 28 of each adjacent LED 24 generally overlap and combine to form the substantially continuous light beam. Therefore, such annular arrangement of the LEDs 24 will generally provide the 360 degrees of illumination at a concentric illumination circle that is spaced by the radial distance Z from the light module 18. The distance Z may be increased or decreased by including more or less LEDs 24 or varying the angle of the light cone of each LED. Preferably, the radial distance Z and the radius of the annular surface 26 together are less than or equal to the lower, outer or large diameter of the crown 14 of the hat 10. In such configuration, the substantially continuous beam of light will be generated at a position at which the wearer of the lighted hat 10 is most likely to need enhanced lighting, and use of lighting power is kept to a minimum within the diameter of the hat crown 14, i.e., above the user's head, where they typically will not need such optimal lighting conditions as provided by the light generated from module 18.

To this end, each pair of adjacent LEDs 24 will also form an unlit area 27 therebetween having no illumination. That is, each LED 24 will project its corresponding light cone 28, but interposed between the adjacent light cones 28 and extending from the light assembly annular wall surface 26 outwardly to the intersection point 30 will be the unlit area 27, which is not illuminated by either of the adjacent LEDs 24. The unlit areas are generally triangular in shape. As mentioned, these unlit areas will not usually be of concern from a visibility standpoint for the wearer of the lighted hat 10 due to the sizing thereof, e.g., within the outer diameter of the crown 14 based on the preferred size of the diameter of the annular surface 26 and the radial distance Z discussed above.

As illustrated in FIG. 5, the light module 18 may be mounted to the hat 12 through a post or other shaft 32 at the apex 17 of the hat crown 14. The shaft 32 may also be combined with an on/off switch for the light module 18. For instance, the light module 18 may include a rotary switch that is rotated, twisted, or turned via the shaft 32. Referencing FIG. 4, the light module 18 may be rotated a predetermined distance in one rotary direction about the shaft 32 to turn-on or energize the LEDs 24 and similarly rotated a predetermined distance in the opposite rotary direction to turn off or de-energize the LEDs 24. Alternatively, the light module 18 may include a toggle, rocker, or other type switch to energize and de-energize the LEDs 24. For example, pushing on the cap 22 to depress the light module 18 toward the crown 14 along the shaft 32 may also switch the lights 24 on and off. As described above, the modules 18 and the rotary shaft 32 can serve as the switch actuator for the switches in the light module 18.

The plurality of LEDs 24 that are included with the light module 18 may operate in different illumination modes. For example, the LEDs 24 may illuminate at the same time, may be illuminated separately, may blink, or illuminate in different patterns. In that regard, the on/off switch may have multiple stops or energizing points to allow a user to select each of the modes. Similarly, pushing the light module 18 down different numbers of times can activate different lighting modes.

In the illustrated form of the hat 10, the light module 18 may also house the electrical components to illuminate the LEDs 24. For instance, the internal space defined by the cylindrical member 20 and the dome cap member 22 may contain the batteries, the switch mechanism (with the shaft actuator extending out from the module), and other electrical components such as diodes, capacitors, and resistors and/or a printed circuit board to power the light source 24. Therefore, the illumination source and the other components used to provide illumination are both separate from the hat 10 and housed in a single component, such as the module 18, so that the shape and comfort of the hat crown 14 and brim 16 is not significantly altered by the illumination source and other electrical components. Alternatively, the light module 18 may be connected to separate electrical components disposed at varying locations on the hat 10 with appropriate connections therebetween.

The module 18 can be connected to the hat 10 in a variety of ways. In one alternative, the module 18 can be mounted to the hat 10 by a releasable connection 17a such that the user can be free to connect or disconnect the module 18. The releasable connection 17a can attach the module 18 to the hat 10 in a variety of ways, including, for example, the use of a snap, a magnet, a Velcro clip, pins, and/or other releasable-type connections.

Figure 5A:
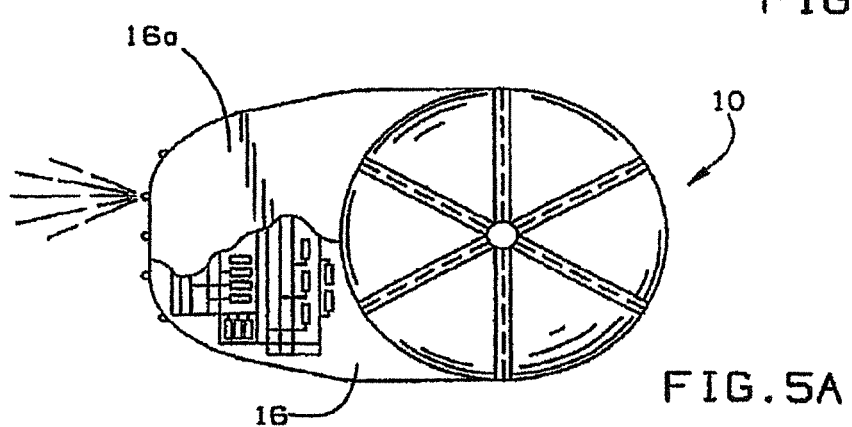
FIG. 5A is a plan view of an alternative lighted hat in accordance with the present invention showing a brim of the hat forming an integrated printed circuit board.

As illustrated in FIG. 5A, the hat 10 may include a brim 16 that is formed of or includes an embedded printed circuit board therein. That is, the brim 16 may have a dual function as the shape-retentive arcuate cap brim member to provide shade, for example, and also as a circuit board for an electrical circuit. In this regard, the brim 16 will be formed form an insulator or a material having non-conductive properties, such as paper impregnated with resins, woven fiberglass and resin combinations, or plastics such as polyimides, polystyrenes and cross-linked polystyrenes. The brim 16 having the integrated printed circuit board may include appropriate electrical connections, components, and wiring printed, formed and/or mounted thereon to energize or illuminate the LEDs 24 and to perform other functions as desired. The brim 16 may also include a fabric covering material 16a consistent with the remainder of the hat 10 such as on the crown 12 thereof. The use of a printed circuit board as the brim 16 optimizes the available space for the components to operate the LEDs 24 because the brim and electronics are combined or integrated; therefore, the overall form and appearance of the hat is substantially unchanged.

Figure 5B:
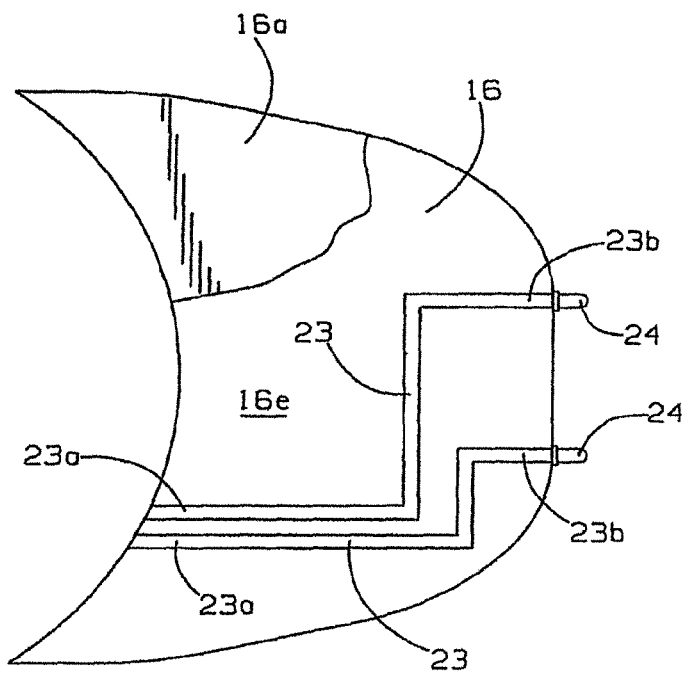
FIG. 5B is an plan view of an alternative brim with printed circuit traces formed thereon.

For example, FIG. 5B illustrates the brim 16 with conductive circuit traces 23 extending along an upper surface of the brim 16. The conductive traces 23 provide electrical communication between a power source (not shown) and a light source, such as LEDs 24, positioned on the brim 16. That is, the conductive traces 23 preferably extend from a first connection 23a in which the trace 23 is coupled to electrical wiring (not shown) embedded within the had crown 14, and the traces 23 further extend across the hat brim 16 to a second connection 23b where the conductive trace 23 is joined to the leads of the LED 24, as will be discussed in more details below.

In order to minimize the appearance of the traces 23 on the brim 16, the conductive traces 23 are low profile pieces of conductive metal, such as thin, elongate pieces of conductive metal. Preferably, the traces 23 are sufficiently thin such that the traces 23 conform to the shape of the brim 16 when installed thereon. In this manner, when the brim 16 and traces 23 are covered with the fabric covering 16a, the brim 16 substantially retains the appearance of a normal hat brim; that is, a hat without the conductive traces. A suitable conductive trace 23 may be formed from stamped metal, such a copper, brass, or other conductive metal, about 0.001 inches thick. The traces 23 may be applied to the brim 16 through adhesive or other suitable securing mechanisms.

Figure 5C:
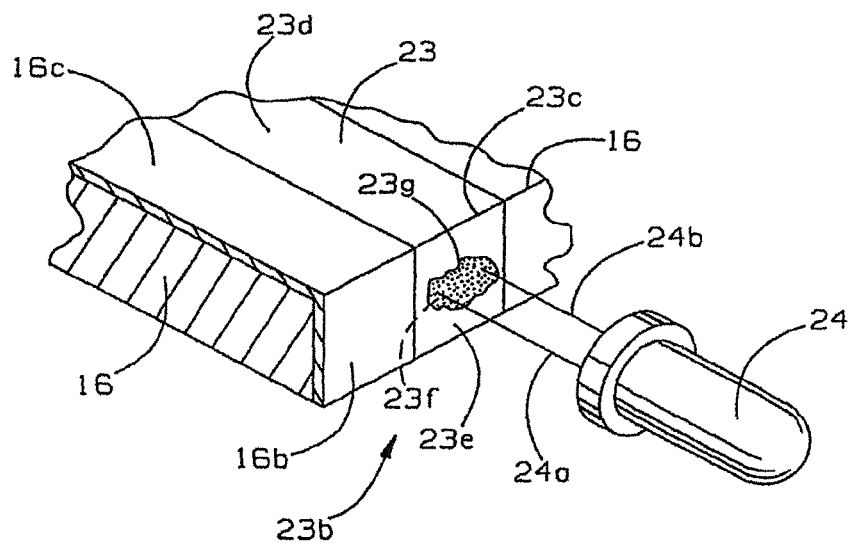
FIG. 5C is a partial cross-sectional view of the hat brim of FIG. 5B showing an exemplary connection between the circuit traces, LED leads, and the brim material.

Referring to FIG. 5C, the connection 23b is illustrated in more detail. The hat brim 16 includes an outboard edge 16b at which the LEDs 24 are mounted. As shown in FIG. 5C, the trace 23 extends along a brim upper surface 16c and also along the outboard 16b where the connection 23b to the LED 24, and specifically the mounting thereof, is formed. That is, the trace 23 preferably includes a transition portion 23c, such as a right angle bend, where the trace 23 transitions from the brim upper surface 16c to the brim outboard edge 16b. In such configuration, the trace 23 defines a main portion 23d along the brim upper surface 16c and a smaller, forward portion 23e along the brim edge 16b.

The forward portion 23e of the trace 23 forms part of the connection 23b and includes at least one receiving opening 23f sized for receipt of conductive leads 24a and 24b of the LED 24 therein. To form a more secure connection, a small bead of solder 23g is applied around an interface between the LED lead 24a, 24b and the forward trace portion 23e. While the connection 23b illustrates a preferred form of an electrical connection between the LED 24 and the conductive trace 23, other conductive connections are also possible.

With the inclusion of a printed circuit board, the hat 10 may also be configured to operate the lights in a variety of special or unique ways, such as in patterns, at different rates, in different intensities, in synchronization modes, in random modes, in blinking modes, or with other effects. Moreover, with the inclusion of the printed circuit board brim 16, the hat may also include other features such as a radio frequency circuit including RF receivers or RF transmitters allowing the hat 10 to function as a transmitter, a receiver, a radio, or have the LEDs operated remotely. For example, the printed circuit board brim 16 could be in radio communication with a separate, companion light (not shown) that may be mounted to a variety of surfaces or structures, such as on the top of a tent for example. Therefore, at night if the hat wearer is lost, the printed circuit board brim 16 could energize the companion light through RF signals from the transmitter in the hat brim 16 to provide illumination to the tent or other surface to which the companion light is mounted.

As previously mentioned, the lighted hats described herein may include a variety of different power assemblies. The power assemblies can include battery power sources and, if the batteries are rechargeable, then power generators can also be provided. The power assemblies can be provided with detachable connections 51 between the power source and generator, and the generators can be adapted to convert different types of energy, such as renewable energy, to electrical energy to be supplied for recharging the batteries.

Figure 6:
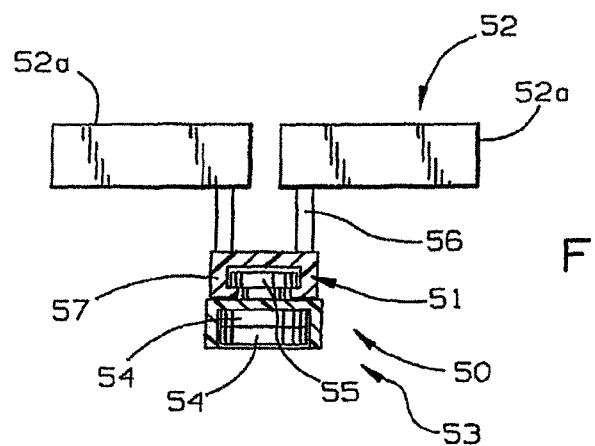
FIG. 6 is a schematic view of an exemplary power assembly for a lighted hat in accordance with the present invention showing a detachable connection between a rechargeable power source and a power generator of the assembly.

One power assembly is illustrated in FIG. 6, which shows a solar power assembly 50 that may be used to operate the LEDs 24 and any other electronic functions of the hat 10 together with the detachable connection 51 between the solar-based electrical power generator 52 and a power module 53 including at least one and preferably two rechargeable batteries 54. The connection 51 is an electrical connection such as of a bayonet and/or plug and socket-type construction so that electrical power generated by the solar generator 52 can be transmitted to the batteries 54 for recharging purposes. As shown, the generator 52 includes a pair of photovoltaic cells or solar panels 52a that have depending support shafts 56 connected to a common socket-type receiving member 57 at their lower ends. The electrical energy generated by the panels 52a is transmitted through the shafts or leads therein to the socket member 57. Preferably, the photo cells 52a are mounted on any upper location on the hat to avoid obstructions that may block solar radiation. For instance, the photo cells 52a may be detachably mounted to an upper surface of the brim 16 (see, e.g., FIG. 7). The cells 52a have a large, flat surface 52b extending normal to the shafts and facing upwardly for collecting solar energy.

As shown in FIG. 6, the solar power generator 52 is removably or detachably connected to the hat through the connection 51. The connection 51 includes a conductive plug-type member 55 projecting up from the brim 116 for mating with a conductive portion of the socket member 57 of the solar power generator 52. Manifestly, the connection 51 may have the location of the plug and socket reversed. Therefore, when the rechargeable batteries 54 require recharging, the solar power generator 52 is electrically connected to the power module 53 by inserting the plug-type member 55 into the socket member 57 to form an electrical connection between the solar array 52 and the batteries 54. After the batteries 54 are recharged, the power generator 52 can then be disconnected from the power module 53 and thus the hat 100.

The solar power assembly 50 utilizes solar energy to generate electrical power for the light source 24. That is, the photo cells 52 capture the solar energy and convert such energy to electrical energy which is transmitted to the batteries 54 for the recharging operation. In this manner, the batteries may recharge during the day when solar energy is abundant and still provide power for the light source 24 that are used at a later time. This configuration is advantageous in that the wearer may automatically recharge the batteries 54 whenever the hat is worn and exposed to solar energy without necessarily requiring any intervention such as by activation of a power generator by the wearer. Alternatively, a switch could be provided for switching between recharging modes and on/off states of the lights. The use of rechargeable batteries is preferred to reduce the need to replace the batteries. With the present power assemblies including detachable power generators, the hats can still be worn during recharging operations. After the batteries are recharged, the power generators can be removed so that the hats can be worn in a form closer to their regular configuration albeit including the power modules and illumination sources as described therein. For example, with the solar electrical power generator 52, during normal hat wearing during the day, the batteries can be recharged with the solar based electrical generator 52 attached to the hat such that the hat 10 will be able to the provide the desired illumination when needed by the wearer, such as when jogging in the dark later in the evening with the generator 52 removed.

Figure 7:
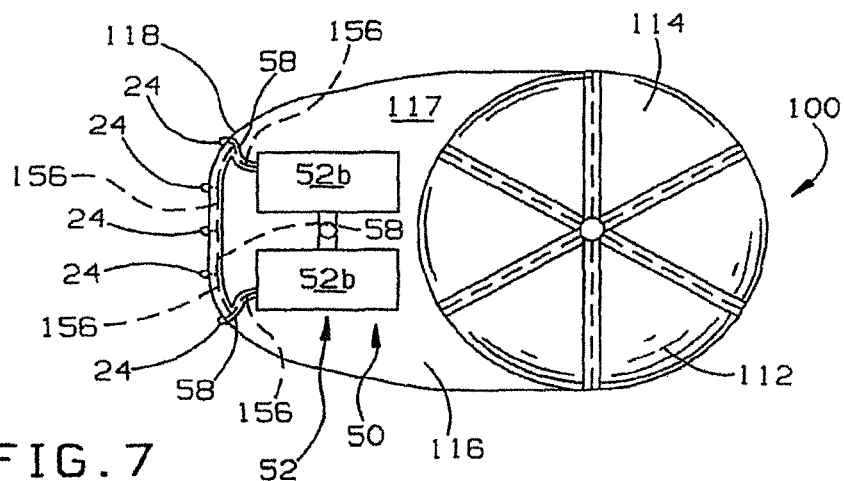
FIG. 7 is a plan view of an alternative lighted hat in accordance with the present invention showing a solar power generator detachably connected to the hat brim.
Figure 8:
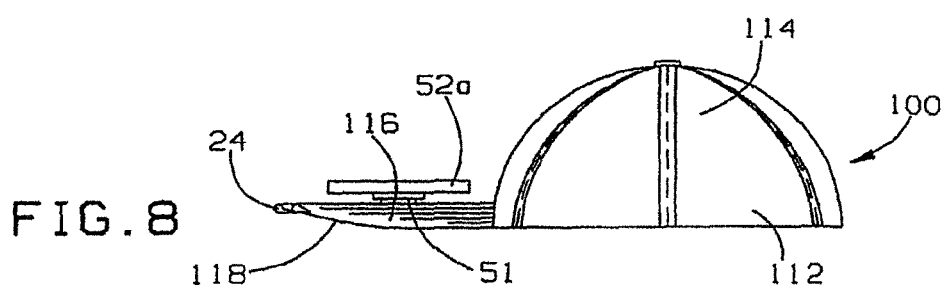
FIG. 8 is a side elevational view of the lighted hat of FIG. 7.

Referring to FIGS. 7 and 8, an alternative lighted hat 100 is illustrated with the solar-based power generator 50. The hat 100 is also illustrated as a baseball-type cap 112 including a crown 114 and a brim 116, but may also be any type of hat, cap, or other head gear. Preferably, the hat 100 includes a light source 24 such as in the form of a plurality or array of LEDs 24 on the brim 116. As illustrated, the plurality of LEDs 24 project slightly beyond an outboard, arcuate edge 118 of the brim 116. The LEDs 24 are constructed to provide a light beam so that the wearer may illuminate an area forwardly of the hat 100 within the wearer's field of view without requiring the user's hands to hold a flashlight or other handheld lighting device. Accordingly, the LEDs 24 may be canted or angled downward to provide the light within the wearer's field of view.

In this embodiment, the hat 100 is illustrated with the previously described solar-based electrical assembly 50 for generating electrical power from solar energy to energize the LEDs 24. As shown in FIGS. 7 and 8, the generator 52 is releasably connected to an upper surface 117 of the brim 116 through the detachable connection 51 to the power module 53 as previously described, but may also be located on other areas of the hat 100. The assembly, and specifically the power module 53, is in electrical communication with the LEDs 24 and, therefore, may include appropriate electrical wires or leads 156 therebetween, which may also include a barrier 58 to avoid moisture penetration thereto. The leads 156 can extend between the brim insert 116a and fabric covering material 116b so that they are somewhat protected thereby. However, moisture can penetrate the brim fabric 116b and, depending on the material, the brim insert 116a. Accordingly, the barrier 58 is effective to block access of moisture to the leads 156 that otherwise penetrates the brim fabric or insert.

More particularly, the electrical connections 156 or any other electrical connections on the hat 10 may be coated with the moisture barrier 58. Again referring to FIG. 7, the electrical wires or leads 156 may be completed encompassed by the barrier 58 extending thereabout to avoid moisture penetration therethrough. Preferably, the barrier 58 is a varnish, shellac, epoxy, or other moisture resistant or waterproof coating. The barrier 58 is designed to insulate the electrical leads 156 from water, moisture, sweat, or other liquids that may disrupt the electrical operation of the light source 24 or corrode the electrical leads 156. These coated electrical leads 156 would be beneficial in hats as described in Applicant's U.S. Pat. No. 6,659,618, which is incorporated by reference as if reproduced entirely herein.

Figure 8A:
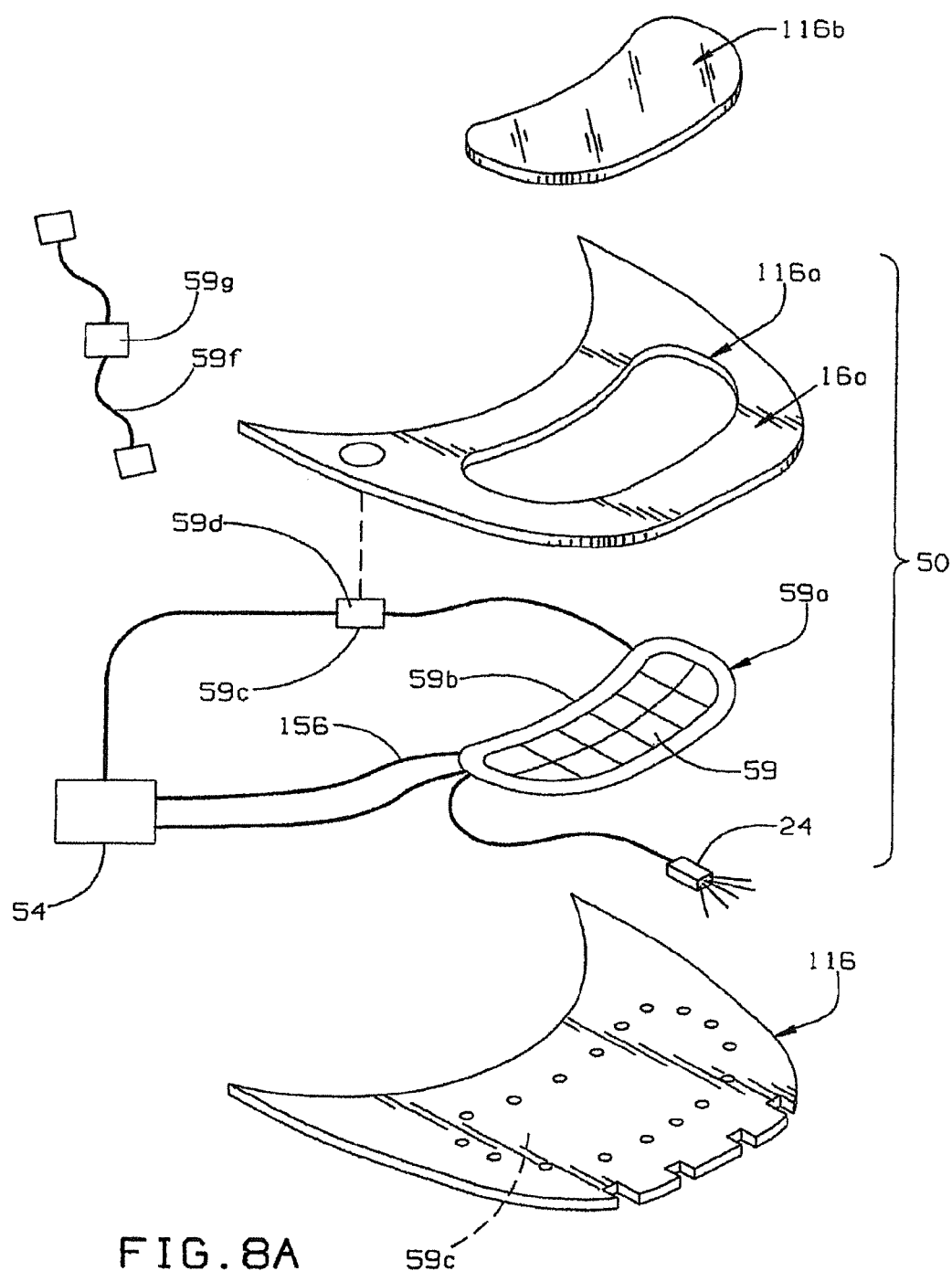
FIG. 8A is an exploded view of an alternative lighted hat showing an solar power generator fixed to the hat brim.

Referring to FIG. 8A, an alternative solar power generator 50 is utilized to generate electrical power for the light source 24. The alternative solar power assembly 50 may also be used in the lighted hat 110 or any other lighted hat described and illustrated herein. In this form, the solar power assembly 50 conforms to the hat brim 116 in order to minimize the outward appearance of the power generator on the hat 100. That is, the power generator 50 includes thin, flexible cells 59 in the form of a flexible photovoltaic cell 59a that is adhered to and bends or flexes in order to conform to the shape of the brim member 116.

More specifically, the photovoltaic cell 59a is adhered to the brim member using adhesive, glue, or other suitable fastening mechanism 59c. The cell 59a preferably includes wiring 156 extending therefrom that is in electrical communication with the power source 54, such as rechargeable battery, or the desired light source, such as LEDs 24. To form such power assembly 50 that conforms to the hat brim 116, the fabric material 16a that covers the brim member 116 defines an opening or cutout 116a having a shape similar to that of the photovoltaic cell 59a to permit sunlight or UV light to reach the cell 59a. Preferably, the opening 116a is slightly smaller than the size of the cell 59a in order to provide a pleasing appearance and also protect the edges of the cell 59a during use.

Received within the opening 116a is a window material 116b that permits sunlight or UV light to be transmitted therethrough. Preferably, the window 116b is a transparent plastic sheet either glued to sewn to the brim material 16a and that completely covers the opening 116a. It is preferred that the plastic sheet be thin and have a thickness similar to that of the fabric brim material 16a such that the assembled brim and power generator has a generally uniform appearance thereacross. To complete the assembly, the brim material 16a and window 116b is adhered to or sewn to the brim member 116. By sewing the window 116b to the brim material 16a, it allows the brim material 16a to be more easily and uniformly wrapped around the brim member 116.

Alternatively, in order to provide enhanced protection to the photovoltaic cell 59a, the brim material 16a and/or the window 116b may also be secured to the cell 59a. An edge 59b of the photovoltaic cell 59a may be sealed to the window 116b and/or the brim material 16a through a bead of sealing adhesive, a heat seal, sewing, glue, or other suitable sealing mechanism that can continuously extend around the cell 59. The seal minimizes the intrusion of water or moisture to the cell 59, which might otherwise accumulate on the underside of the window 116a and affect the performance of the photovoltaic cell 59.

Referring again to FIG. 8A, the alternative solar power generator 50 may also include an optional bi-directional power port 59d that is in electrical communication with both the photovoltaic cell 59a and the power source 54 through appropriate wiring or other external connections 59f. In this manner, the power port 59d may be used to recharge the power source 54 via the external connection 59f by plugging into a typical wall AC power outlet during the evening or in situations when sunlight is not available or less abundant. The external connection 59f preferably incorporates an appropriate power transformer 59g in order to convert the AC wall power to the DC power of the power source 54.

Alternatively, the power port 59d may also be used in reverse to charge an external power source (not shown) through the separate electrical connection by the photovoltaic cell 59a. In this manner, if the power source 54 is fully charged, the photovoltaic cell 59a may be used to charge a variety of external rechargeable batteries. The power port may, therefore, also include an appropriate selector switch 59e that switches charging from the wall AC to the photovoltaic cell 59a. If included, the brim material 16a may also include an opening 116b sized for receipt of the power port 59d. Optionally, the power port 59d may also be positioned on other portions of the hat 100.

Figure 9:
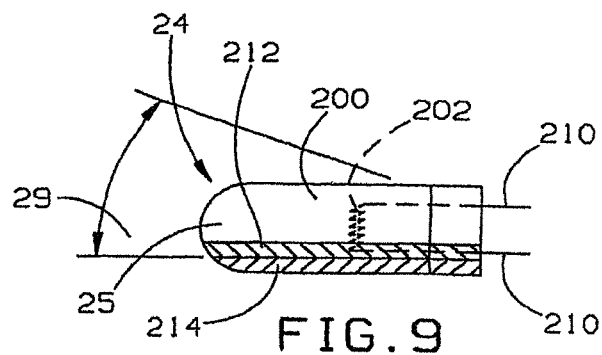
FIG. 9 is a enlarged side elevational view of an LED for use with hands-free lighting devices showing an LED lens having light reflective and blocking coatings thereon.

As illustrated in FIG. 9, a detailed view of a modified or light-concentrating LED 25 is shown. The light-concentrating LED 25 is configured to optimize the light output therefrom and minimize wasted light. Alternatively, or in addition to the above, the light-concentrating LED 25 is configured to reduce the amount of stray light such as light that can cause unwanted glare or the like. The light-concentrating LED 25 is used on the brim 116 of the hat 100. The light-concentrating LED 25 may be any common LED that includes a housing or lens 200 of a typical translucent or transparent housing, a LED chip or diode 202 for illumination, and electrical leads 210, such as an anode and cathode leads, extending therefrom. However, the light-concentrating LED 25 also includes at least one material or coating 212 and, preferably, a second material or coating 214 on a predetermined portion of the lens 200, such as along a portion of an outside surface thereof. The materials 212 and 214 are advantageous because they preferably optimize or concentrate the light output from the light-concentrating LED 25 and minimize stray or otherwise wasted light by providing a modified light cone 29 that emanates from the light-concentrating LED 25.

The first material 212 may have a reflective surface and is applied to a lower portion or an underside of an outer surface of the light-transmissive lens 200 of the light-concentrating LED 25. The material 212 is designed to optimize and/or concentrate the light output that is projected outwardly from the LED lens body 200 in a predetermined direction or light cone. As shown by the modified light cone 29, the first material 212 concentrates the light emanated from the LED chip 202 in a generally axial direction outwardly from the light-concentrating LED 25 and also generally upwardly away from the first material 212. The first material 212 may be a silver or nickel coating or a lithium silver plating or nickel lithium planting; however, other reflective coatings are also suitable.

With use of the first material 212, the normal light cone projected from the LED is reduced in size by approximately 50 percent, and thus the amount of light in the modified cone 29 is doubled or increased by approximately 100 percent over the light concentration in a normal light cone that is twice as large as the cone 29. While the first material 212 is illustrated in FIG. 9 on the lower or bottom portion of the light-concentrating LED 25, it may also be included on other portions of the light-concentrating LED 25 as desired depending on how the light from the light-concentrating LED 25 needs to be focused or directed.

The second material 214 is a black or other dark colored coating for blocking the light from being emanated in a particular direction and may be any opaque coating applied to the light-concentrating LED 25. As illustrated in FIG. 9, the second material 214 is preferably applied to the light-concentrating LED 25 beneath the first material 212 and therefore, also on a lower portion of the light-concentrating LED 25. Thus, in the illustrated form, the first reflective material 212 is between the LED lens 200 and the second material 214. Alternatively, the coatings 212 and 214 could be applied on the inner surface of the LED lens with the reflective coating 212 being applied on the underlying coating 214 which is applied to the lens surface. As a result, when the light-concentrating LED 25 is installed on the hat 100 as described above, the material 214 minimizes the glare from the LEDs in the wearer's eyes because the second material 214 substantially prevents light from being projected in a downward direction below the brim 116 directly in front of the wear's eyes. In this regard, it is preferred that no matter where the first coating 212 is applied to the light-concentrating LED 25 to concentrate and direct the light, the second material 214 is preferably applied in such a manner that when the light-concentrating LED 25 is installed on the hat 100, the second material 212 is in an orientation to block the light that may be emanated from the LED towards the wearer's eyes. In other words, the second material 212 will be on the lens 200 so that it is between the LED chip 202 and the eyes of the hat wearer.

While the first and second materials 212 and 214 are illustrated as extending the entire axial length of the LED lens 200, depending on the modified light cone 29 desired, the materials 212 and 214 may also only extend a portion of the axial length of the LED lens 200 or extend in varying lengths on the lens 200. Preferably, the materials 212 and 214 will extend at least from the electrical connections 210 past the LED chip 202. Moreover, while the light-concentrating LED 25 has been described with both coatings 212 and 214, the light-concentrating LED 25 may also incorporate each coating separately depending on the light output, direction, and/or concentration desired.

Figure 9A:
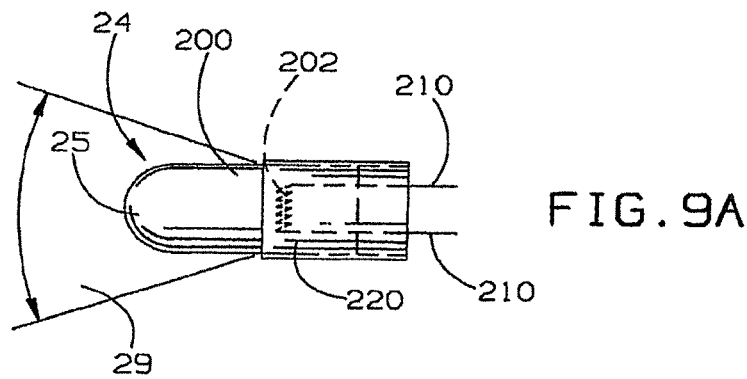
FIG. 9A is an enlarged side elevational view of an alternative LED showing reflective tape wrapped about the LED lens.

Alternatively, as shown in FIG. 9A, the light-concentrating LED 25 may have a reflective tape 220 wrapped therearound instead of or in combination with the materials 212 and 214, or just the light blocking material 214. For instance, the tape 220 may be wrapped radially around the light-concentrating LED 25 such that the tape 220 circumscribes the lens 200 and extends axially generally parallel to the electrical leads 210 to the LED chip or diode 202. However, the tape 220 may also extend different axial lengths on the light-concentrating LED 25 depending on the light cone 29 desired. For example, if a more concentrated or narrow light beam is desired, then the tape 220 may extend axially from the electrical leads 210 beyond the diode 202 so a more narrow or concentrated light cone 29 is formed. On the other hand, if a more diffuse or wide beam is desired, then the tape 220 may extend only a short distance and be axially spaced rearward from the diode 202 so a wider light cone 29 is formed. Manifestly, if there is a reflective layer only on one side of the tape 220, then the reflective layer on the tape 220 is to be facing inward towards the diode 202 so that the reflective tape 220 will concentrate the light being emanated from the diode 202 and reflect any stray light inwardly into the desired light cone 29.

Figure 10:
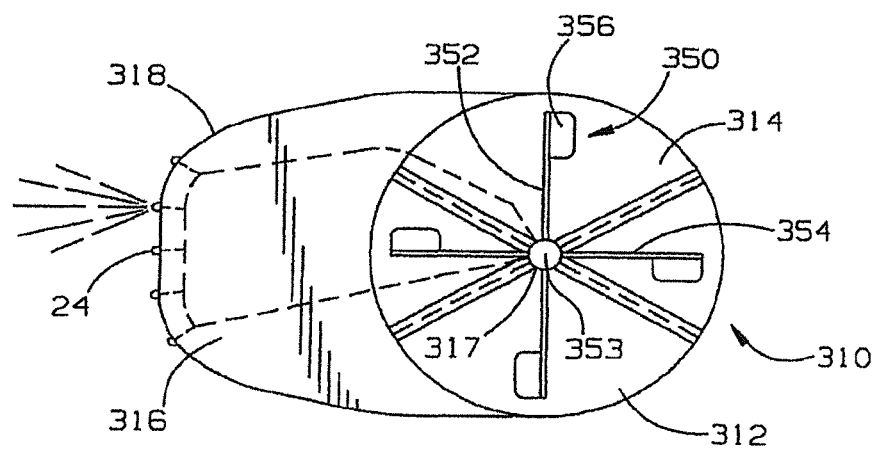
FIG. 10 is a plan view of another alternative lighted hat in accordance with the present invention showing a wind-based electrical generator detachably connected to the top of the hat crown.
Figure 11:
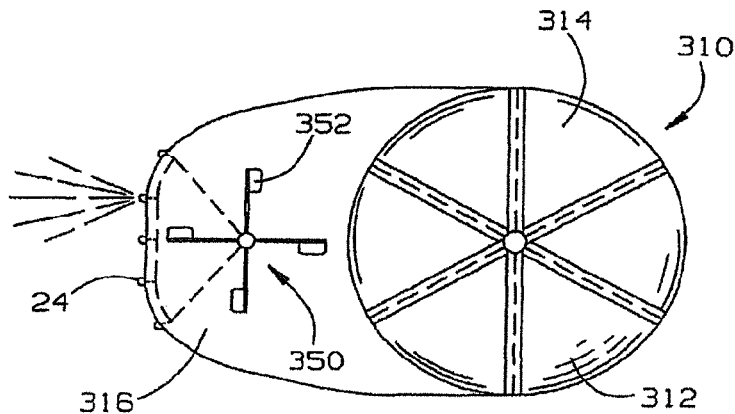
FIG. 11 is a plan view of a variation of the lighted hat of FIG. 10 showing the wind-based electrical generator detachably connected to the hat brim.

Referring to FIGS. 10 and 11, another embodiment of the lighted hat is illustrated shown with an alternative power generator using renewable energy sources. In this embodiment, a hat 310 is illustrated, which is also preferably a baseball-type cap 312 having a crown 314 and a brim 316. Similar to the previous embodiment, the hat 312 includes a light source 24 disposed at an edge 318 of the brim 316. As with the other embodiments, the light source 24 used with hat 310 is preferably LEDs that are disposed along the brim edge 318.

In this embodiment, the hat 310 includes a wind-based electrical generator 350 that has a wind activated rotary mechanism 352. As such, mechanism 352 uses wind power to energize rechargeable batteries that can be later used to power the LEDs 24 as desired. Alternatively, the wind activated mechanism 352 may directly energize the LEDs 24 whenever the wind activated mechanism 352 is operated by a wind source. As with the solar power assembly 50, the wind based electrical generator 350 generally provides for a lighted hat that does not need to have batteries replaced as frequently as non-rechargeable batteries.

In one form, the wind activated mechanism 352 has a windmill-type configuration having a rotary axis 353 and a plurality of vanes 354 or other wind catching devices extending radially outward from the axis 353. The vanes 354 include enlarged surfaces 356 that are moved by the wind such that the wind activated mechanism 352 rotates about the axis 353. This rotary motion of the wind activated mechanism 352 generated by the wind power is converted to electrical power in a well-known manner which is then utilized to recharge the batteries. The wind activated mechanism 352 can rotate by air current generated either by the wind or by the wearer moving at a high rate of speed when the wind conditions are not sufficient to activate the mechanism 352 so that the vane members 356 rotate about the axis 353.

As shown by the alternative forms of the hat 310 in FIGS. 10 and 11, the wind activated mechanism 352 may be disposed at different locations on the hat 310 depending on the location of the power module 53. In one form, the wind activated mechanism 352 may be rotatably joined to the hat 310 at the apex 317 of the crown 314 as shown in FIG. 10. Alternatively, the wind activated mechanism 352 may be disposed on the brim 316 of the hat 310 as shown in FIG. 11. However, the wind activated mechanism 352 may be placed in any location on the hat 310 so long as the wind may operate the wind activated mechanism 352 in a substantially unobstructed fashion. As with the solar power assembly 50, the wind based electrical generator 350 can be removably connected to the hat 100 via the detachable electrical connection 51 in a similar manner as previously described with the solar power assembly 50.

Figure 12:
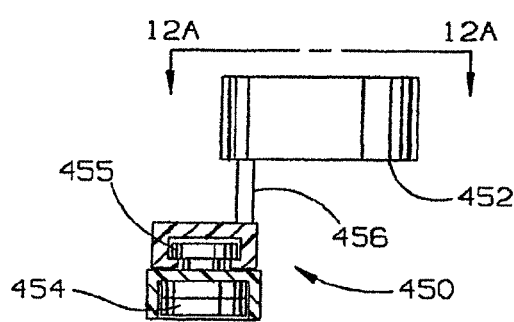
FIG. 12 is a schematic view of another alternative power assembly in accordance with the present invention showing a motion generator detachably connected to the rechargeable power source.

Referring to FIG. 12, a motion-based electrical generator 450 is illustrated that can be joined to any of the lighted hat embodiments described herein. Generator 450 utilizes the motion of the hat wearer such as when walking or running which is converted to electrical energy for recharging the batteries and powering the light source 24. That is, the generator 450 converts kinetic energy to electrical energy. For instance, the generator 450 harnesses the kinetic energy from the motion of a hat, such as any vertical or horizontal motion or vibrations, resulting from a wearer's head movements during walking, running, or other movements, and converts such kinetic energy to electrical energy. As with the other embodiments, the generator 450 may recharge batteries or directly power the light source 24. As a result, the generator 450 also provides power to illuminate the light source 24 without the need of replacing batteries as often as with non-rechargeable batteries.

In the illustrated form, the power generator 450 includes a motion sensor 452, at least one rechargeable battery 454, a releasable connection 451, and a mounting shaft 456 that electrically interconnects the generator 450 to the electrical socket 457. The motion sensor 452 converts the harnessed kinetic energy to electrical energy. Similar to the other embodiments, the releasable connection 451 includes the receiving or socket member 457 of the motion sensor and a projecting plug-type member 455 on the hat. To recharge the batteries 454, the socket member 457 receives the plug member 455 so that the motion sensor 452 and batteries 454 are in electrical communication.

Figure 12A:
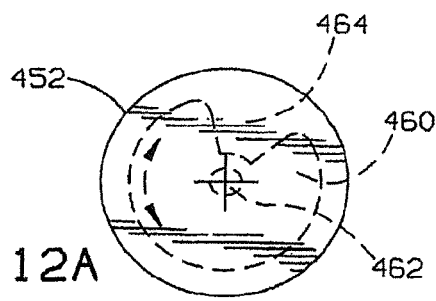
FIG. 12A is a detailed schematic view of a pendulum-type disc as an exemplary motion power generator for the power assembly of FIG. 13.

As illustrated in FIG. 12A, the motion sensor 452 may be a pendulum-type disc 460 that reciprocates clockwise and counterclockwise about an axis of rotation 462 upon motion of the power generator 450. In this regard, the pendulum-type disc 460 may be a counter-weighted disc or a disc having a wedge-shaped portion 464 removed therefrom to permit one portion of the disk to have less mass than the remainder of the disk. Such mass differential permits the disk to oscillate about the central axis 462. The reciprocating motion of the disc 460 provides the kinetic energy for the motion generator 450.

While it is preferred that the motion sensor 452 be removably disposed on either the brim or crown of any of the hats herein described, the motion sensor 452 may also be disposed in a wearer's shoes, pants, or other separate clothing pieces. In such alternative configurations, the motion sensor 452 would include an appropriate connection to the rechargeable batteries 454 in the hat. Such alternative configuration may be able to take advantage of the greater levels of kinetic energy generated from the larger range of motion from the movements of the legs and feet during walking or running as compared to the more limited range of motion of the head.

Figure 13:
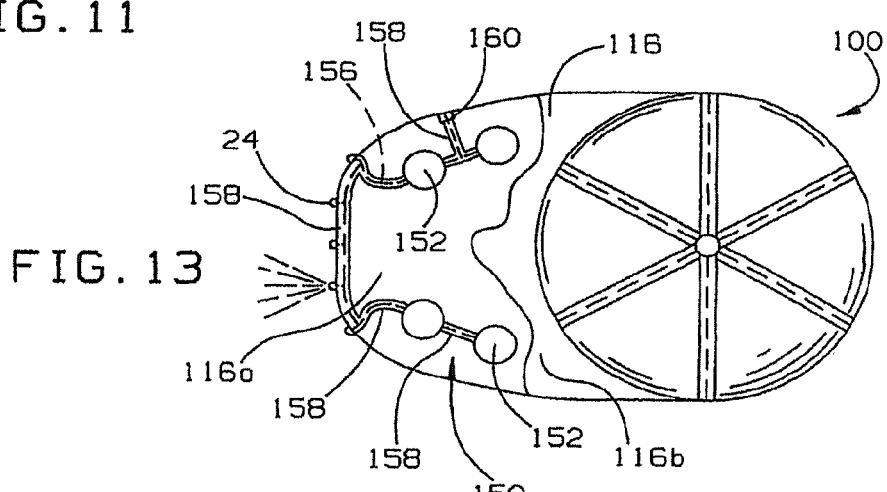
FIG. 13 is a plan view of the lighted hat of FIG. 7 illustrating an alternative power assembly including batteries housed within the hat brim.

Referring to FIG. 13, a coin-battery power source 150 in illustrated. The power source 150 includes several coin-sized lithium ion batteries 152 disposed on the brim 116 or, preferably, in openings or cavities within the brim 116 such as in the shape-retentive arcuate insert 116a thereof, or captured between the insert and the fabric material 116b attached thereto. The batteries 152 are in electrical communication with appropriate lead wire connections 156, which may also include the barrier coating 58, the LEDs 24, and an on/off switch 160. Herein, the on/off switch could be a rotary switch, or rocker or toggle switch, but may be other known types of switches. As illustrated, the switch is accessible on the side of the brim, but may also be in other locations. Preferably, the batteries 152 have a thickness similar to or less than a thickness of the brim 116 so that the batteries 152 may be contained or encompassed within the brim 116 without altering the outer appearance or original form of the hat 110. That is, the batteries 152 may have a thickness less than or similar to the shape-retentive arcuate insert 116a so that when the insert is covered by the fabric cover material 116b the batteries may be hidden within the hat 100 and not form easily visible projections that would otherwise distract from the appearance of the hat or minimize the comfort of wearing the hat.

Referring now to FIGS. 14-27, another hands-free lighting embodiment is illustrated, which includes lighted eyeglass frames 500. In general, the lighted eyeglass frame 500 described herein includes a light source mounted onto a portion of the frame for directing light forwardly of the wearer together with a variety of different options to energize the light source.

Figure 16:
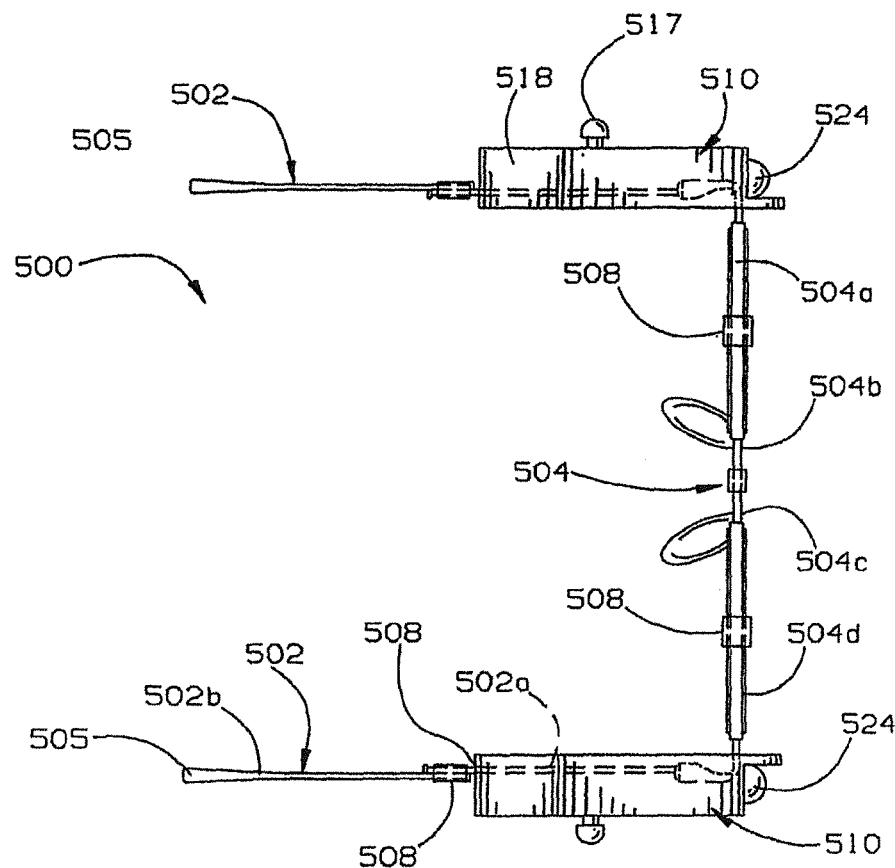
FIG. 16 is a plan view of the lighted eyeglass frames of FIG. 14 showing both of the temple arms and a cross-frame member extending between the forward ends of the arms in an extended position.

In one embodiment, as shown in FIGS. 14-17, a light module 518 with a light source or LED 524 is mounted to a collapsible eyeglass frame assembly 500 to form the lighted eyeglasses. The eyeglass frame assembly 500 is configured as a typical eyeglass frame assembly having a pair of spaced temples or arms 502, and a cross-frame member 504 extending therebetween and pivotally connected to each of the temples at either end thereof. The cross-frame member 504 includes an appropriate bridge structure intermediate the ends so that the frame 500 may rest on the bridge of an individual's nose (FIG. 16). The temples 502 extend rearwardly from the spaced ends of the cross-frame member 504 and may also include a downwardly projecting ear portion 506 so that the end 505 of each temple 502 may conform to or extend around an individual's ear (FIG. 14a). Alternatively, the temples may extend generally straight back from the cross-frame member 504 without the ear portion 506 (FIG. 15a). The frame assembly 500 shown in FIGS. 14-17 includes both a retracted position and an extended position.

Figure 17A:
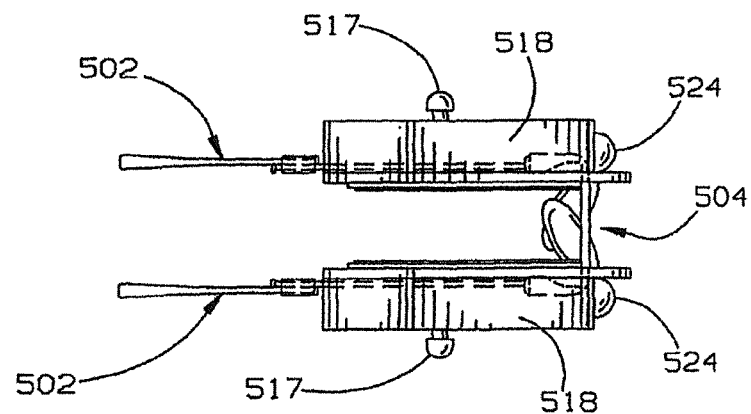
FIG. 17A is a plan view of the lighted eyeglass frames of FIGS. 14A and 14B showing both the temple arms and the cross-frame member in their retracted positions.
Figure 17B:
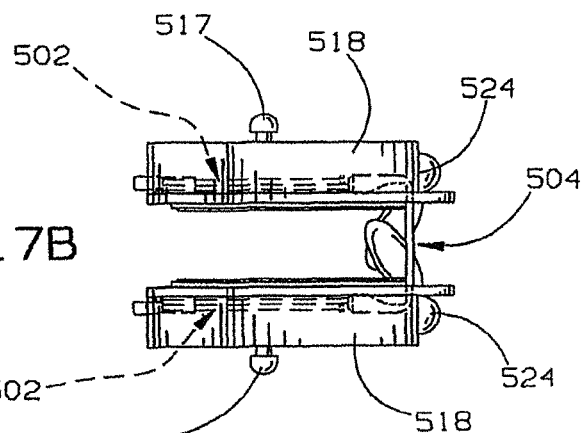
FIG. 17B is a plan view of the lighted eyeglass frames of FIGS. 15A and 15B showing both the temple arms and cross-frame member in their retracted positions.

In the retracted position or state the cross-frame member 504 and temples 502 are preferably collapsed such that the frame 500 is in a more compact form for ease of storage and protection (FIGS. 14B, 15B, 17A, and 17B). As further discussed below, the cross-frame member 504 and each temple 502 separately retract to form the compact structure. In the retracted state, the cross-frame member 504 and temples 502 are generally protected by the light module 518 because, as further described below, the cross-frame member 504 and temples 502 are partially or substantially covered by the light module 518. In other words, the arms 502 will generally not project very far if at all beyond the light modules, and only a small section of the cross-member 504 will be exposed to extend between the modules 518, as can be seen in FIGS. 17A and 17B. Furthermore, in the retracted position, the lighted frame assembly 500 is sufficiently compact to be used as a mini-flashlight. In the retracted position, the modules 524 generally form a double-module LED flashlight, as shown in FIG. 17B.

The illustrated lighted eyeglasses 500 include the light modules 518 mounted to each of the temples 502. The LEDs 524 are configured to provide illumination forwardly of the eyeglasses 500 within the field of view of a wearer. To this end, the light module 518 or the LEDs 524 may be canted inwardly and/or downwardly, such as about 5 degrees, to provide a light beam that is more focused into a wearer's field-of-view. Canting the LEDs in their respective housings can be done as described in Applicant's U.S. Pat. No. 6,612,696, which is incorporated as if reproduced in its entirety herein. Further, the light beam is provided more directly in the wearer's field of view by being angled inwardly and downwardly relative to the frame temples 502. If the light modules 518 or LEDs 524 are canted in such a manner, it should not be necessary to manually pivot or cant the light to direct the illumination.

More specifically, the light module 518 has the LED 524 protruding therefrom for emanating light therefrom. The modules 518 are mounted to each of the temples 502. The module 518 preferably houses the components needed to illuminate the LEDs 524. For instance, the module 518 has a switch that includes an actuator portion 517 that projects through an elongated slot 519. The actuator portion 517 is designed such that a user's thumb or finger can quickly and easily engage the actuator portion 517 to push or pull the switch for sliding in either one of two directions to turn the light module 518 on and off. The elongated slot 119 is sized such that the switch actuator can be moved only a preset distance, thereby enabling the on and off functions to be accomplished with a minimum of motion. When the switch is moved to the "on" position, batteries that are internally housed in the light module 518 energize the LED 524. Similarly, when the switch is moved to the "off" position, the connection between the batteries and the LED 524 is broken and the LED 524 is turned off. In an exemplary form, the module 518 may be similar to the light modules illustrated and described in the previously incorporated '696 patent. As illustrated, the modules 518 may be integrally formed with the temples 502, but the modules 518 may also be separately mounted to the temples 502 with fasteners or the like as in the '696 patent.

As mentioned above, the eyeglass frame 500 includes both retracted and extended states. In this regard, each of the temples 502 may include interconnected segments or members 502a and 502b that can slide relative to each other so that the temple 502 may be shifted between a retracted position (FIGS. 14B and 15B) and an extended position (FIGS. 14A and 15A). Similarly, the cross-frame member

504 also preferably includes interconnected segments or members 504a, 504b, 504c, and 504d that retract and extend in a similar manner (FIGS. 16 and 17). The segments of the temples and cross frame member can also telescope to extend and retract with one of the segments having a tubular or c-shaped structure so that the connected segments can slide in and out therefrom. While the cross-frame member 504 and temple 502 are illustrated with specific number of segments, more or less segments may also be used depending on the size and strength of the frames desired.

More specifically, in the retracted condition of the temples 502, the temple segment 502b retracts or slides relative to temple segment 502a either into a temple receiving compartment in the module 518 or alongside the module 518 at an outer surface thereof so that at least a portion of each of the temple segments are superimposed over each other and overlap the module 518. As illustrated in FIG. 14B, in the retracted condition, the ear portion 506 extends beyond the module 518. However, the projecting ear portion 506 is much smaller than the fully extended temple arm 502. The extent to which the temple arm 502 projects beyond the module when the arm is retracted may vary depending on the size and angle of ear portion 506 as it is not uncommon for the configuration of the ear portion 506 to vary based on the comfort needs of the individual wearer. Alternatively, if the temples 502 do not have a specially contoured ear portion 506, but a straight temple portion, then substantially the entire temple 502 may overlap the module 518 when retracted. For example, as illustrated in FIG. 15B, if the temple portion 502 is generally straight, then the temple segments 502a and 502b may retract into a position such that each segment 502a and 502b substantially overlaps each other and the module 518 but for a small projecting end section 505 of the temple. In this configuration, substantially the entire temple 502 is protected from damage in the retracted state by the module 518 because the temple 502 is retracted into or alongside the module 518. The larger width size of the module 518 transverse to the length of the temple arm 502 protects the elongate, thin temple portion 502.

In the extended state of the temples 502, each of the segments 502a and 502b are extended outwardly from the module 518 so as to form traditional temples of common eyeglasses (FIGS. 14A, 15A, and 16). As illustrated in FIG. 15C, the temple segments 502a and 502b may include a releasable locking structure 508 therebetween such that the extended temple segments may be held in their extended and retracted positions. That is, the locking structure 508 may include, for example, a retaining sleeve member 508a through which the temple segments 502a and 502b extend, a boss or other protrusion 508b on an end of one of the temple segments and a corresponding detent or groove 508c on an adjacent end of the other temple segment that engage and register so that the protrusion 508b seats in the groove 508c upon the segments reaching a predetermined, extended position relative to each other to releasably hold the temple segments in the extended state. The locking structure 508 may also include stop members 508d on ends of each segment that interfere with the retaining member 508a to avoid having the temple arms separate from each other. In addition, the end 505 of the temple arm 502b may also include a detent 508c to engage the protrusion 508b when the temple arm 502b is retracted. Manifestly, the locations of the protrusions 508b and detent grooves 508c can be reversed, or a pair of protrusions 508b can be provided on one of the arm segments with a single groove 508c formed in the other arm segment.

Referring now to FIGS. 16, 17A, and 17B, as mentioned above, the cross-frame member 504 may also include a retracted and extended position. As illustrated in FIG. 16, the frame 500 is shown in the extended position resembling a traditional eyeglass frame. FIGS. 17A and 17B illustrate the cross-frame member 504 and temple arms 502 of the frame 500 in the retracted position with FIG. 17A showing the retracted temple arms 502 having arcuate ear portions 506 (FIG. 14B) and FIG. 17B showing the retracted, straight temple arms 502 (FIG. 15B).

To achieve the retracted position of the cross-frame member 504, a user slides the outer segments 504a and 504d of the cross-frame member 504 inwardly toward each other such that the temples 502 and the attached or integrated modules 518 are moved laterally toward each other. It can be appreciated that the cross-member frame 504 can be retracted with the temples 502 either in the retracted or in the extended positions. In order to retract and extend, the cross-frame member 504 also includes connected segments or members 504a, 504b, 504c, and 504d. A user slides the segments inwardly such that segment 504a and 504b overlap to retract one side of the frame 500 and the segments 504c and 504d overlap to retract the other side of the frame 500.

The cross-frame member 504 is extended in a reverse manner by sliding or extending the segments 504a and 504d outwardly. As with the temples 502, the cross-frame member 504 preferably includes a similar locking structure 508 so that the cross-frame member 504 can be releasably held in either the retracted or extended positions.

When both the cross-frame member 504 and each temple 502 are retracted, the frame 500 is significantly more compact than the traditional eyeglass frame as best shown in FIGS. 17A and 17B. Preferably, the fully retracted frame 500 is about as wide as the depth of two modules 518 and about as long as each module 518. As previously stated, a small section 505 of the ear portion 506 may extend beyond the modules 518 in the retracted state so that, if the temple arm is retracted into the light housing 518, the projecting section 505 allows the user to pull the temple arm out of the housing back to its extended position. In this compact state, the frame 500 is easily placed in a pocket, bag, or purse until hands-free lighting is needed. The frame 500 may be expanded to be used as hands free lighting as previously described or used in the compact condition as a compact hand-held flashlight. Moreover, in this compact state, the frame 500 is protected from damage as the frame does not have elongate members that are easily bent or broken. As previously described, when the frame 500 is in the retracted state, the cross-frame member 504 and temple arms 502 are slid either into or alongside the light module 518. Therefore, in this state, the larger module 518 protects the more narrow frame portions 502 and 504 from being damaged when in a pocket or purse, for instance.

The eyeglass frame 500 may also include lenses similar to traditional glasses. For example, the frame 500 may include reading lenses, prescription lenses, protective or safety lenses, magnifying lenses, clear or non-refractive lenses, or the like. If included, the lenses would generally depend from the cross-member frame 504 or the cross-frame member 504 could also include portions that encircle the lenses. The lenses may have a pivot connection to the frame where the cross-frame member 504 and the temple arms 502 are pivotally connected. In this manner, the edge of the lenses opposite the pivot connection (i.e., near the bridge) may pivot inwardly from the cross-frame member 504 to the temple arms 502 to facilitate the retraction of the cross-frame member 504. On the other hand, a top edge of the lenses may be pivotally mounted to the cross-frame member 504 so that when the frame is in a retracted condition, the lenses may be pivoted up to the retracted frame structure. In such configurations, the frame 500, even with optional lenses, may be retracted into a compact form. Alternatively, the eyeglass frame 500 may be devoid of such lenses so that the frame 500 is configured simply to provide a form of headgear that provides for hands-free lighting.

Figure 23:
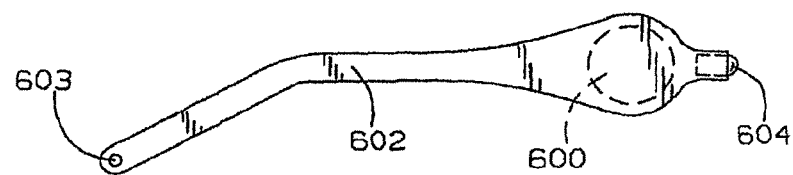
Figure 24:
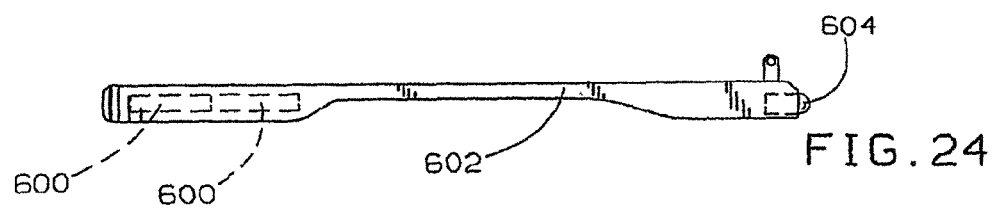
Figure 25:
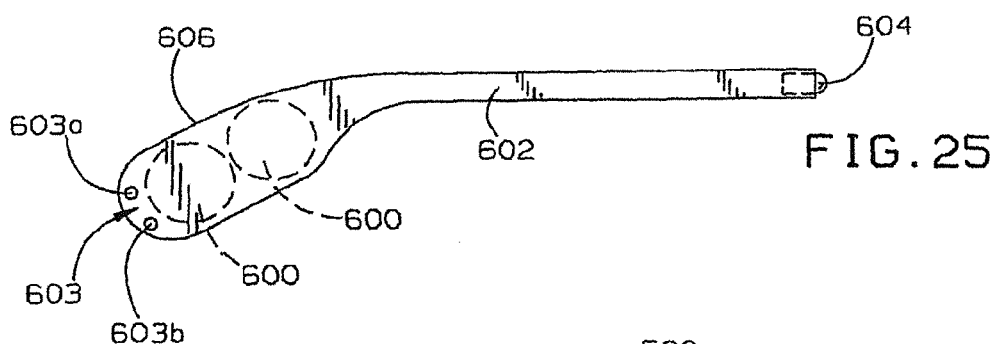

Referring to FIGS. 18-25, various alternative temple portions 602 are illustrated for the frame assembly 500. Herein, these alternative temple portions generally do not retract, but have different configurations and can include rechargeable batteries 600 and recharging contacts 603. As shown, the recharging contacts 603 include a positive contact 603a and a negative contact 603b, which may be in separate temple portions 602 (FIG. 26) or both in the same temple portion 602 (FIG. 25). The charging contacts 603 are for being electrically connected to corresponding contacts 654 of a separate battery charger.

The temple portions 602 include a light source 604, preferably an LED, housed within an opening or hollowed portion of the temple frame 610 and which protrude axially outward from the forward end 602a of the temple frame such that a light beam would be directed forwardly of the wearer, as previously described. The lights 604 may also be angled or canted inwardly or downwardly to provide a light beam more directly in the wearer's field of view. For example, the LED may tilt down about 5 degrees. The alternative temples 602 illustrated in FIGS. 18-25 generally can provide a more compact illumination device when worn than previously described with the light module 518 because the components to energize the light 604 are contained or integrated into the temple portions 602 rather than being within a separate module 518.

Figure 18:
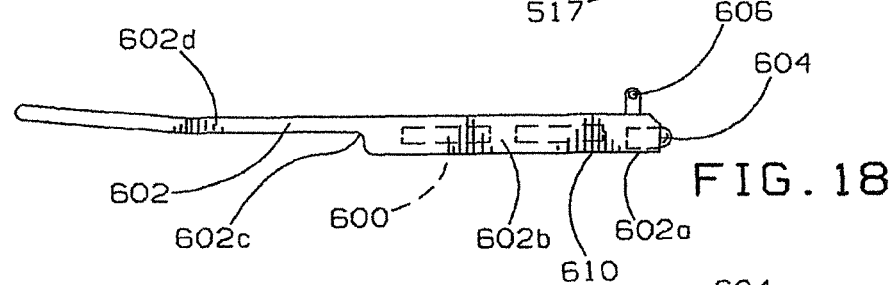
FIGS. 18-25 are plan and side elevational views of alternative temple portions for lighted eyeglass frames having integrated power sources and LEDs.
Figure 19:
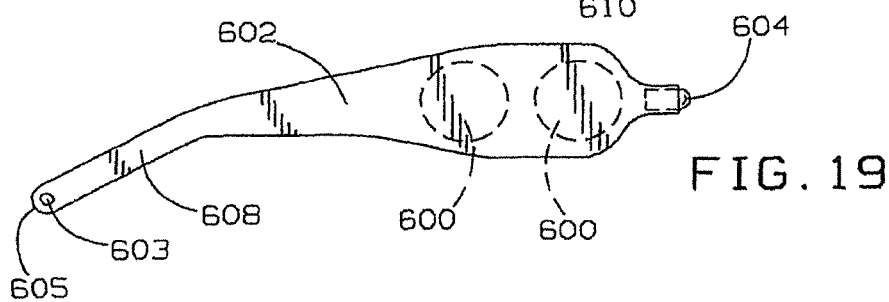
Figure 20:
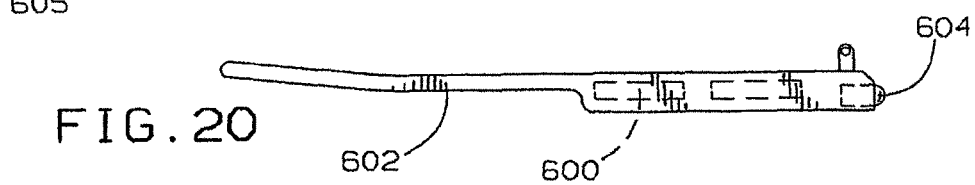
Figure 21:
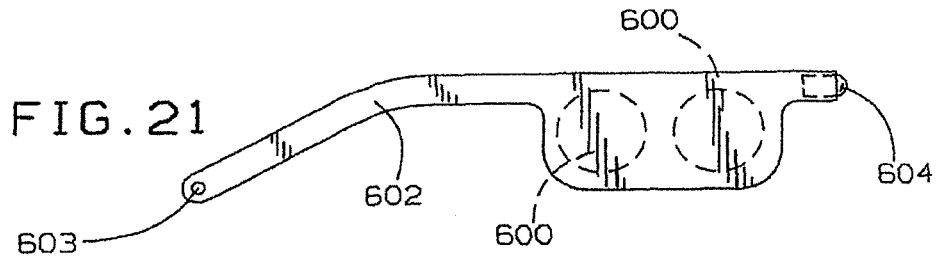

More specifically, FIGS. 18-19 illustrate two batteries 600 spaced longitudinally in the fore and aft direction that are housed internally in a forward portion 602b of the temple 602 adjacent pivot member 606. To contain the batteries, the forward portion 602b of the temple arm is enlarged in a direction transverse to its length and to the cross-frame member 504 with the lighted frames in their unfolded configuration for use. The forward portion 602b has a tapered configuration along its length. Also, the forward portion 602b is thicker than the narrower remainder or rear portion 602d of the temple arm with a shoulder 602c provided therebetween. The batteries 600 are in electrical communication with the recharging contact 603 at a distal end 605 of an ear portion 608 of the temple arm 602. As will be further described below, the recharging contacts 603 cooperate with contacts 654 of a separate battery charging module or unit 650. FIGS. 20 and 21 illustrate a similar battery arrangement, but show a temple 602 having a modified contour to house the longitudinally spaced batteries 600. Rather than a smooth taper, the forward portion of the arm has a rectangular configuration for receiving the batteries 600 therein.

Figure 22:
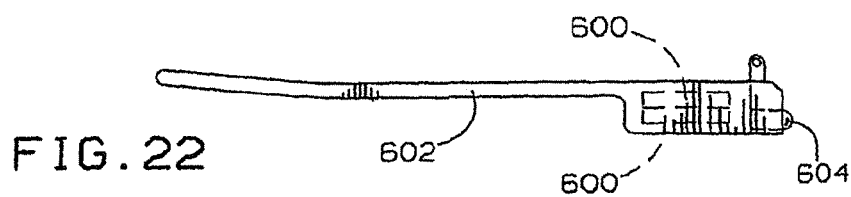

FIGS. 22 and 23 illustrate an overlapping battery configuration where the batteries 600 are stacked in a side-by-side arrangement. In this arrangement, the temple frame or housing 610 need not be as long in the longitudinal direction as with the previous temple arms, but is wider or thicker in the lateral direction transverse to the fore and aft longitudinal direction to accommodate the stacked batteries 600.

FIGS. 24 and 25 illustrate another modified temple 602 that houses the batteries 600 within the rear ear portion 606, preferably in a longitudinally spaced arrangement to keep the width or thickness of the ear portion to a minimum. In this embodiment, the batteries 600 are closely positioned to the recharging contacts 603 to keep the length of the electrical connections therebetween to a minimum. Herein, the positive charging contact 603a and negative charging contact 603b are both disposed at the distal end 605 of the same temple portion 602. Such combined configuration allows a more compact battery charger because only one temple 602 is required to connect to the battery charger.

Figure 26:
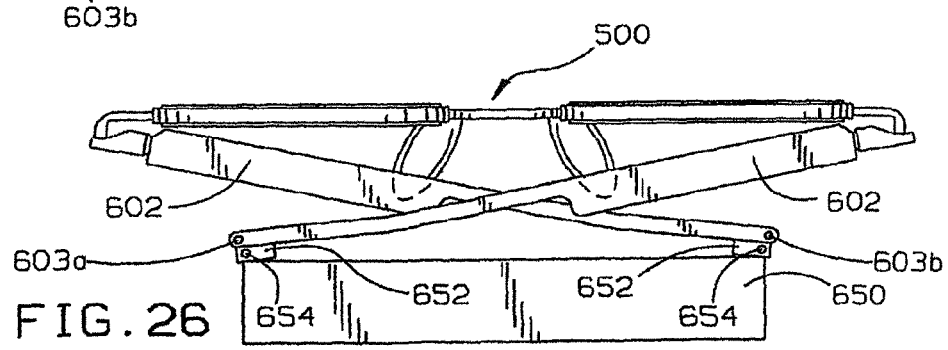
FIG. 26 is a plan view of the lighted eyeglass frames and a battery charger for recharging the integrated power source of the temple arms.

Referring to FIG. 26, the eyeglass frame 500 is illustrated with the modified temple portions 602 being connected to a stand-alone battery charger 650 with the positive contact 603a and negative contact 603b shown in separate temple arms 602. To charge the batteries 600 in the battery charger 650, the temple arms 602 are preferably pivoted inwardly toward the cross-frame member to fold the frame 500 into a retracted condition, the distal ends 605 of each temple arm 602 are then connected to a receiving base member 652, which may be included on a stand alone charger. Alternatively, the receiving base member 652 may be integrated within an eyeglass frame case. The battery charger 650 is plugged into a 110 volt wall outlet. The base member 652 has recharging contacts 654 that correspond with the recharging contacts 603 on the eyeglass frame temples 602, but have an opposite polarity. Therefore, when inserted in the battery charger 650, the batteries 600 are in electrical communication with a power source such that the batteries 600 may charged. Alternatively, the battery charger 650 may be configured to accept the eyeglass frame 500 with the temple arms 602 in an unfolded position, or may have a more compact configuration as previously mentioned, such as when only one temple arm 602 has both charging contacts 603a and 603b thereon.

Figure 27:
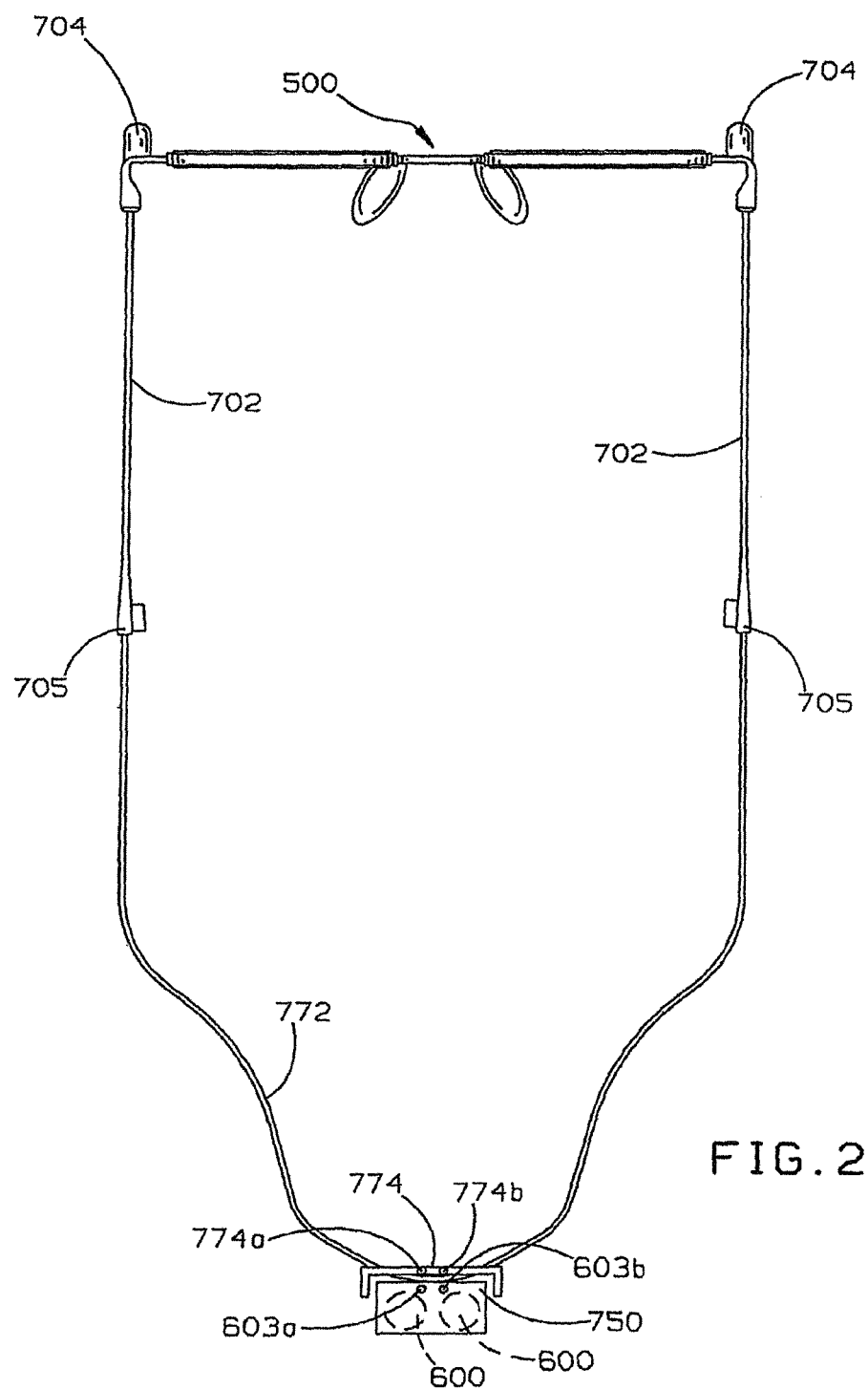
FIG. 27 is a plan view of alternative lighted eyeglass frames showing a power module carried on a lanyard for the frames.

Referring to FIG. 27, a modified placement of the rechargeable batteries 600 is illustrated on an alternative frame 500. In this embodiment, a power module or battery pack 750 is connected or attached to a lanyard 772 that is joined to the distal ends 705 of more traditional temple arms 702 (i.e., without included batteries). The lanyard 772 is a flexible member that joins each distal end 705 of the temple arms 702 and also functions a retaining member to hold the frames 500 around a wearer's neck when not in use. Generally, the lanyard 772 will be draped about the wearer's neck and upper back. The alternative frame 500 in FIG. 27 also includes lights 704, either in the frame as shown or in a separate module, that are in electrical communication with the battery pack 750 through the lanyard 772 and temple arms 702. In this regard, the temple arms 702 and lanyard 772 can have a hollow configuration to allow for electrical leads to be run through each.

The battery pack or module 750 houses the rechargeable batteries 600 and releasably mounts into a receiving port 774 attached to the lanyard 772. Generally, the port 774 may be centrally located between the ends of each temple portion 705 on the lanyard 772 because such an intermediate position along the length of the lanyard 772 provides balance to the lanyard 772 when worn. Therefore, in such central location, the pack or module 750 would comfortably rest on the back of a wearer as the lanyard 772 hangs down onto the shoulders and back during use. However, other locations on the lanyard are also acceptable. The receiving port 774 includes contacts 774a and 774b that, when the battery pack or module 750 is snugly and captively received in the port 774, are in electrical communication with the contacts 603a and 603b on the battery pack or module 750 to provided electrical power from the batteries to the lights 704.

To recharge the batteries 600, the pack or module 750 may be removed from the port 774 and plugged into a separate battery charger or power source (not shown). In this regard, the positive and negative contacts 603*a* and 603*b* mate with similar contacts in the battery charger. Alternatively, the batteries 600 of the pack or module 750 may be charged while still mounted to the port 774 such as by the provision of separate recharging contacts (not shown).

Housing the batteries 600 in the pack or module 750 that is electrically joined to the frame 500 through the lanyard 772 is advantageous in that the batteries 600 are contained in a separate member, such as the power module 750, that does not affect the contour of the temple arms 702. Accordingly, the temple arm 702 may be a more traditional, straight temple portion rather than the temple arms 602 contoured to contact the batteries 600 as shown in FIGS. 18-25 as generally only the electrical wiring is included therein.

Figure 28:
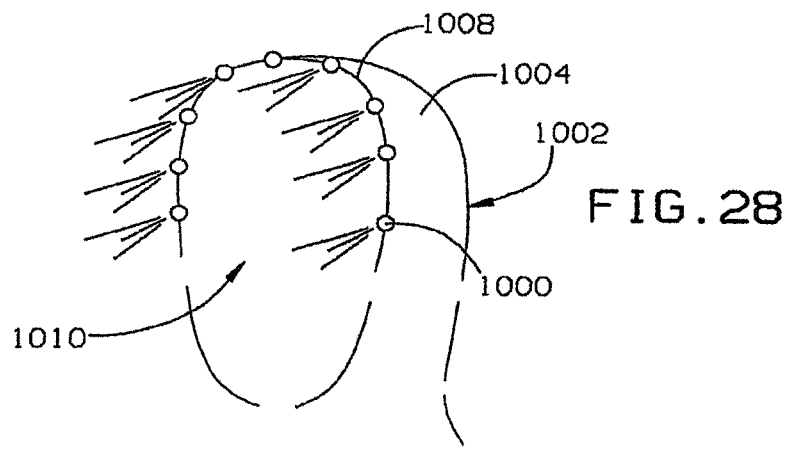
FIG. 28 is a perspective view of lighted clothing showing a hood having LEDs spaced thereabout.
Figure 29:
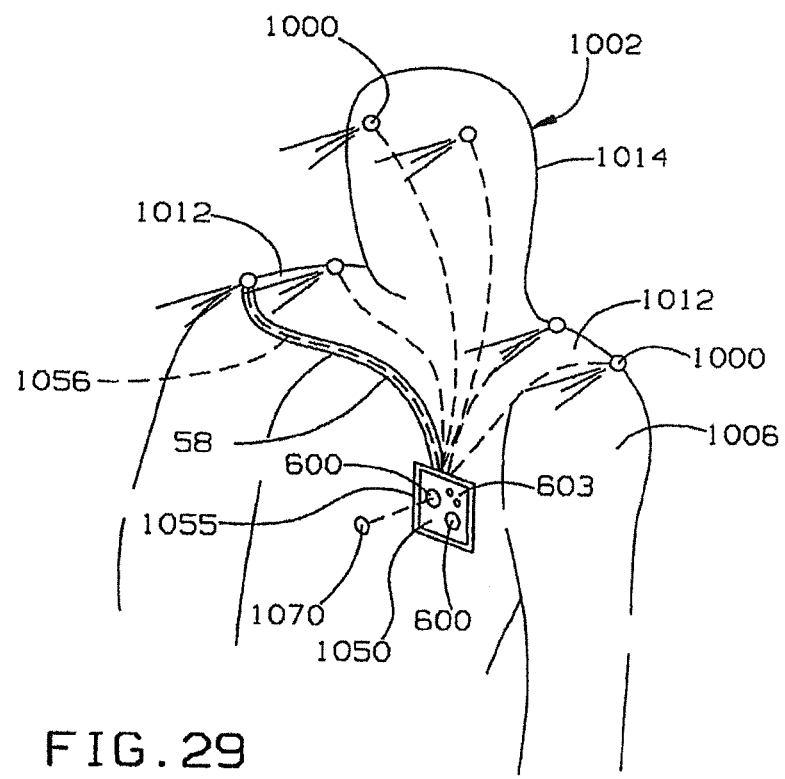
FIG. 29 is a perspective view of alternative lighted clothing showing a jacket having LEDs along a visor and shoulders thereof.

Referring to FIGS. 28-29, another example of hands-free lighting is illustrated, which is lighted clothing items. In this embodiment, the light source 1000 is preferably light-concentrating LEDs 25 that are included on an item of clothing 1002, which may be a hood 1004 (FIG. 28) or a jacket, shirt, coat, or other clothing item 1006 (FIG. 29).

For example, as shown in FIG. 28, the lights 1000 are located on a peripheral edge 1008 about a forward-facing hood opening 1010 such as included on a typical, hooded sweatshirt. Therefore, when a wearer places the hood 1004 over their head, the lights 1000 would be oriented forwardly to provide lighting in the wearer's field of view similar to the other embodiments.

Alternatively, as shown in FIG. 29, the lights 1000 could be included on the shoulders 1012 and/or a hood 1014 of the jacket or other clothing 1006. The lights 1000 are also preferably oriented forwardly to provide light in front of the wearer, but may also be oriented in other directions to provide lighting to the side or rear of the wearer. While the lights 1000 are illustrated on the hood 1014 and shoulders 1012 of the jacket, the lights 1000 may also be disposed at other locations, such as on the arms, or other clothing panels. In addition, the lights 1000 may also be included with buttons, zippers, flaps, pockets, seams, or the like on the jacket 1006.

The jacket 1006 is illustrated with a removable power module or battery pack 1050 that mounts into an appropriate electrical junction or port 1055 sewn into a portion of the jacket 1006, such as the rear portion that covers a wearer's back. The port 1055 is in electrical communication with the lights 1000 via appropriate wiring 1056, which may also include the moisture barrier 58 described previously with the hats 10 and 100. In a preferred form, the wiring 1056 is sewn or embedded within the material of the jacket 1006 so as not to alter the appearance or comfort of the jacket 1006. The pack 1050 is preferably removable for charging and so that the jacket 1006 may be more easily washed. Accordingly, the lights 1000, wiring 1056, or other electrical components that remain on the jacket 1006 may also be sealed in appropriate water-tight housings, fixtures, members, layers, or other water/moisture barriers so that any wash water or other moisture that may contact the jacket 1006 does not disrupt the electrical operation of the jacket 1006.

The battery pack 1050 preferably includes one or more of the rechargeable batteries 600 and the recharging contact 603 so that the pack 1050 may be connected to a separate battery charger (not shown) to power-up the batteries 600. Alternatively, the jacket 1006 may include a power port 1070 such that solar power assembly 50, the wind based electrical generator 350, or kinetic power source 450 may be plugged therein so that the jacket 1006 may recharge the batteries or energize the lights 1000 therefrom as previously described with the hats 10 and 100.

Referring to FIGS. 30 through 48, additional hands-free lighting devices are illustrated that are also embodied in lighted hats. In general, the lighted hats described in these figures include a variety of different illumination sources, which are preferably LEDs, mounted to various locations on the hat. To energize these illumination sources, a variety of different power assemblies may be employed. For instance, a power module housing individual batteries may be mounted to a rear portion of the crown or the hat may have batteries embedded therewithin, such as within a brim or crown. Alternatively, the power source may be any of the removable power modules previously illustrated and described. While the headgear disclosed in FIGS. 30 through 48 is illustrated as baseball-type caps, the hands-free lighting concepts disclosed with regard to these embodiments may also be mounted to any suitable headgear, such as visors, helmets, caps, hats, headbands, hoods, or the like.

More specifically, referring to FIGS. 30-37, an exemplary lighted hat 2010 is illustrated embodying multi-directional illumination. The hat 2010 is illustrated as a baseball-type cap 2012 having a crown 2014 and a brim 2016 projecting forwardly from a lower, forward edge portion of the crown 2014. In this embodiment, the hat 2010 is designed to generally provide illumination in all directions away from the hat because the hat 2010 has illumination sources oriented in multiple directions. In this manner, the hat 2010 provides illumination forwardly of the hat wearer to provide directed light in the wearer's field of view and also provides general outward illumination in the other directions. The hat 2010, therefore, would also create attention directed towards the wearer so that they would be visible, particularly in poor lighting conditions, such as during evening jogging or bike riding.

The lighted hat 2010 provides illumination forwardly of the hat 2010 from a plurality of LEDs 2018 that extend outwardly from an outboard, arcuate edge 2020 of the brim 2016. The LEDs 2018 are constructed to provide a light beam so that the wearer may illuminate an area forwardly of the hat 2010 within the wearer's field of view without requiring the user's hands to hold a flashlight or other handheld lighting device. Accordingly, the LEDs 2018 may be canted or angled downward, as described above regarding the hat 100, to provide the light within the wearer's field of view. Optionally, the LEDs 2018 may also be formed from the light-concentrating LEDs 25 as illustrated in FIGS. 9 and 9A.

As illustrated in FIG. 31, the brim 2016 includes a shape-retentive arcuate brim member 2016*a*, which is preferably covered by a fabric material 2016*b* that is consistent with the material used for the crown 2014. The LEDs 2018 are preferably mounted into or on the shape-retentive brim member 2016*a* and extend through the covering fabric material 2016*b* along the edge 2020. As shown in the figures, the hat 2010 includes four spaced LEDs 2018*a*, 2018*b*, 2018*c*, and 2018*d* along the edge 2020; however, varying numbers of LEDs 2018 may also be used in the hat brim 2016 depending on the amount, direction, or intensity of illumination desired. The LEDs 2018 are in electrical communication with each other and a power source 2024. In one form, the electrical communication is through an electrical wire 2022, which is mounted on or in the brim member 2016*a* and also covered by the fabric material 2016*b*. The electrical wire 2022 extends along the brim member 2016 and, as further described below, electrically connects the LEDs 2018 to the power source 2024. Similar to the other embodiments described above, the electrical wire 2022 may be covered or encased with the moisture barrier 58.

The hat 2010 also provides illumination outwardly from the side and rear portions of the hat 2010 to provide general illumination in these directions. In this regard, the hat 2010 also includes a plurality of LEDs 2026 spaced along a lower edge portion 2028 of the hat crown 2014 (See FIGS. 30-32). The LEDs 2026 are circumferentially spaced along a lower annular surface of the hat crown 2014 so as to direct light out radially therefrom. Preferably, the LEDs 2026 are oriented to provide illumination outwardly to the sides and rear of the hat 2010, and as illustrated in this embodiment, the LEDs 2026 do not provide illumination forwardly of the hat 2010 because the brim mounted LEDs 2018 illuminate in this forward direction. In other words, as best shown in FIG. 31, the hat 2010 preferably includes the LEDs 2026 disposed circumferentially around the sides and rear of the crown lower portion 2028, but the hat 2010 does not include the LEDs 2026 around the portion 2028 that intersects the brim 2016.

Turning to more of the details, as best shown in FIG. 31, the crown 2014 has a first LED 2026a disposed on the crown lower portion 2028 at a first side thereof approximately at an intersection point 2030 between a side edge 2032a of the brim 2016 and the crown 2014. Intersection point 2030 is where the brim side edge 2032a is approximately tangential with the crown lower portion 2028. On an opposite, second side of the hat 2010, a second LED 2026b is also disposed on the crown portion 2028 at a second intersection point 2034 between an opposite side edge 2032b of the hat brim 2016 and the crown 2014. Similar to intersection point 2030, the intersection point 2034 is where the opposite brim side edge 2032b is approximately tangential with the crown lower portion 2028.

Between the first LED 2026a and the second LED 2026b, the crown 2014 also includes additional LEDs 2026 that are circumferentially spaced along the crown portion 2028 away from the hat brim 2016 and around the sides and rear of the crown 2014. For instance, between the first LED 2026a and the second LED 2026b, the hat 2010 has six additional spaced, crown LEDs 2026. However, it can be appreciated that the number of crown LEDs 2026 can vary depending on the direction, intensity, and amount of illumination desired. Optionally, the crown LEDs 2026 may also be spaced entirely around the crown 2014 (i.e., even disposed along the crown portion 2028 that intersects with the brim 2016).

As will be further described below, the crown LEDs 2026 are in electrical communication with the power source 2024. The crown LEDs 2026 may also be in electrical communication with the brim LEDs 2018 so that both the brim LEDs 2018 and the crown LEDs 2026 may be energized at the same time with a single on-off switch to the power source 2024. Alternatively, the brim LEDs 2018 and the crown LEDs 2026 may be in separate electrical communication with the power source 2024 so that the brim LEDs 2018 and the crown LEDs 2026 may be energized either separately or together depending on how the power source 2024 is configured, such as with a single, two-position on-off switch or with two individual on-off switches.

The brim LEDs 2018 and/or the crown LEDs 2026 may also be energized by a controller that varies the illumination of the LEDs. For instance, the controller may illuminate the LEDs 2018 and/or 2026 in varying patterns, colors, frequencies, rates, or intensities. If desired, the LEDs 2018 and 2026 may also consecutively illuminate, flash or blink in patterns or random settings, or simply continuously illuminate depending on the setting of the controller or the power source 2024.

Referring to FIGS. 33-35, the arrangement of the crown LEDs 2026 in the crown 2014 is shown in more detail. In this embodiment, the crown LEDs 2026 are housed within the crown 2014 and protrude through holes or other apertures 2062 in the crown 2014. More specifically, the crown 2014 is formed from a material, preferably a fabric material, that includes an outer surface 2050 forming the dome of the crown 2014 and an inner head-band portion 2052 that circumscribes a lower, inner portion of the crown dome. In between the outer surface 2050 and the head-band portion 2052 is a space 2054. The head-band portion 2052 can be formed by folding a lower portion of the crown outer surface 2050 inwardly to the inside cavity of the crown 2014.

In the illustrated embodiment, within the space 2054 is positioned an elongate, flexible printed circuit board (FPCB) 2060 that provides the electrical communication between the crown LEDs 2026 and the power source 2024. The FPCB 2060 may be formed from about 0.5 to about 5 mil thick film or include multiple layers of such films. The FPCB 2060 should have sufficient flexibility to bend or curve around the outside diameter of a typical baseball-style cap. That is, the FPCB 2060 should be capable of forming a circle having a diameter of between about 6 to about 14 inches; however, greater or less flexibility may also be acceptable depending on the particular design of the hat 2010 or other headgear.

Disposed on the circuit board 2060 at predetermined positions along a length thereof are the crown LEDs 2026. The predetermined positions allow the LEDs 2026 to protrude through the crown holes 2062 when the circuit board 2060 is flexibly inserted within the space 2054. Therefore, a linear space between consecutive LEDs 2026 on the FPCB 2060 is approximately the same as a circumferential space between consecutive holes 2062 in the hat crown 2014. As shown in FIGS. 34 and 35, the crown LEDs 2026 are joined to the circuit board 2060 using through-hole technology; however, it is also acceptable to use surface-mount technology or other mounting methods to join the LEDs 2026 to the circuit board 2060.

As stated above, the crown 2014 is preferably formed from a fabric material; therefore, the holes 2062, which provide an opening through the outer material 2050 into the space 2054, may damage the material surrounding the hole 2062. As a result, the holes 2062 preferably include a protective member 2064, such as a grommet, washer, heavy stitching, gusset, or the like, surrounding the hole 2062 to minimize damage to the material of the crown. The protective member 2064 provides a more rigid edge to define the hole 2064, which minimizes damage to or stretching of the hole 2064. However, it can be appreciated by one skilled in the art, that if the crown 2014 is formed from a more durable or rigid material, the protective member 2064 may not be needed to protect the crown 2014 from damage.

Figure 36:
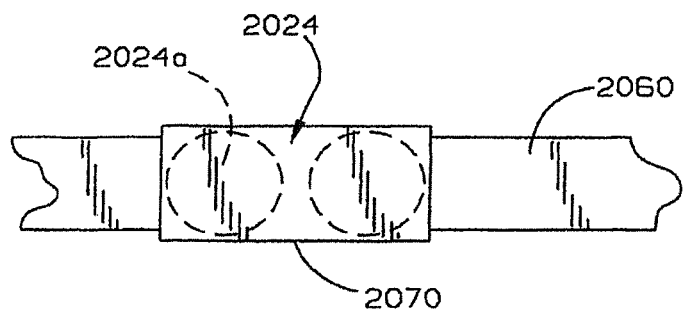
FIG. 36 is an elevational view of an exemplary power source contained within a module for energizing the LEDs of the lighted hat of FIG. 30.
Figure 37:
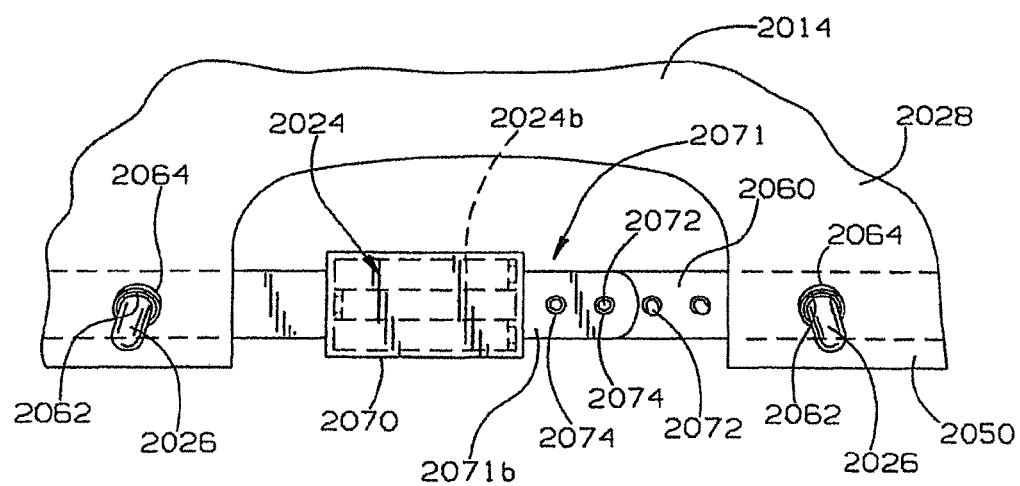
FIG. 37 is an elevational view of an alternative power source in a module mounted for energizing the LEDs of the lighted hat of FIG. 30, the module is shown mounted to a size adjustable hat strap.

Referring to FIG. 36, a module 2070 houses the power source 2024, which is preferably a battery 2024a, such as a coin-type battery. The module 2070 is mounted to a rear portion of the hat crown 2014 as illustrated in FIGS. 30 to 33; however, other locations may also be used. As described above, the power source 2024 is in electrical communication with both the brim LEDs 2018 and the crown LEDs 2026. The module 2070 may be similar to the modules described in Applicant's U.S. Pat. No. 6,659,618, which is incorporated by reference as if reproduced entirely herein. As illustrated in FIGS. 36 and 37, the power source 2024 within the module 2070 may be the coin-type batteries 2024a (FIG.

36) or may cylindrical-type batteries 2024b (FIG. 37), such as AA or AAA batteries. It will also be appreciated, that other battery types may be used in the module 2070 depending on the size and power requirements of LEDs. The module 2070 also preferably includes appropriate selector devices, switches, or other controls to energize either the LEDs 2018 and/or 2026. Furthermore, as stated previously, the power source 2024 may also be in communication any of the detachable power sources described above such as the solar power assembly 50, the wind-based generator 350, or the motion-based electrical generator 450.

In an alternative form, as shown in FIG. 37, the module 2070 is mounted to a two-part adjustable strap 2071 located in a rear portion of the hat 2010. The strap 2071 is used to adjust the diameter of the hat 2010 so that individuals with different head sizes may wear the same hat by only adjusting the diameter of the strap 2071. The strap 2071 includes a first part 2071a having spaced protrusions 2072 extending outwardly therefrom and a separate, second part 2071b having spaced apertures 2074 therealong that are sized and spaced to receive the protrusions 2072 therein with a friction fit when the second part 2071b overlaps the first part 2071a. Therefore, depending on the desired diameter of the hat 2010, more or less of the first and second parts 2071a and 2071b may overlap so that a predetermined number of the protrusions 2072 may be inserted into a predetermined number of the holes 2074 to select a particular hat diameter.

Optionally, the FPCB 60 may form a portion of or the entire two-part strap 2071. In this regard, the strap 2071 would include electrical connections or other conductive connecting members on each of the first part 2071a and the second part 2071b that mate with each other upon the overlap of the first and second parts 2071a and 2071b to ensure electrical continuity between the two parts when connected as described above. Therefore, when each part 2071a and 2071b of the strap 2071 is secured together, the two portions 2071a and 2071b of the strap are in electrical communication with each other to complete the electrical circuit between the power source 2024 and the LEDs 2018 and 2026.

Figure 38:
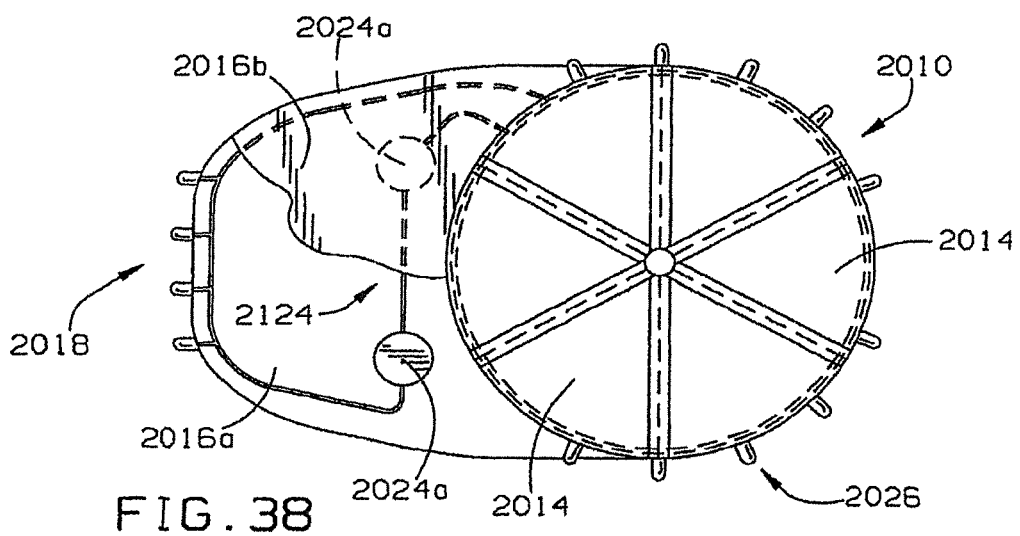
FIG. 38 is a plan view of an alternative lighted hat embodying features of the present invention showing LEDs in the hat brim and LEDs in the hat crown with a modified power source in the hat brim.

Referring to FIG. 38, the hat 2010 is illustrated with a modified power source 2124, which is located in the brim 2016. In this form, the modified power source 2124 is disposed on or in the shape-retentive arcuate brim member 2016a and covered by the fabric material 2016b. The modified power source 2124 includes two coin-type batteries 2024a, which are similar to the previously-described batteries 152, disposed on or in the brim member 2016a and covered by the fabric material 2016b; however, the power source 2124 may also include other types of batteries. Preferably, the batteries 2024a have a thickness similar to or less than a thickness of the brim 2016 so that the batteries 2024a may be contained or encompassed within the brim 2016, such as within a hole or other opening within the brim 2016, without significantly altering the outer appearance or original form of the hat 2010. In this manner, the covered batteries 2124 do not form easily visible projections that would otherwise distract from the appearance of the hat or minimize the comfort of wearing the hat.

Figure 39:
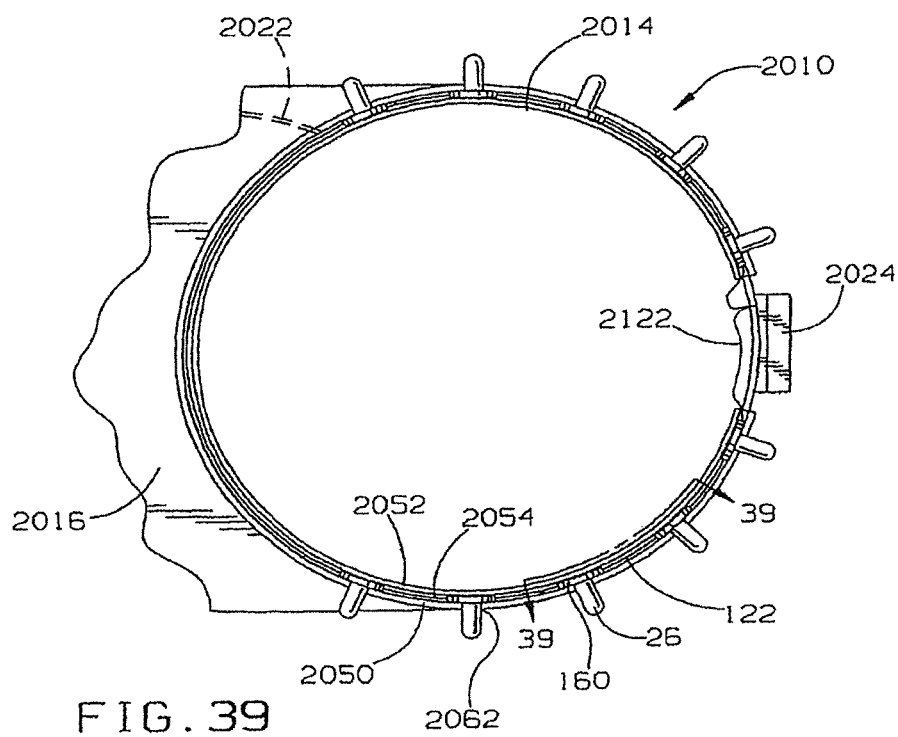
FIG. 39 is a cross-sectional view of the hat of FIG. 32 generally taken along the line 33-33 and showing LEDs protruding through the hat crown including a plurality of separate, modified circuit boards supporting the LEDs with electrical wiring therebetween.
Figure 40:
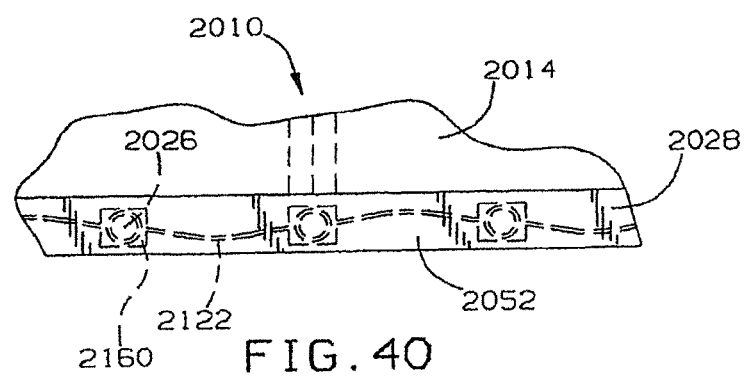
FIG. 40 is a partial elevational view of the hat of FIG. 39 generally taken along line 39-39 showing details of the modified circuit board.

Referring to FIGS. 39 and 40, a modified electrical communication system 2161 between the crown LEDs 2026 and the power source 2024 is illustrated. In this embodiment, each crown LED 2026 is mounted on a separate printed circuit board (SPCB) 2160 with electrical wiring 2122 extending therebetween. That is, the electrical wiring 2122 electrically connects each SPCB 2160 to another SPCB 2160 and also to the power source 2024. The crown LEDs 2026 may also be joined to the SPCB 2160 via through-hole technology, surface mount technology, or any other method to join electrical components to a circuit board. As illustrated in FIGS. 39 and 40, the SPCB 2160 include a small, generally square circuit board 2160a for mounting the LEDs 2026 thereon. The smaller size of the circuit board 2160a permits the SPCB 2160 to be of a more rigid construction due to the more limited surface area of the board 2160a. In this manner, the SPCB 2160 provide enhanced durability and strength.

The selection of the SPCBs 2160 with the associated wiring 2122 therebetween permits more flexibility in the design of the hat 2010. For instance, a single electrical communication system 2161 may be used with hats 2010 having different circumferential spacing between the crown LED holes 2062. For example, with the previously described FPCB 2060, the spacing of the LEDs 2026 on the circuit board is fixed and, therefore, needs to closely correspond with the circumferential spacing between the holes 2062 on the hat 2010. Each hat design with different circumferential spacing between the LEDs 2026, therefore, requires a different FPCB 2060 with a fixed LED spacing that corresponds with the appropriate hat.

On the other hand, with a sufficient length of the wire 2122 between each of the SPCBs 2160, the spacing between the LEDs 2026 may vary depending on the length of the wire 2122. As a result, the length of the wire 2122 does not necessarily need to correspond to the circumferential spacing between the crown holes 2062 because once inserted into the holes 2062, any extra wire 2122 may be buried, folded, or layered within the space 2054 (FIG. 39). In this manner, so long as a sufficient length of the wire 2122 is provided, the LEDs 2026 on the SPCBs 2160 may be used in a variety of headgear designs having different circumferential distances between the crown holes 2062. Similar to the wires 2022, the wire 2122 may also include the barrier 58 to reduce moisture penetration thereto.

Referring to FIGS. 41-45, another modified hat 2110 is illustrated. The hat 2110 is also shown as a typical baseball-style cap 2112, but may also be other types of headgear as described previously. The hat 2110 includes a modified crown 2114 together with the brim 2016 and power source 2024 as previously described. Because the brim of the hat 2110 is preferably the same brim 2016 of the hat 2010, it will not be described further with respect to this embodiment. Likewise, the power source 2024 is preferably the same as that on the hat 2010 and will also not be described further here. The description below, therefore, focuses on the differences in the modified crown 2114.

Figure 41:
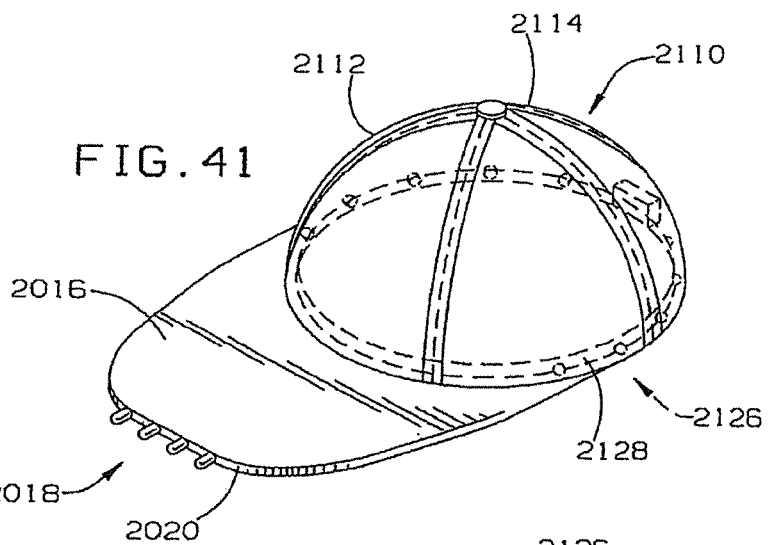
FIG. 41 is a perspective view of an alternative lighted hat embodying features of the present invention showing LEDs within the hat crown that emanate light through the crown material.
Figure 42:
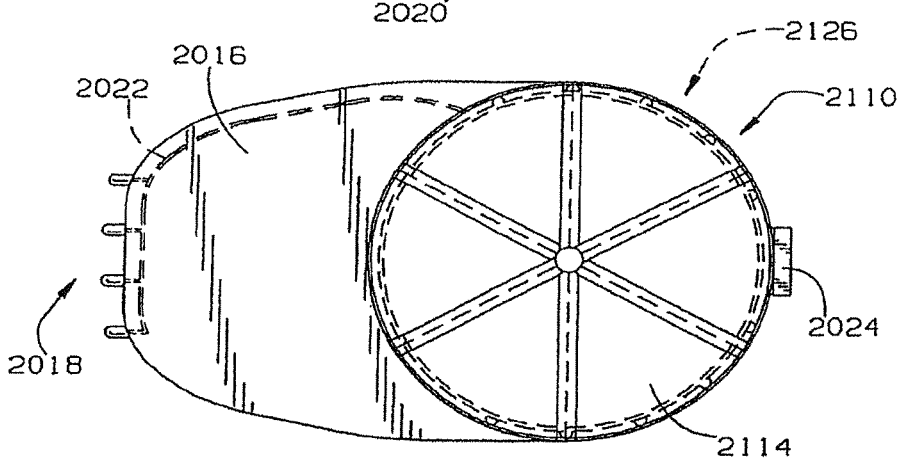
FIG. 42 is a plan view of the lighted hat of FIG. 41 showing electrical connections to the LEDs in the hat brim.
Figure 43:
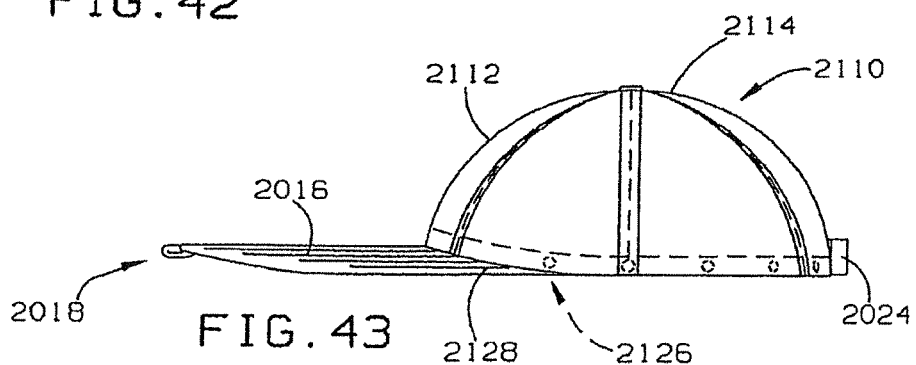
FIG. 43 is an elevational view of the lighted hat of FIG. 41.

As illustrated in FIGS. 41-43, the crown 2114 of the hat 2110 is also configured to provide illumination outwardly from the side and rear portions of the hat 2110. In this regard, the hat 2110 also includes a plurality of crown LEDs 2126 disposed along a lower, larger diameter portion 2128 of the crown 2114. However, instead of the crown LEDs 2126 protruding through holes in the crown material as in the hat 2010 illustrated in FIGS. 30-35, the crown LEDs 2126 in this embodiment are disposed internally of the crown 2114 and emanate light through the material that forms the crown 2114. In this regard, the crown 2114 is preferably formed from a fabric or other material having a predetermined transparency or translucency such that at least a portion of the light emanated from the crown LEDs 2126 may be transmitted through the material forming the crown 2114.

Similar to the hat 2010, the hat 2110 includes the plurality of crown LEDs 2126 spaced around the lower edge portion 2128 of the hat crown 2114 along the sides and rear portions of the hat 2110. However, as will be further described below, the hat 2110 includes the plurality of circumferentially spaced LEDs 2126 disposed internally of the crown 2114. Preferably, the LEDs 2126 are also oriented to provide illumination in outwardly directions to the side and rear portions of the hat 2110 but do not provide illumination forwardly of the hat 2110 because the brim LEDs 2018 focus light in this forward direction.

The positioning and spacing of the crown LEDs 2126 on the hat 2110 is similar to the positioning and spacing of the crown LEDs 2026 on hat 2010; as a result, the description above regarding the locations of the LEDs 2026 also applies to the hat 2110. It will also be appreciated that other configurations of the crown LEDs 2126 may be included on the hat 2110, such as LEDs emanating and directing light forwardly at the intersection between the crown 2114 and the brim 2016. Alternatively, as with the hat 2010, the location of the LEDs 2126 may vary depending on the amount and direction of illumination desired.

Figure 44:
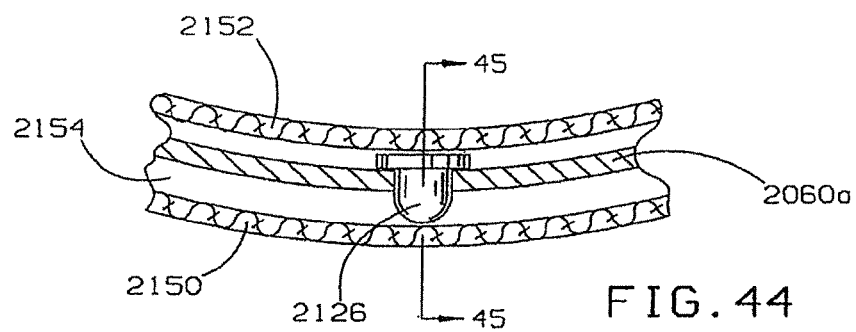
FIG. 44 is a partial, cross-sectional view of the lighted hat of FIG. 41 showing the LED within a space formed between an outer crown material and an inner headband.
Figure 45:
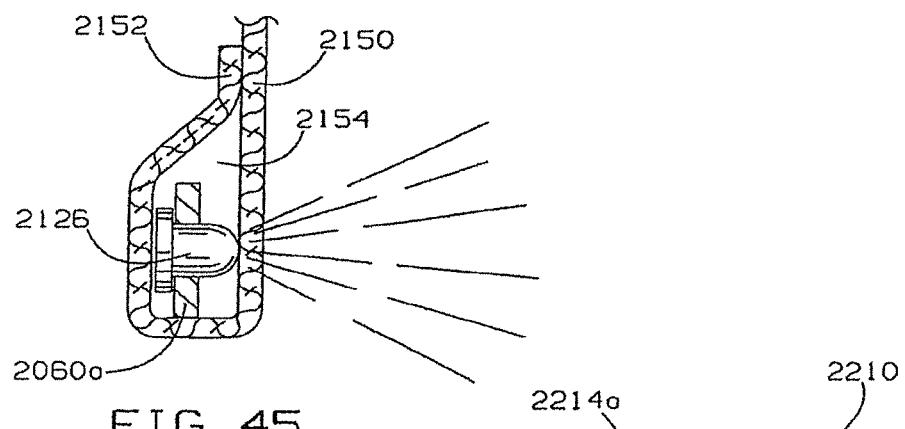
FIG. 45 is a partial, cross-sectional view of the lighted hat of FIG. 44 generally taken along lines 45-45 showing the LED within the space formed between the outer crown material and an inner headband with the light emanating through the crown material.

As shown in FIGS. 44 and 45, the LEDs 2126 are located within the hat 2110 and emanate light through the crown 2114. In this regard, the crown 2114 also includes an inner head-band portion 2152, an outer surface portion 2150, and a space 2154 therebetween similar to the construction of the hat 2010. Within the space 2154 is disposed a circuit board 2060a, which may either be the previously described flexible circuit board 2060 having the spaced LEDs 2126 thereon or the plurality of separate circuit boards 2160 each with a LED 2126 thereon.

The circuit board 2060a and LEDs 2126 are positioned within the space 2154 such that the LEDs 2126 are circumferentially spaced so that the LEDs 2126 provide light outwardly from the hat through the sides and rear portions of the crown 2114 (i.e., see FIG. 45 showing light being illuminated through the crown material). In this regard, if the circuit board 2060a is the plurality of separate circuit boards 2160, the annular space 2154 may also include a mounting member (not shown) to position each separate circuit board 2160 within the annular space 2154. The mounting member may be stitching, a pocket, ribs, or the like to hold each separate rigid circuit board 2160 in a predetermined position. On the other hand, if the circuit board 2060a is the flexible circuit board 2060, the circuit board itself is generally sufficient to maintain the LEDs 2126 in the spaced circumferential positions.

In this embodiment, it is preferred that the LED 2126 is a low-profile through-hole LED or a surface-mount LED. As described above, the LED 2126 is contained within the space 2154 of the hat 2110 rather than protruding through a hole in the crown 2114; therefore, the low profile or surface mount LED allows the radial thickness of the space 2154 to be kept to a minimum. In this manner, the LEDs 2126 are hidden within the hat 2110 and do not significantly alter the dimensions of the hat 2110. The LEDs 2126, therefore, do not significantly decrease the inner diameter of the hat, which may be uncomfortable for a wearer, or enlarge the outer diameter of the lower crown portion 2128, which may present bulges or other protrusions that may distract from the appearance of the hat 2110. In such arrangement, the LEDs 2126 provide the side and rear illumination similar to the LEDs 2026, but do not significantly alter the appearance of the hat 2110 from a typical baseball-style cap.

Figure 46:
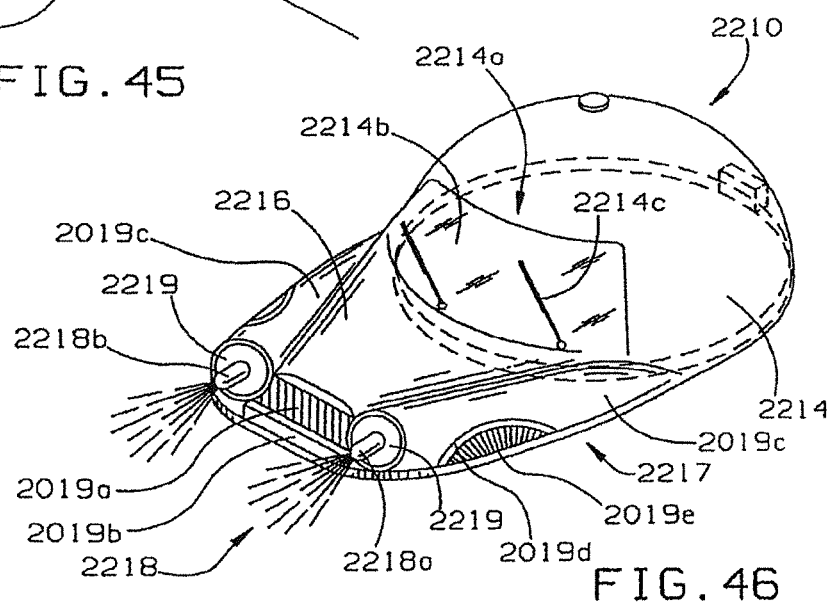
FIG. 46 is a perspective view of an alternative lighted hat embodying features of the present invention showing a hat brim configured to resemble a front portion of an vehicle.

Referring to FIG. 46, another modified lighted hat 2210 is illustrated embodying additional features of hands-free lighting. The hat 2210 is a modified baseball-type cap, but may also be other types of headgear. The hat 2210 includes a modified brim 2216 that is formed in the shape of or includes images of various decorative or recognizable forms that incorporate forward mounted brim LEDs 2218 as part of the decorative form. For instance, as shown in FIG. 46, the brim 2216 is formed to resemble or includes images of a front portion 2217a of a vehicle 2217, such as a car, truck, or the like, where the brim LEDs 2218 are positioned in a spaced arrangement on a forward surface of the brim 2216 to resemble the headlights 2219 of the vehicle front portion 2217a. That is, the brim 2216 has a LED 2218a and a LED 2218b that are generally positioned at corners of the brim 2216 to resemble the headlights 2219 of the vehicle front portion 2217a.

As illustrated, the brim 2216 may also include other features or images thereof from the vehicle, such as fenders, wheels, grills, bumpers, windshields, a hood, or doors, etc. as desired to form the vehicle front portion 2217a. That it, the brim 2216 includes a grill 2219a extending between the headlights 2219 and a bumper 2219b traversing the front edge of the brim 2216 below the grill 2219a. Spaced on opposite sides of the brim 2216 are fender flares 2219c that extend from a forward edge of the brim 2216 back towards the hat crown 2214. Each fender flare 2219c also includes a portion of a wheel well 2219d and a portion of a tire 2219e. On a forward portion 2214a of the hat crown 2214, the vehicle front portion 2217a also includes a windshield 2214b and windshield wipers 2214c.

Alternatively, the decorative shape may also be other vehicles or images thereof, such as motorcycles, trains, airplanes, or the like. Accordingly, each shape would include an appropriate number and placement of the brim LEDs 2218 to resemble the forward, side, or other lights of the vehicle. Therefore, for example, the hat 2210 may include only a single LED 2218 for a motorcycle headlight or multiple LEDs 2218 for the head lights and side markers on a car, truck, or airplane. Alternatively, the lighted hat 2210 may also include other mounted LEDs on either the brim 2216 or crown 2214 to resemble other lights, such as the lights of a police car, fire truck, or ambulance. It will be appreciated that the hat 2210 will also include appropriate electrical connections to energize the LEDs 2218, such as the previously described wiring, circuit boards, and power sources. Accordingly, the discussion above pertaining to the hat 2010 also applies to the hat 2210.

Figure 47:
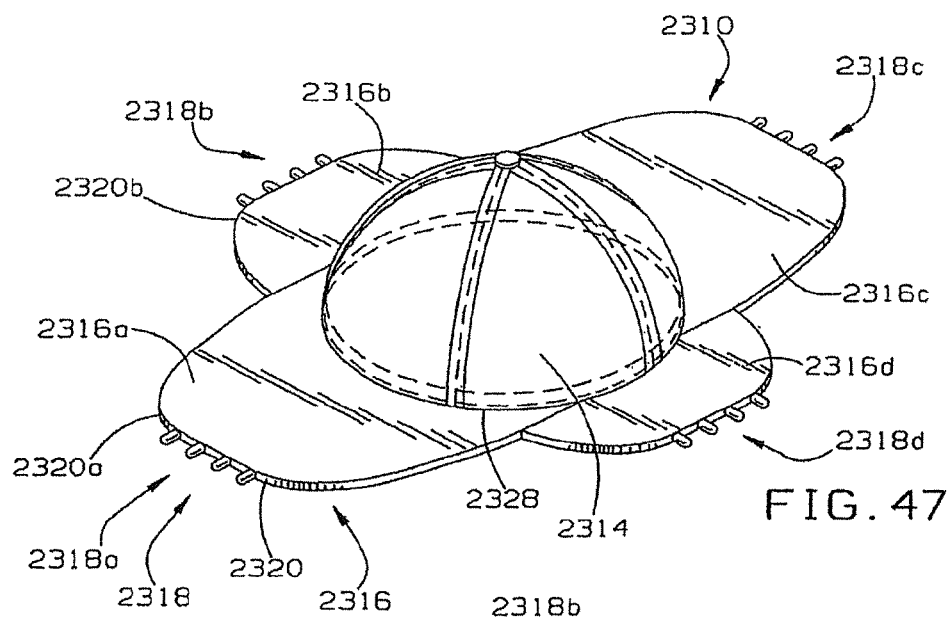
FIG. 47 is a perspective view of another lighted hat embodying features of the present invention showing a hat having multiple brims each with a plurality of LEDs thereon.
Figure 48:
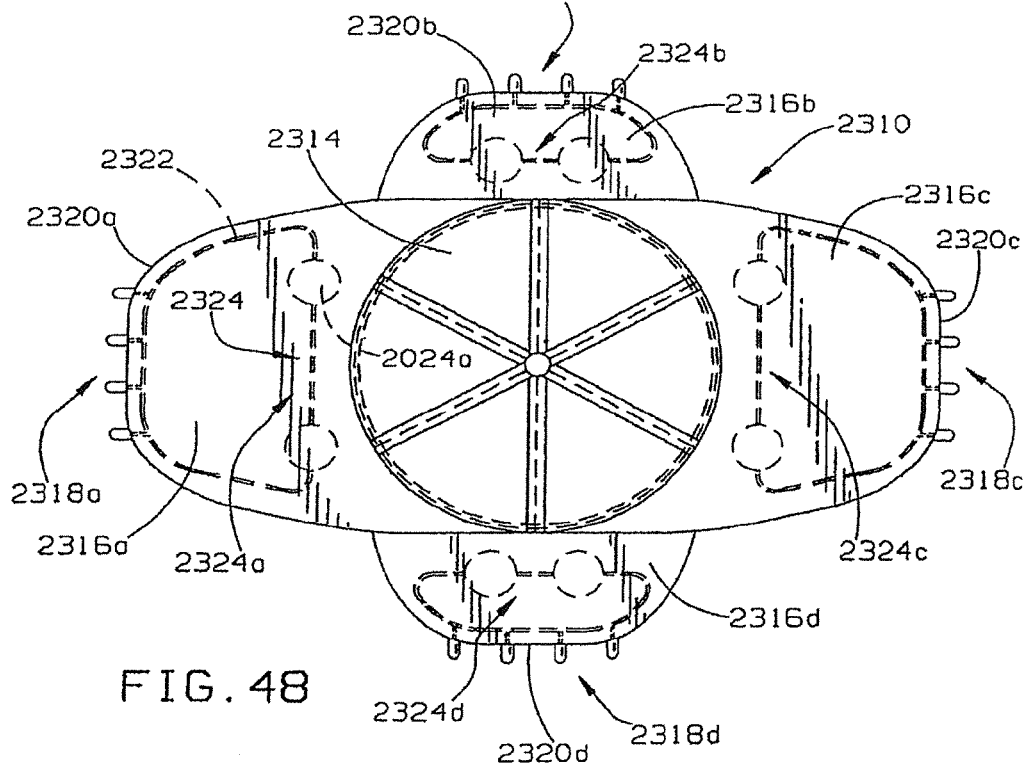
FIG. 48 is a plan view of the lighted hat of FIG. 47 showing an exemplary power source comprising two pairs of coin-type batteries disposed in the separate brims.

Referring to FIGS. 47 and 48, another modified lighted hat 2310 is illustrated embodying features of hands-free lighting. The hat 2310 is a modified baseball-type cap, but may also be other types of headgear. The hat 2310 includes a crown 2314 with multiple brims 2316 extending from different portions of the lower edges 2328 of the crown 2314 to project in different directions therefrom. The hat 2310, for example, includes four brims 2316a, 2316b, 2316c, and 2316d that each extends radially outwardly from a different edge portion of the crown lower edge 2328 in a different radial direction. That is, the brims 2316a and 2316c extend outwardly from opposing sides of the crown 2314 approximately 180 degrees apart (i.e., front and back). The brims 2316b and 2316d, on the other hand, also extend laterally outwardly from opposing sides of the crown 2314 approximately 180 degrees apart, but in a cross-direction from the brims 2316a and 2316c (i.e., approximately 90 degrees from the brims 2316a and 2316c or to the left and right sides, respectively). As illustrated, the brims 2316b and 2316d preferably have a brim length that is shorter than a brim length of the brims 2316a and 2316c. However, each of the brims 2316 may also have the same brim length or each may have a different brim length. Alternatively, each of the brims 2316 may have varying widths.

Each brim 2316 includes LEDs 2318 on a forward, outboard arcuate edge 2320 to provide illumination forwardly of the brim 2316. That is, the brim 2316a includes LEDs 2318a on an edge 2320a; the brim 2316b includes LEDs 2318b on an edge 2320b; the brim 2316c includes LEDs 2318c on an edge 2320c; and the brim 2316d includes LEDs 2318d on an edge 2320d. As shown, the LEDs 2318 include four separate LEDs; however, any number of LEDs may be included on each brim 2316. Alternatively, each brim 2316 may include a different number, color, intensity, or type of LED 2318. As with the other embodiments, some or all of the LEDs 2318 may also be canted to focus the light in a predetermined manner or be formed similar to the light concentrating LED 25 that is described above and shown in FIGS. 9 and 9A.

Referring to FIG. 48, the hat 2310 also includes a power source 2324, which is illustrated in this embodiment as four separate power sources 2324a, 2324b, 2324c, and 2324d that are each located in one of the brims 2316. That is, the power source 2324a is located in the brim 2316a, the power source 2324b is located in the brim 2316b, the power source 2324c is located in the brim 2316c, and the power source 2324d is located in the brim 2316d. Herein, the power source 2324 is shown as a pair of coin-type batteries 2024a disposed in or on the brims 2316 as previously described in the other embodiments; however, it will also be appreciated that other types, numbers, and locations of the power source 2324 may also be employed in the hat 310. That is, the hat 2310 may also include the module 2070, the solar power assembly 50, the wind-based generator 350, or the motion-based electrical generator 450 as described earlier.

To provide energy to the LEDs 2318, the hat 2310 may include various mechanisms to energize either some or all of the LEDs 2318. For instance, the hat 2310 may include an on/off switch for each brim 2316 so that a wearer can selectively energize the LEDs 2318 on each brim separate from the LEDs 2318 on another brim. Alternatively, the hat 2310 may include a single on/off switch with multiple positions to selectively energize the LEDs 2318 on each brim. On the other hand, the hat 2310 may also include a single on/off switch that energizes all the LEDs 2318 at the same time. Furthermore, as with the other embodiments, the hat 2310 may also include a controller to vary the illumination, intensity, rates, color, or other features of the LEDs 2318 to provide varying illumination or effects.

The hat 2310 also preferably includes wiring 2322 that provides electrical communication between the LEDs 2318 and the power sources 2324. As shown, the wiring 2322 may be in or on each of the brims 2316 and covered by a brim material as previously described. The wiring 2322 electrically connects each of the power sources 2324 to the LEDs 2318. As illustrated, each brim 2316 includes a separate power source 2324 to energize the LEDs 2318 thereon; therefore, each brim 2316 also includes a self-contained wiring 2322 to energize the LEDs 2318 located on that brim 2316. However, depending on the location and number of power sources 2324, the hat 2310 may also include wiring 2322 that interconnects the various brims 2316. For instance, the hat 2310 may also include wiring 2322 that extends through the crown 2314 or other portions of the hat as necessary to provide electrical communication between the included power source(s) 2324 and the LEDs 2318. As with the other embodiments, the wiring 2322 may also include the moisture barrier 58 to reduce moisture penetration thereto.

Referring to FIGS. 49-52, and an alternative LED assembly 3010 is illustrated that includes an LED 3012 and a covering 3014. The LED 3012 includes a lens 3016 and two spaced electrical leads 3018a and 3018b. The lens 3016 is formed from a molded plastic with a generally cylindrical portion 3016a and a dome portion 3016b extending about a distal end of the lens 3016. Within the cylindrical portion 3016a, the LED includes a diode, illumination chip, or other light source 3016c. The covering 3014 includes a first portion 3014a surrounding at least a portion of the lens 3016 and a second portion 3014b surrounding at least a portion of the leads 3018a and 3018b. With such configuration, the covering 3014 provides support to the LED leads and, preferably, modifies the light beam generated by the LED 3012.

More specifically, the first covering portion 3014a extends around a portion of the LED lens 3016, such as the lens cylindrical portion 3016a and therefore, allows the LED 3012 to function similar to the previously described light concentrating LED 25 (FIGS. 9 and 9A) to focus or minimize stray light emissions. That is, the covering 3014a extends around the cylindrical portion 3016a a predetermined axial length beyond the light chip 3016d in order to concentrate the light cone formed or minimize stray light emissions. Depending on the degree of light concentration desired, the covering portion 3014a may extend more or less axial length beyond the light chip 3016d. In one form, the covering portion 3014a generally extends about ³⁄₁₆ to about ¼ of an inch along the lens cylindrical portion 3016a.

The second covering portion 3014b extends around the LED leads 3018a and 3018b and provides support and strength thereto. Preferably, the second covering portion extends about ³⁄₁₆ to about ¼ of an inch along the leads; however, other lengths are suitable depending on the size of the covering and LED and the desired amount of support and strength needed on the LED. The second covering portion 3014b minimizes strain on the leads 3018a and 3018b, and particularly, minimizes strain at an interface 3020 between the leads 3018a, 3018b and the lens 3016. The second covering portion 3014b, therefore, renders it more difficult to bend, warp, or otherwise damage a single lead 3018a or 3018b at the interface 3020 because the second covering portion 3014b combines each lead 3018a and 3018b together in a more rigid cooperating assembly. The photovoltaic cell can be used to power other electrical devices which can include radios, MP3 players such as iPods, and telephones.

The covering 3014 is preferably a material that can be wrapped tightly around the LED 3012 as illustrated in FIGS. 50-52. For example, a preferred material for the covering 3014 is a tube of bi-axially oriented PVC that can be tightly wrapped around the LED portions by shrink wrapping the covering 3014 using heat. However, other materials capable of being tightly wrapped around the LED by shrink wrapping or other mechanisms using heat or other stimulus are also acceptable for the covering 3014.

Referring to FIGS. 53 and 54, a printed circuit board assembly (PCB) 4010 embodying low profile features is illustrated. The PCB 4010 includes a ribbon 4012 having a circuit 4014 printed thereon and a plurality of through holes or orifices 4016 to receive leads 4018 from a LED 4020 therethrough. However, instead of just a pair of holes as commonly found in printed circuit boards to receive two LED leads perpendicularly therethrough (i.e., perpendicular to the ribbon), the circuit board ribbon 4012 included two pairs of spaced through holes 4016a and 4016b such that each LED lead 4018 may be threaded through the ribbon 1012 similar to a pin being threaded through fabric. Such threaded configuration of the LED leads 4018 through the circuit board ribbon 4012 is advantageous because it minimizes the thickness of the circuit board providing a flatter profile thereto and also minimizes the stress on the LED leads at the attachment to the circuit board because more contact points are formed between the LED and the circuit board for greater support. In this threaded configuration, the leads 4018 preferably extended through the holes in a generally oblique angle to minimize stress on the LED leads.

With a lower profile, the printed circuit board 4010 is suitable for use with the brim of any of the lighted hats described herein. For instance, the printed circuit board 4010 may be disposed on a shape-retentive arcuate brim member (i.e., such as brim member 2016a of FIG. 38) using adhesive or other securing structure and then covered with a fabric covering (i.e., such as covering 2016b of FIG. 38). The low profile formed from the threaded LED minimizes any outward appearance of the circuit board 4010 being covered by the fabric covering so that the brim substantially retains the appearance of a typical fabric covered hat brim.

Referring more specifically to FIG. 54, a cross-section of the circuit board ribbon 4012 is illustrated to show the threaded configuration of the LED 4020 through the circuit board ribbon 4012. The pair of ribbon through holes 4016a includes a first hole 4022 and a second hole 4024 spaced therefrom and aligned so as to receive one of the LED leads 4018 in the threaded arrangement exemplified in FIG. 54. In this threaded configuration, as described in more detail below, the LED lead 4018 includes multiple portions located both above and below the circuit board ribbon 4012, which provides the improved support and durability as well as the more compact profile.

More specifically, the threaded configuration includes a first lead portion 4026 below the ribbon 4012, a portion 4028 received in the first hole 4022, a second lead portion 4030 above the ribbon 4012, another portion 4032 received in the second hole 4024, and a third lead portion 4034 below the ribbon 4012. Of course, the lead 4018 could also be threaded in a reverse configuration. As shown in FIG. 54, the threading of the lead portions 4028 and 4032 through the holes 4022 and 4024 is preferably via generally oblique angles or other smooth bends in the lead 4018 rather than more severe bending as generally required by traditional mountings of LEDs through a single pair of mounting holes. However, the threaded configuration may also be completed with other angles or bends as the lead 4018 extends through the holes 4022 and 4024. It will also be appreciated that the second pair of holes 4016b and the threading of the second LED lead 4018 will have a similar arrangement.

To secure the lead 4018 to the circuit board ribbon 4012, a length of solder 4036 extends along and beyond the upper lead portion 4030. This extended length of solder 4036 provides the greater strength and durability to the connection between the circuit board and LED. Traditional mountings of LED leads that only extend perpendicularly through a single pair of through holes normally employs a single spot of solder at each insertion point of the lead into the through hole that provides only a minimal amount of securement. By employing the extended length of solder 4036, which extends substantially along the entire lead portion 4030 as well as past each end of the lead portion 4030 onto the ribbon 4012, an improved securement to the circuit board is achieved.

Referring now to FIGS. 55-61 an alternative lighted hat 5010 is illustrated that preferably employs multiple illumination modes with both forward and rearward directed illumination. The hat 5010 includes a module 5070 having a controller therein that permits the hat 5010 to illumination in a variety of different illumination modes. As shown, the lighted hat 5010 is illustrated as a typical baseball-type cap 5012 having a crown 5014 and a brim 5016, but the hat 5010 may also be other types of headgear as previously described with the other hat embodiments.

In this form, the hat 5010 includes a plurality of LEDs 5024 that extend from an outboard, arcuate edge 5018 of the hat brim 5016 and a single LED 5025 that is mounted to the module 5070, which is preferably disposed on a rear portion of the hat crown 5014. As shown, the hat 5010 includes six spaced LEDs 5024 along the brim edge 5018; however, any number of LEDs 5024 is also acceptable depending on the light beam desired. The LEDs 5024 are preferably joined to the printed circuit board assembly 4010, as previously described, which is secured to a lower portion of the hat brim 5016 and covered with a fabric material. The circuit board 4010 and LEDs 5024 are joined in electrical communication with a power source 5026 (not shown) that is disposed in the module 5070. Similar to the other hats described herein, the power source 5026 may be coin type batteries, AAA or AA batteries, rechargeable batteries, or another suitable power source that provides sufficient power to energize the LEDS 5024 and 5024. Optionally, the hat 5010 may also employ the various power generators as previously described above (i.e., the wind, solar, and motion generators).

Referring to FIG. 58, an exemplary mounting of one of the LEDs 5024 in the hat brim 5016 is illustrated using the printed circuit board 4010. As with the other hats described herein, the brim 5016 is formed from a generally arcuate, shape-retentive member 5016a covered by a fabric material 4016b (FIG. 55). The circuit board 4010 having the LEDs 5024 thereon is secured to the shape-retentive member 5016a, preferably on the bottom surface thereof, by adhesive or other fasteners and then covered by the fabric material 4016b. To minimize the profile of the hat brim 5016, the brim defines notches 5030 that extend inwardly from the brim outboard edge 5018. The notches 5030 are sized to receive at least a portion of the LEDs 5024, such as the LED lens 5023. While only one notch 5030 is illustrated in FIG. 58, it will be appreciated that the brim preferably includes a notch 5030 to correspond with each of the LEDs 5024 disposed on the hat.

In this embodiment, the fabric material 5016b is formed from separate pieces of fabric sewn together as best shown in FIGS. 55 and 57. For instance, the upper and lower major surfaces of the shape-retentive brim material 5016a are covered by an upper cover material 5040 and a lower cover material 5042, which are preferably fabric or other suitable woven-type material. The brim outboard edge 5018 is covered by separate elongate strips of material (i.e., piping, fabric, or other woven material) 5044 that extends between the LEDs 5024 and overlaps with the upper cover material 5040 and the lower cover material 5042.

Referring to FIG. 55, the piping 5044 is preferably separate strips of material that extend between each of the LEDs 5024 rather than a single piece of material that includes holes cut therethrough for receipt of the LEDs. A single piece of piping material with holes for the LEDs may fray, have unsightly loose ends, or have strings of material hanging therefrom requiring grommets, stitching, or other protection around the hole for support. Separate piping, on the other hand, eliminates these problems and also present a pleasing appearance. In that regard, the piping 5040 is sewn to the upper and lower covering 5040 and 5042 along an outer edge thereof so that each separate strip of piping 5044 is snuggly wrapped around each LED 5024 as best illustrated in FIGS. 57 and 58. Therefore, the use of the protective grommet, washer, or stitching is avoided as the snuggly wrapped piping 5044 securely holds the LED 5024 within the brim notch 5030 and also presents a pleasing appearance at the same time.

Figure 60A:
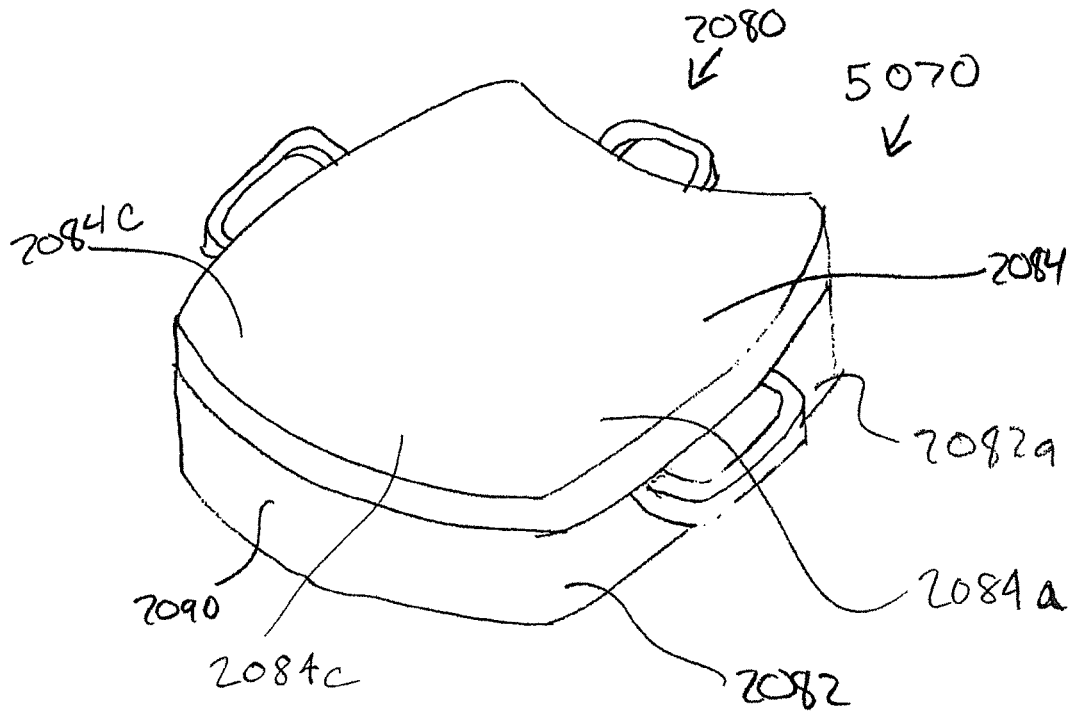
FIG. 60A is a perspective view of an alternative power source assembly for providing power to a lighted hat.
Figure 60C:
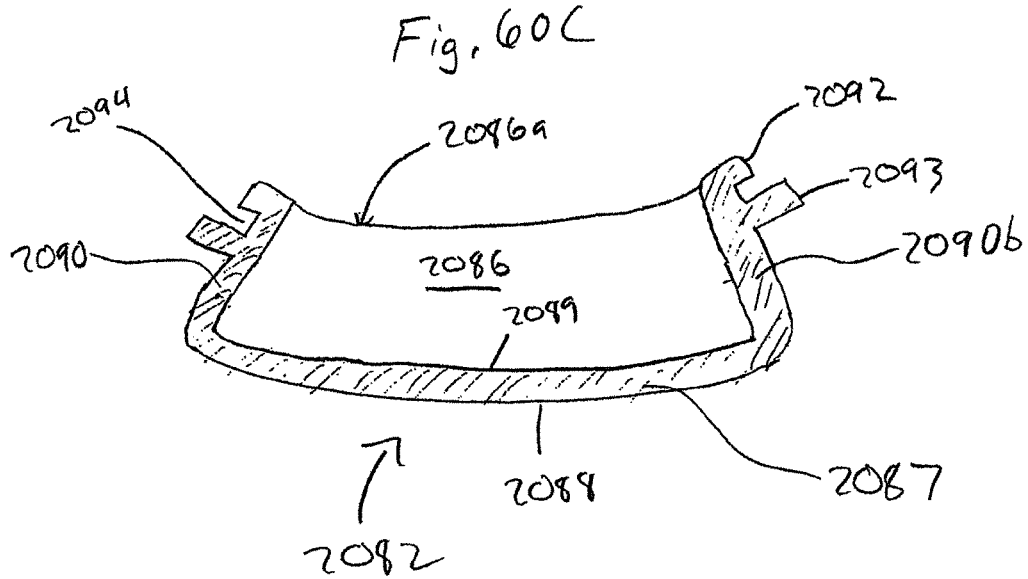
FIG. 60C is a cross-sectional view of the housing member taken along the line C-C of FIG. 60B.
Figure 60D:
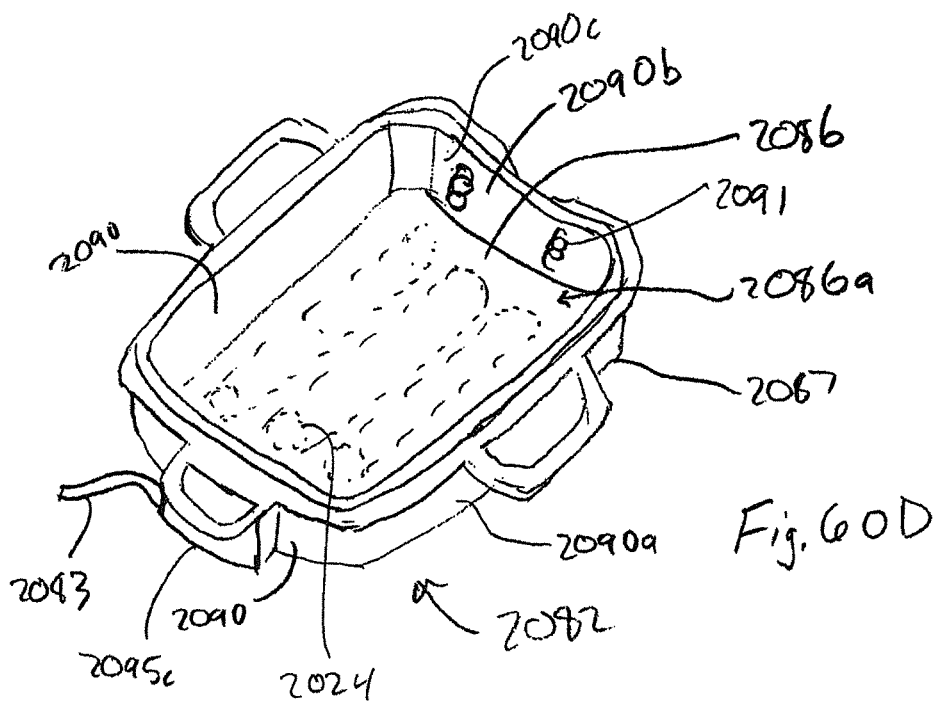
FIG. 60D is a perspective view of the housing member.
Figure 60B:
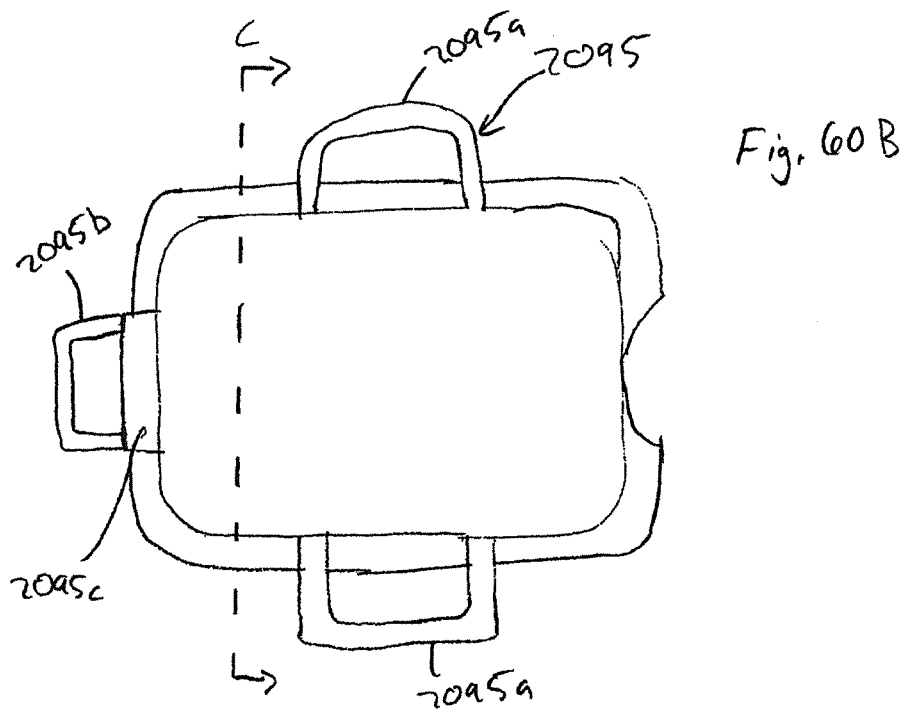
FIG. 60B is bottom plan view of a housing member of the power source assembly of FIG. 60A.
Figure 60E:
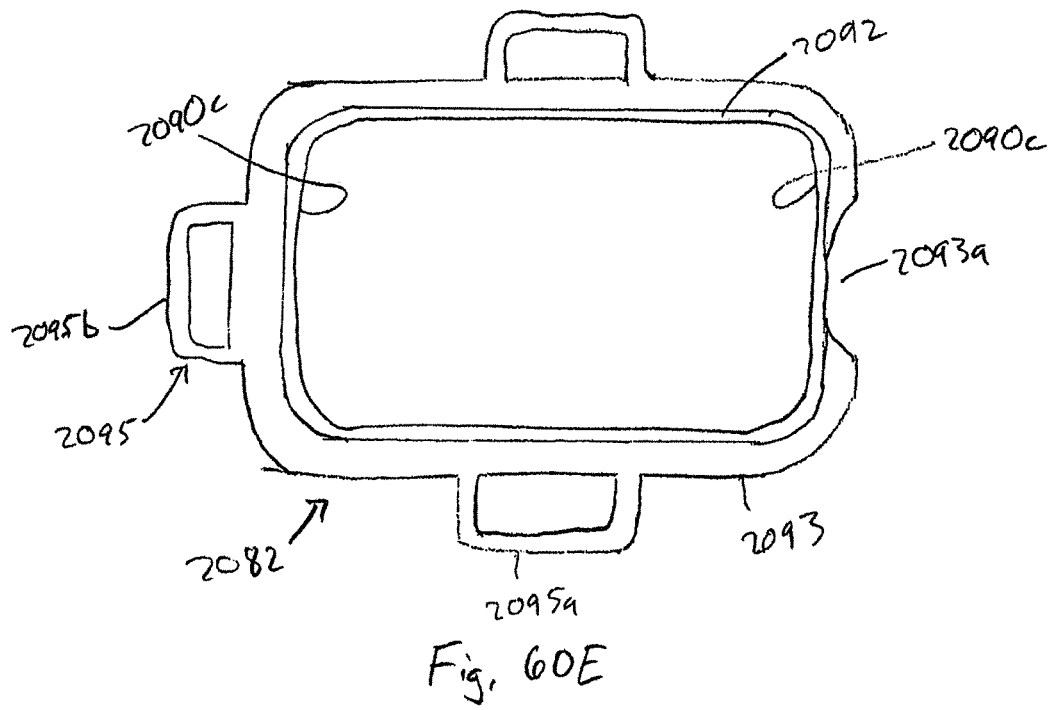
FIG. 60E is a top plan view of the housing member.
Figure 60F:
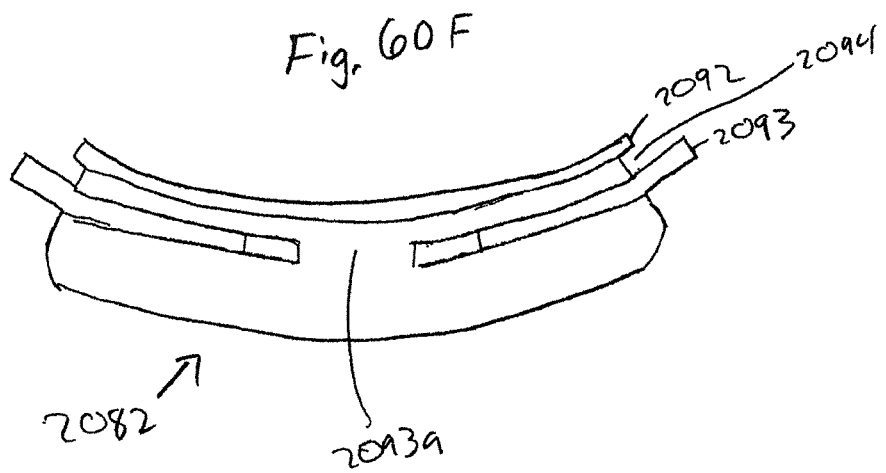
FIG. 60F is an elevational view of the housing member.
Figure 60G:
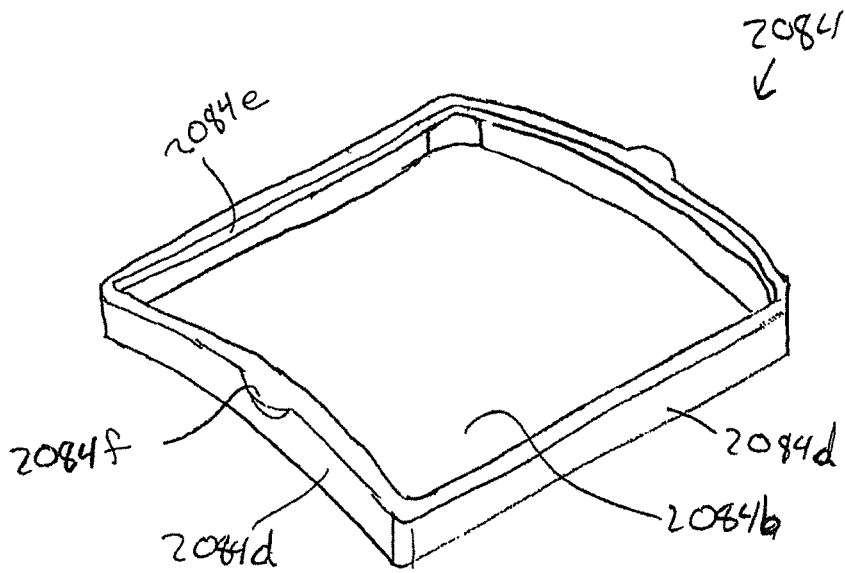
FIG. 60G is a perspective view of a cover member of the power source assembly of FIG. 36A.
Figure 60H:
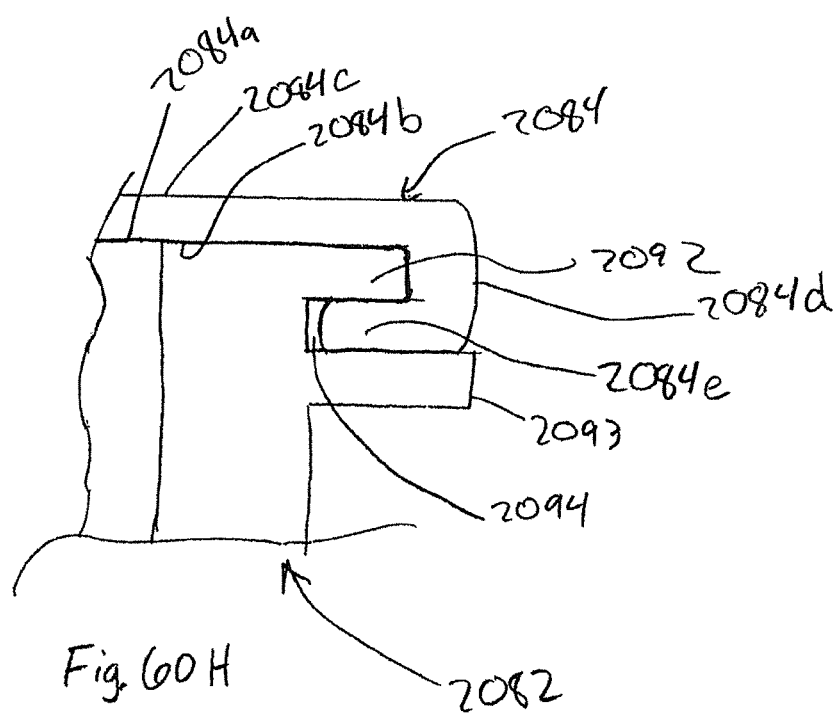
FIG. 60H is an enlarged, fragmentary cross-sectional view illustrating the mounting connection between the housing member and the cover member.
Figure 60:
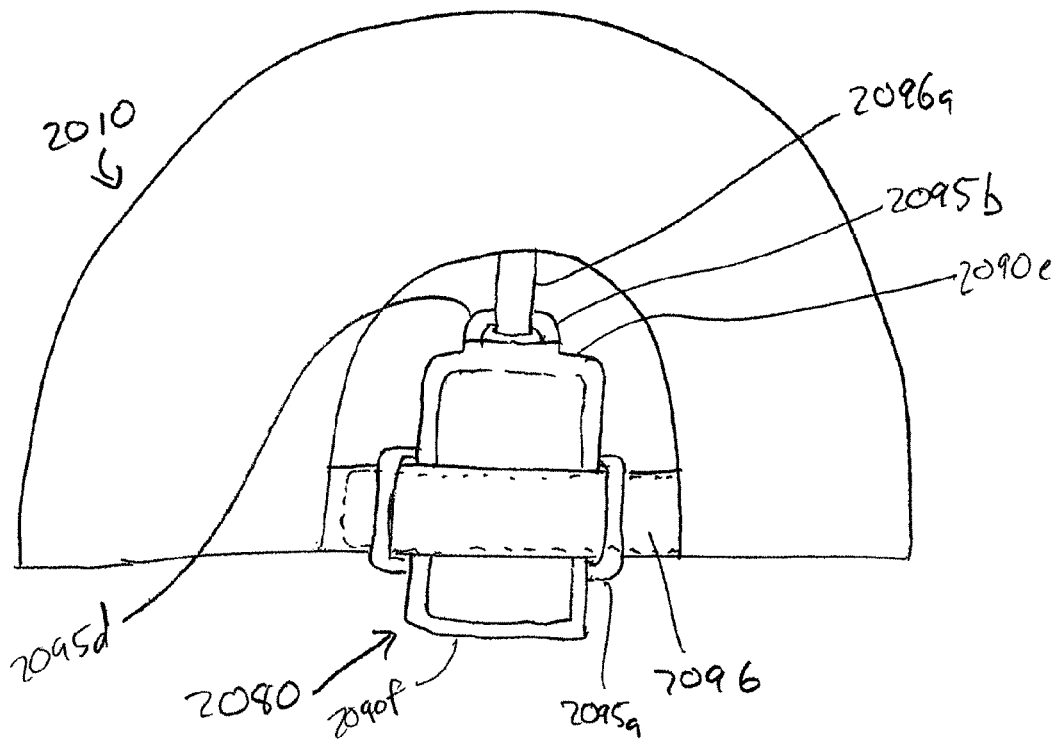
FIG. 60 is a rear elevational view of the alternative power module from FIG. 59.
Figure 60:
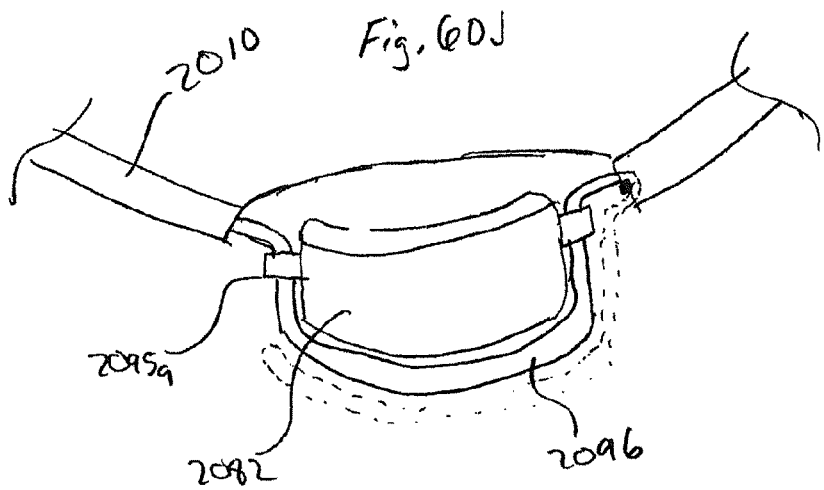
Figure 61:
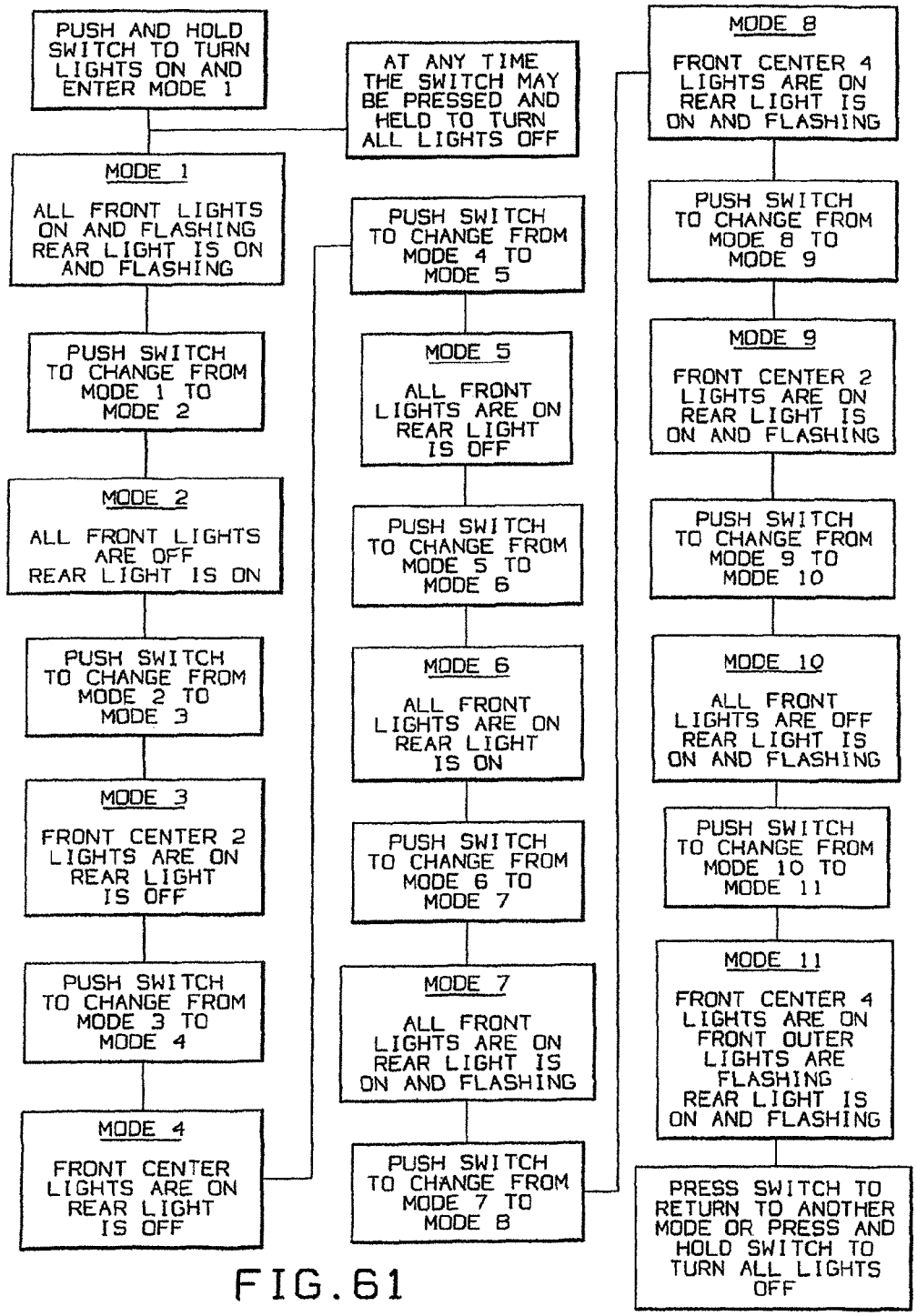
FIG. 61 is a flowchart illustrating the different operational modes of a lighted hat embodying features of the present invention.

Referring to FIGS. 59 and 60, the module 5070 is illustrated in more detail. The module 5070 includes the power source 5026 and a controller (not shown) to enable operation of the various modes of illumination. The power source 5026 is preferably coin-type or cylindrical batteries (i.e., AAA, or AA) that are in electrical communication with the LEDs 5024 and 5024. As shown, the module 5070 is elongated in size to house three AAA batteries. The housing 5070 also includes electrical wiring 5027 that extends therefrom to the brim mounted LEDS 5024 and the controller, circuit board, processor, or other device to control the illumination of the hat LEDs.

The module 5070 is preferably secured to the hat 5010 via a three-point securing system. Such a securing system is advantageous with the module 5070 with an enlarged power source, such as the cylindrical type batteries, due to the increased size and weight of the module. More specifically, for the first and second points of securement, the module 5070 includes left and right securing members 5072a and 5072b, respectively, that are disposed on opposite sides of the module 5070 to join the module to a rear hat sizing strap 5080. Each of the securing members 5072a and 5072b include a pair of guide arms 5074 and 5075 that extend outwardly from the module 5070 and generally angle inwardly toward each other. The guide arms 5074 and 5075 preferably do not contact each other at a distal end thereof, but leave a space 5076 therebetween. The space 5076 forms an entrance to the securing member 5072. The guide arms 5074 and 5075 also define a receiving space 5078 therebetween that is sized to receive the rear hat strap 5080 (FIGS. 56, 58, and 59).

To secure the module 5070 to the hat 5010, the rear sizing strap 5080 is threaded or joined to both securing members 5072a and 5072b. That is, the sizing strap 5080 is first inserted through the entrance 5076 of the first securing member 5072a and received in the space 5078 defined by the guide arms 5074 and 5075. The sizing strap 5080 is then extended around the rear of the module 5070 and inserted through the entrance 5076 of the second securing member 5072b on the opposite side of the module 5070 and received in the spaced 5078 defined therein. The strap 5080 is then pulled snug around the module 5070.

Again referring to FIGS. 59 and 60, the third point of securement is provided by a securing member 5072c on the upper edge of the module 5070. The securing member 5072c permits the module 5070 to be further secured to a portion of the crown 5014 in addition to the rear sizing strap 5080. In one form, the securing member 5072c includes a slot or other opening 5082 at the upper edge of the module 5070. The opening 5082 permits an elongate strip of material 5084 to be looped therethrough and secured to a portion of the crown (i.e., FIG. 56).

The three-point securing of the module 5070 permits a housing of larger size and weight to be securely fastened to the hat 5010 in a comfortable and convenient manner. The third point of securement on the upper edge of the module 5070 provided by the securing member 5072c helps balance the larger module 5070, which would be expected to tilt or bend away from the hat without such fastening. While a preferred securing mechanism is illustrated and described to join the module 5070 to the hat 5010, the module 5070 may also be secured to the hat through other fasteners, structures, or systems such as, but not limited to, screws, bolts, pins, adhesive, sewing, Velcro, and the like.

In an alternative form, as shown in FIGS. 60A-60J, a power module includes a power source or housing assembly 2080 having a generally curved profile. The power source assembly 2080 includes a housing member 2082 and a cover member 2084 mounted thereto. The housing member 2082 can be made of a rigid material and the cover member 2084 can be made of a flexible and resilient material. The housing member 2082 includes a power source compartment 2086 having an opening 2086a on one side thereof for inserting and removing the power source 2024 from the compartment 2086. The compartment 2086 can be configured and sized to receive three cylindrical-type batteries, such as AA or AAA batteries; however, other quantities of batteries and power source types may also be used. For instance, the power source compartment 2086 could be configured to receive rechargeable batteries or coin cell batteries. The housing member 2082 includes electrical wiring 2083 extending therefrom for connecting the power source 2024 to electrical components as desired. The rigid construction of the housing member 2082 is preferable when the power source 2024 is in the form of AA batteries or similarly weighted power sources.

The housing member 2082 has a generally curved profile along at least one axis thereof, such as a vertical axis, so that the housing member 2082 can conform to a curved portion of a user's head when the housing member 2082 is coupled to a head fitting portion of headgear. More particularly, the housing member 2082 includes a base wall portion 2087 having an outer major surface 2088, which is preferably outwardly facing when the housing member 2082 is coupled to the head fitting portion of the hat 2010, and an inner major surface 2089 that is adjacent to a user's head. So configured, the inner major surface 2089 has a generally concave curvature to generally complement the curvature of the user's head, and the outer major surface 2088 has a generally convex curvature. The outer and inner surfaces 2088 and 2089 can be parallel such that the base wall portion 2087 has a substantially constant thickness, and their radius of curvatures are substantially the same. The base portion 2087 transitions into four upstanding sidewalls 2090 at the outer edges thereof, which are shown extending generally perpendicular from the base portion 2087. The sidewalls 2090 include two longitudinal sidewalls 2090a and two lateral sidewalls 2090b. In one form, the base portion 2087 can have a thickness of approximately 1.25 mm and the sidewalls 2090 can have a thickness of approximately 1.25 mm; in another form, the base portion 2087 and the sidewalls 2090 can have a thickness of approximately 3.65 mm and 3.0 mm, respectively. Of course, other dimensions can also be used.

The power source compartment 2086 generally conforms to the curved profile of the housing member 2082. The lateral sidewall portions 2090b have opposing inner surfaces 2090c for mounting electrical contacts 2091 for the cylindrical batteries, with the longitudinal sidewall portions 2090a running generally parallel to the cylindrical battery central axes when the batteries are received therein. The rigid construction of the housing member 2082, and, particularly, the lateral sidewall portions 2090b thereof, provides a robust mounting surface for the electrical contacts 2091.

The housing member 2082 further includes a peripheral lip portion 2092 extending outwardly from the housing member 2082 at the upper ends of the sidewall portions 2090 extending about the opening 2086a of the power source compartment 2086. The housing member 2082 further includes a peripheral flange 2093 spaced from the peripheral lip portion 2092 down along the sidewalls 2090 and which extends outwardly from the sidewall portions 2090 of the housing member 2082 a distance greater than the lip portion 2092, as can be seen in FIG. 60c. In one form, the flange 2093 extends approximately 3 mm from the housing member 2082, with the lip portion 2092 extending approximately 1 mm from the housing member 2082. The lip portion 2092 and the flange 2093 define a channel 2094 therebetween running along the periphery of the housing member 2082 along the sidewalls 2090. In one form the lip portion 2092 and flange 2093 are each approximately 1 mm thick, and the channel 2094 is approximately 1 mm wide. Of course, other dimensions related to the housing member 2082 can also be used.

The housing member 2082 can also include one or more securing members or handles 2095 that extend outwardly from an outer surface 2082a of the housing member 2082, and are preferably integral therewith. The handles 2095, in conjunction with the sidewalls 2090, can have a closed loop form for receiving a strap 2096 through the space or opening formed between the handles 295 and the corresponding sidewalls 2090 from which they extend. The strap 2096 can be similar to the strap 5080 or another type of adjustable strap. In one form, the housing member 2082 includes three handles 2095 comprising two longitudinal side handles 2095a (similar to securing members 5072a and 5072b) disposed on opposite sides of the housing member 2082 and one lateral side handle 2095b (similar to securing member 5072c) disposed on a third one of the sidewalls 2090 for creating the three-point securing system previously described. The lateral side handle 2095b can include an integral base portion 2095c having an opening or passage (not shown) therethrough. The electrical wiring 2083 can extend through the passage in the integral base portion 2095c into the power source compartment 2086 to electrically connect the power source 2024 to auxiliary electrical components as desired.

As discussed above, the cover member 2084 has a curved profile corresponding to the overall curved profile of the housing member 2082. More particularly, the cover member 2084 has a curved main wall portion 2084a that includes a main inner surface 2084b having a convex curvature and a main outer surface 2084c having a concave curvature. The inner and outer surfaces 2084b and 2084c can be parallel such that the main wall portion 2084a has a substantially constant thickness and their radiuses of curvature are substantially the same. The main wall portion 2084a includes four upstanding wall portions 2084d at the outer edges, which are shown extending generally perpendicularly therefrom. The wall portions 2084c include a continuous inwardly projecting lip 2084e that extends entirely around edges thereof. The cover portion lip 2084e is sized and configured to fit into the channel 2094 of the housing member 2082. When the cover member 2084 is mounted to the housing member 2082, the wall portions 2084d and the cover lip portion 2084e will stretch and flex around the housing lip portion 2092 to allow the lip portion 2084e to deflect and be advanced past the housing lip portion 2092 to be received within the channel 2094 for securing the cover member 2084 to the housing member 2082 with a snap-fit connection.

The housing flange 2093 can include a cutout 2093a, and the cover portion 2084 can include a cover tab 2084f oriented to correspond to the location of the cutout 2093a when the cover member 2084 is mounted to the housing member 2082. Thus, a user can pull up on the cover tab 2084f to remove the cover member 2084 from its snap-fit connection to the housing member 2082 with the cutout 2093a aligned therewith, which provides an exposed surface that the user can engage for pulling the snap fit cover member 2084 off from the housing member 2082.

The power source assembly 2080 can be installed on the hat 2010 to the adjustable strap 2096 located at a rear portion of the hat 2010 and extending laterally thereacross. In one form, the power source assembly 2080 is oriented so that the convex curvature of the cover member 2084 conforms to the curvature of the rear portion of the hat 2010. This configuration provides added comfort to the wearer of the hat 2010. The cover member 2084 is positioned adjacent to a wearer's head and the flexible and resilient material of the cover member 2084 is generally softer and more comfortable than a rigid plastic material, thereby providing a gentler feeling when contacting the wearer's head. The curvature of the rear portion of the hat 2010 will generally conform to the curvature of a wearer's head when the hat 2010 is being worn. The curvature of the cover member 2082 will likewise curve around a portion of the wearer's head. Furthermore, the adjustable strap 2096 can be tightened so that the hat 2010 fits snugly around the wearer's head. A battery module having a flat configuration can result in localized pressure against the wearer's head when the strap 2096 is tightened, but the curved shape of the cover member 2084 will tend to spread out the pressure, resulting in a more comfortable wearing experience. Thus, the resiliency of the cover member 2084 provides for both the easy snap-fit attachment of the cover member 2084 to the housing member 2082 via the snap fit connection provided therebetween and increased comfort when the hat 2010 is worn.

The power source assembly or module 2080 is mounted to the rear portion of the hat 2010 by three points of securement therebetween in a manner similar to that which was previously described with respect to the module 5070. More particularly, the adjustable strap 2096 can pass through the spaces or openings between the longitudinal handles 2095a and the outer surfaces of the corresponding sidewalls 2090a to secure the power source assembly 2080 to the rear portion of the hat 2010 at two of the three points of securement. The two securing members or longitudinal handles 2095a thus form the first and second points of securement with the rear portion of the hat 2010. The strap 2096 can extend laterally across the outer major surface 2088 of the housing member 2082, with the housing member 2082 oriented so that the outer major surface 2088 is the rearward surface.

Furthermore, the power source assembly 2080 can be oriented so that the lateral handle 2095b is in the form of an upper securing member 2095d disposed at the top of the power source assembly 2080. The third point of securement is formed between the upper securing member 2095d and a loop or upper strap portion 2096a. The upper strap portion 2096a is located at the rear portion of the hat 2010, generally above and adjacent to the strap 2096 extending downwardly and transverse to the laterally extending strap 2096. The upper strap 2096a can be received through the opening or space between the lateral handle 2095b and the outer surface of the corresponding lateral sidewall portion 2090b, similar to the connection between the elongate strip of material 5084 and the securing member 5072c. When the power source assembly 2080 is oriented such that the lateral handle 2095b is oriented to be the upper handle or securing member 2095d, the corresponding lateral sidewall 2090b is in the form of an upper wall portion 2090e, the opposite lateral sidewall 2090*b* is in the form of a lower wall portion 2090*f*, and the upper securing member 2095*d* extends from the outer surface of the upper wall portion 2090*e*.

The upper strap portion 2096*a* can be irremovably mounted to the upper securing member 2095*d* in the form of a closed loop connection therebetween. Thus, while the strap 2096 can be easily adjusted within or removed from the openings between the longitudinal handles 2095*a* and the corresponding sidewalls 2090*a* to adjust the tightness of the hat 2010, the upper strap portion 2096*a* remains relatively secure, permitting rotation adjustment of the closed loop connection but substantially preventing removal of the upper strap portion 2096*a* from the upper securing member 2095*d*. Therefore, if the strap 2096 is removed, the power source assembly 2080 stays coupled to the hat 2010 via the upper strap portion 2096*a* to ensure that the assembly 2080 is not misplaced or that it does not drop to the ground from the hat 2010. However, the upper securing member 2095*d* could also be mounted to the upper strap portion 2096*a* in a manner permitting easy detachment if desired, such as by using a looped connection capable of repeated opening and closing, or providing a break in the upper securing member 2095*d*. The upper strap portion 2096*a* is preferably made from a flexible fabric material; however, other materials can also be used.

To enable the various illumination modes, the module 5070 also includes a controller, circuit board, or processor (not shown) and a control switch 5090 that energizes the LEDs and switches between the various modes of illumination. The control switch 5090 may be any type of switching mechanism, but is preferably a micro switch that is coupled to the controller. The switch 5090 energizes the illumination of LEDs 5024 and the LED 5025 and also switches the illumination between various modes, which is described in more detail below.

The LEDs 5024 and LED 5025 preferably energize in various modes controlled by the controller. To switch between the modes, the switch 5090 is pressed in a predetermined manner or pattern as generally described in the flowchart of FIG. 61 and summarized in Table 1 below. To initially energize either the LEDs 5024 or the LED 5025, the switch 5090 is pressed and held for a few seconds. Likewise, to de-energize the LEDs 5024 or 5025, the switch 5090 is pressed and held for a few seconds at any time during any illumination mode. While the following described a preferred operation of the hat 5010, it is only provided as an exemplary mode of operation:

TABLE 1

Exemplary Modes of Operation of Lighted Hat 5010

| | | Description of Illumination Mode | |
|---|---|---|---|
| Operation | Mode | Status of LEDs 5024 | Status of LED 5025 |
| Push and hold switch 5090 | 1 | All LEDs 5025 are energized sequentially (i.e., blinking) in sequence with LED 5025 | On and blinking in sequence with LEDs 5024 |
| Push switch 5090 once | 2 | Off | On |
| Push switch 5090 once | 3 | Two LEDs 5024 are energized (i.e., center two LEDs) | Off |
| Push switch 5090 once | 4 | Four LEDs 5024 are energized (i.e., center four LEDs) | Off |
| Push switch 5090 once | 5 | All LEDs 5024 are continuously energized | Off |
| Push switch 5090 once | 6 | All LEDs 5024 are continuously energized | Continuously energized |
| Push switch 5090 once | 7 | All LEDs 5024 are continuously energized | Blinking |
| Push switch 5090 once | 8 | Four LEDs 5024 are energized (i.e., center four LEDs) | Blinking |
| Push switch 5090 once | 9 | Two LEDs 5024 are energized (i.e., center two LEDs) | Blinking |
| Push switch 5090 once | 10 | Off | Blinking |
| Push switch 5090 once | 11 | Four LEDs 5024 are energized (i.e., center four LEDs) and two additional LEDs 5024 are blinking (i.e., outer two LEDs) | Blinking |
| Push switch 5090 once | 1 | (see above) | |
| Push and hold switch 5090 | OFF | OFF | OFF |

Figure 62:
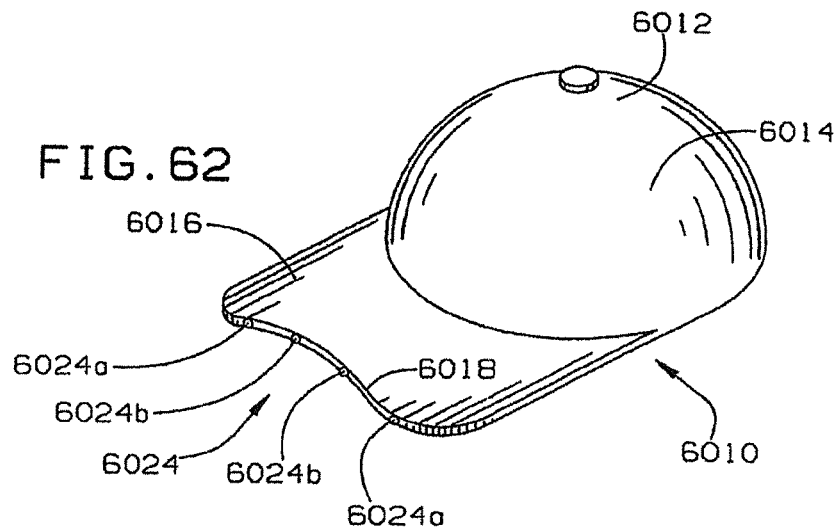
FIG. 62 is a front and side perspective view of an alternative lighted hat embodying features of the present invention.
Figure 63:
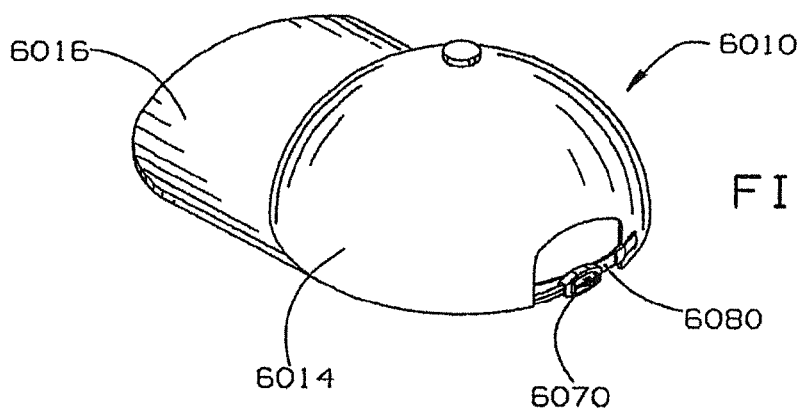
FIG. 63 is a rear and side perspective view of the alternative lighted hat of FIG. 62 showing a power module thereon having two selector switches.
Figure 64:
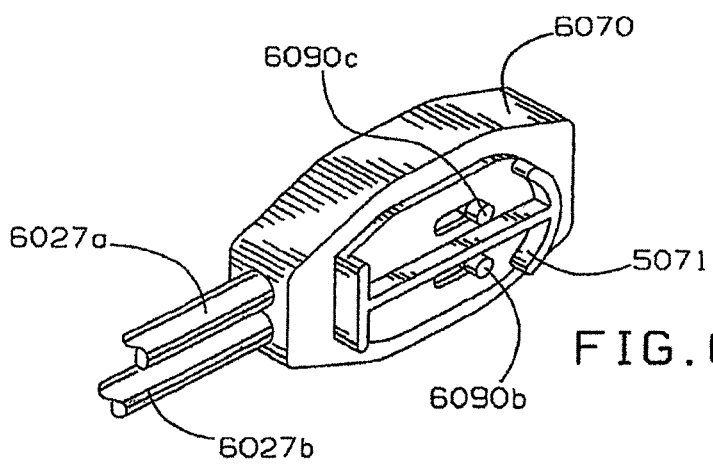
FIG. 64 is a perspective view of the power module of FIG. 63.

Referring to FIGS. 62-64 another lighted hat 6010 embodying features of the invention is illustrated. Similar to the previous hats, the hat 6010 is shown as a baseball-type cap 6012 with a crown 6014 and brim 6016, but may also be other types of headgear as well. The hat 6010 preferably includes four LEDs 6024 (i.e., 6024*a*, 6024*b*, 6024*c*, and 6024*d*) disposed at the outboard edge 6018 of the hat brim 6016. In this example, the hat includes two differently colored LEDs, such as two red LEDs 6024*a* and two white LEDs 6024*b*.

To energize the LEDs 6024, this embodiment includes a power source 6026 contained within a module 6070 having multiple switches that control and energize the LEDs 6024*a* and 6024*b* separately. As with the other hats described herein, the module 6070 is preferably mounted to a rear portion of the hat 6010. The module 6070 is similar to the modules described and illustrated in applicant's U.S. Pat. No. 6,863,416, which is incorporated by reference as if reproduced entirely herein. The module 6070 is preferably secured to a rear, size-adjustable strap 6080 through a fastener such as, but not limited to, a screw, adhesive, snap, Velcro, clip, or any other suitable securing mechanism.

The module 6070 includes two selector switches 6090*a* and 6090*b*. Each switch selectively energizes one of the LEDS 6024*a* or 6024*b*. For instance, switch 6090*a* energizes the red LEDs 5024*a* and switch 6090*b* energizes the white LEDs 6024*b*. In this regard, the module 6070 includes separate electrical wiring 6027*a* and 6027*b* that connects each selector switch 6090*a* or 6090*b* to each of the LEDs 6024*a* and 6024*b*. Optionally, the module 5070 includes profiled ribs 5071 surrounding the two switches 6090*a* and 6090*b*. The ribs 5071 provide a tactile surface to permit a user to easily locate either switch 6090*a* or 6090*b* via touch.

Figure 65:
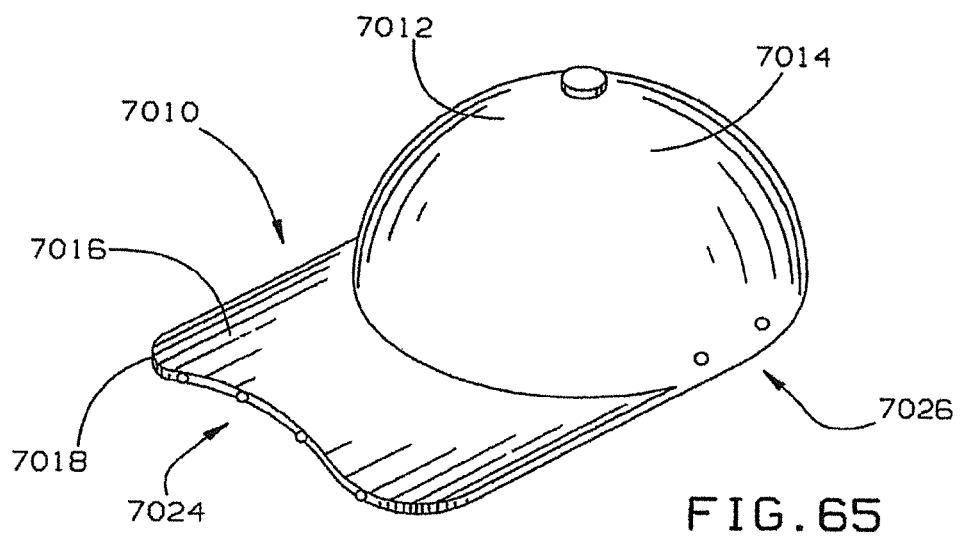
FIG. 65 is a perspective view of an alternative lighted hat embodying features of the present invention showing LEDs on the hat brim and LEDs on the sides the hat crown.
Figure 66:
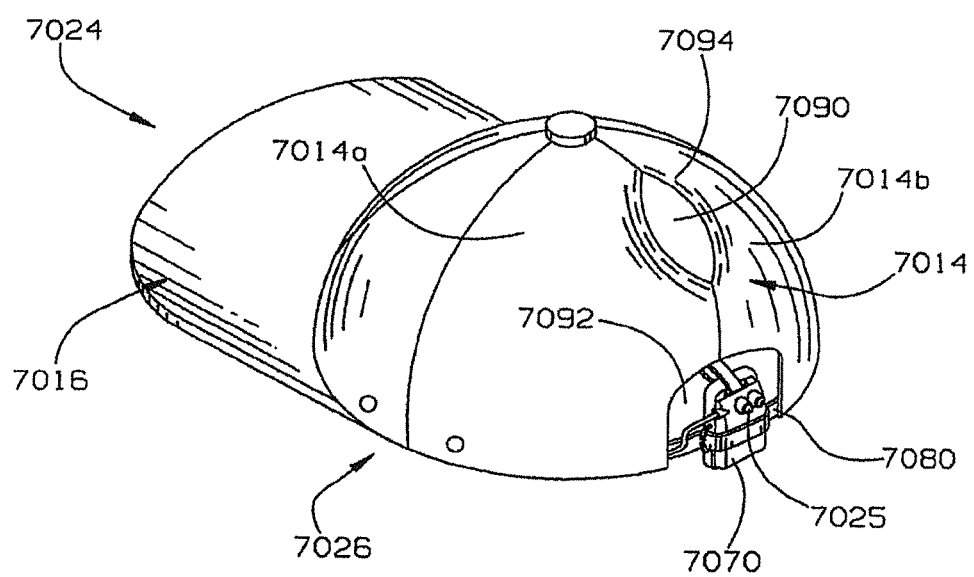
FIG. 66 is a rear perspective view of the lighted hat of FIG. 65 showing an opening in the rear of the hat crown configured to receive a pony tail
Figure 67:
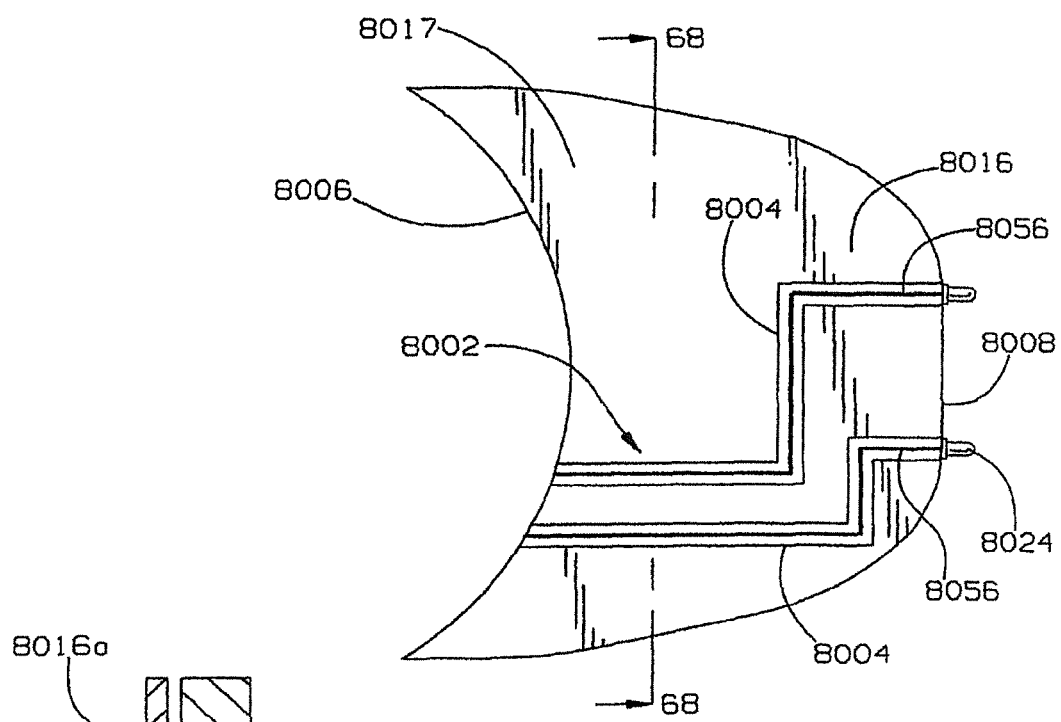
FIG. 67 is a plan view of an alternative brim member for lighted hats described herein showing a profile reducing feature in the form of a channel in a major surface of the hat brim.
Figure 68:
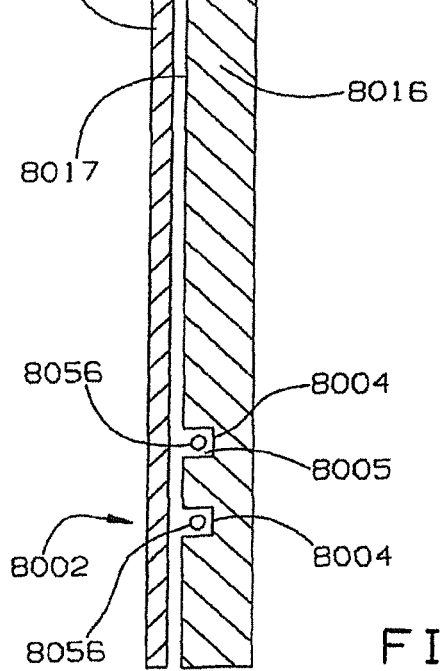
FIG. 68 is a cross-sectional view of the brim member of FIG. 67 generally taken along lines 68-68 showing the channel sized to receive electrical wiring.

Referring to FIGS. 65-66, another lighted hat 7010 embodying features of the present invention is illustrated having forward, rearward, and side directed illumination. In this regard, the hat 7010 includes a plurality of forwardly directed LEDs 5024 mounted in a hat brim, a rearwardly directed LED 7025 disposed at the rear of the hat, and side directed LEDs 7026 circumferentially mounted around a lower edge of the hat crown. The LEDs 7024, 7025, and 7026 may be energized in a variety of illumination modes that are summarized in Table 2 below; however, it will be appreciated that the illumination modes described below are only exemplary and other modes are possible.

The hat 7010 is also a typical baseball style cap 7012 with a crown 7014 and a brim 7016, but may also be other types of head gear. The brim 7016 includes the LEDs 7024 (six are illustrated, but may include more or less LEDs as desired) laterally spaced along a brim edge 7018. The crown 7014 includes the LEDs 7026 (two on each side are illustrated, but may include more or less as desired) circumferentially spaced on a lower edge thereof. A power and control module 7070 is disposed at the rear of the hat and also includes a rearwardly directly LED 7025. The other features of the hat 7010 are similar to the hats 6010 and 2010 previously described.

As best illustrated in FIG. 66, the hat 7010 also includes an opening 7090 on a rear portion of the hat crown 7014 that is sized for receipt of a pony tail or other styling of hair therethrough. The pony tail opening 7090 is desired in the hat 7010 because the module 7090 generally occupies the space on a traditional baseball cap through which a pony tail would normally be inserted. For instance, the hat crown 7014 includes a rear opening 7092 that is traversed by a size adjustable strap 7080. The opening 7092 and strap 7080 permit the larger, lower diameter of the hat to be adjusted to fit a variety of differently sized heads generally by lengthening or shortening the length of the size adjustable strap 7080. Typically, it the hat wearer has a pony tail, it would be inserted through the lower rear opening 7092 in the space about the size adjustable strap 7080. However, with the inclusion of the module 7070 on the rear of the hat and joined to the size adjustable strap 7080, much of the space formed by the lower rear opening 7092 is taken-up by the module 7070 making it more difficult to insert a pony tail

TABLE 2

Exemplary Illumination Modes of Hat 7010

| Operation | Mode | Status of LEDs 7024 | Status of LED 7025 | Status of LEDs 7026 |
|---|---|---|---|---|
| Push and hold switch 7090 | On | | | |
| | 1 | Two LEDs 7024 blink | Blinking in unison with LEDs 7024 | Blinking in unison with LEDs 7024 |
| Push switch 7090 once | 2 | Two LEDs 7024 energized (i.e. center two LEDs) | Off | Off |
| Push switch 7090 once | 3 | Four LEDs 7024 energized (i.e., center four LEDs) | Off | Off |
| Push switch 7090 once | 4 | All six LEDs 7024 energize | Off | Off |
| Push switch 7090 once | 5 | All six LEDs 7024 energize | Energized | All LEDs 7026 energized |
| Push switch 7090 once | 6 | All six LEDs 7024 energize | Blinking | Blinking in unison with LED 7025 |
| Push switch 7090 once | 7 | Four LEDs 7024 energized (i.e., center four LEDs) | Blinking | Blinking in unison with LED 7025 |
| Push switch 7090 once | 8 | Two LEDs 7024 energized (i.e. center LEDs) | Blinking | Blinking in unison with LED 7025 |
| Push switch 7090 once | 9 | Off | Blinking | Blinking in unison with LED 7025 |
| Push switch 7090 once | 10 | Two LEDs 7024 blinking (i.e., outer LEDs) | Blinking alternatively to LEDs 7024 | Blinking in unison with LED 7025 |
| Push switch 7090 once | 11 | All LEDs 7024 blinking in sequential order | Blinking | Blinking in unison with LED 7025 |
| Push switch 7090 once | 12 | Off | Energized | All LEDs 7026 energized |
| Push switch 7090 once | 1 | (see above) | | |
| Push and hold switch 7090 at any time | OFF | OFF | OFF | | through this opening. Accordingly, providing the pony tail opening 7090 on the rear of the hat crown 7014 permits a hat wearer with a pony tail to wear the hat as they would a typical base ball cap with their pony tail extending outwardly from the rear of the hat.

In one form, the pony tail opening 7090 is preferably an elongated slit formed in the material of the hat crown 7014 that is disposed above the rear opening 7092. In such location, the pony tail opening 7090 is positioned on the crown generally adjacent the normal position of a pony tail on a hat wearer. In this regard, the pony tail is conveniently inserted through the opening 7090 in a comfortable fashion rather than needing repositioning for insertion through the size adjustable lower rear opening 7092 on traditional baseball caps without the pony tail opening.

For durability, the opening 7090 preferably includes stitching 7094 therearound to prevent fraying or tearing of the material surrounding the opening. In another form, the pony tail opening 7090 is formed along one of the seams between the separate, triangular-shaped fabric panels 7014a and 7014b that are joined together to form the dome of the hat crown 7014. In many instances, these dome panels are sewn together. The pony tail opening 7090, therefore, may also be formed by an absence of stitching along a portion of two adjacent crown panels, such as the two rear facing panels 7014a and 7014b shown in FIG. 6.

Referring to FIGS. 67-74, an exemplary hat brim 8016 is illustrated incorporated profile reducing features 8002 that minimize any outward appearance of electrical wiring 8056 that connects the brim LEDs 8024 to the power source 54 (not shown in the these figures). The brim 8016 may be incorporated with any of the lighted hats illustrated and described herein. As such, the profile reducing features 8002 would be tailored to conform to the wiring and electrical connections that are appropriate for each individual lighted hat.

The profile reducing features 8002 include a channel, recess, or groove 8004 in an upper or lower surface of the brim member 8016. The channel 8004 is sized with a depth sufficient to receive the electrical wiring 8056 that extends across the brim 8016 so that the wiring 8056 preferably does not project therefrom. In this regard, a bottom wall 8005 of the channel 8004 can have a depth from the brim surface in which it is formed that is equal to or greater than the diameter of the wiring 8056 received therein. In this manner, the wiring 8056 is preferably embedded or hidden within the material forming the hat brim 8016 and preferably covered by a fabric brim material 8016a such that any unusual outward appearance of the brim containing the wiring 8056 is minimized or preferably eliminated such that the brim 8016 appears substantially as a traditional hat brim (i.e., a hat brim without the electrical wiring).

Preferably, the channels 8004 extend from a first end 8006 of the brim 8016, where the brim 8016 is adjacent a hat crown (not shown), across a major surface 8017 (i.e., upper surface or lower surface) of the brim to an arcuate, outboard edge 8008 of the brim at which the electrical connection to the LEDs 8024 is disposed. If desired, the channel 8004 may be sealed with the wiring 8056 therein using an appropriate sealant, such as varnish, resin, or other suitable sealant or the wiring may include the earlier described moisture barrier 58. In this manner, the channels 8004 provide an environment for the wiring 8056 that is sealed from water, moisture, humidity, or other conditions that may adversely effect the electrical operation of the hats.

Figure 69:
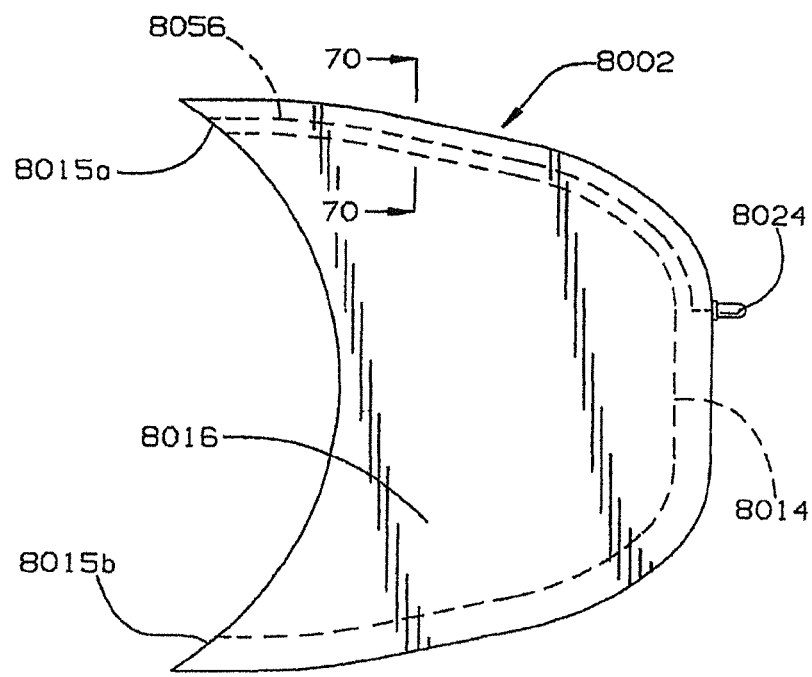
FIG. 69 is a plan view of another alternative brim member for lighted hats described herein showing an alternative profile reducing feature in the form of a channel in an outboard edge of the hat brim.
Figure 70:
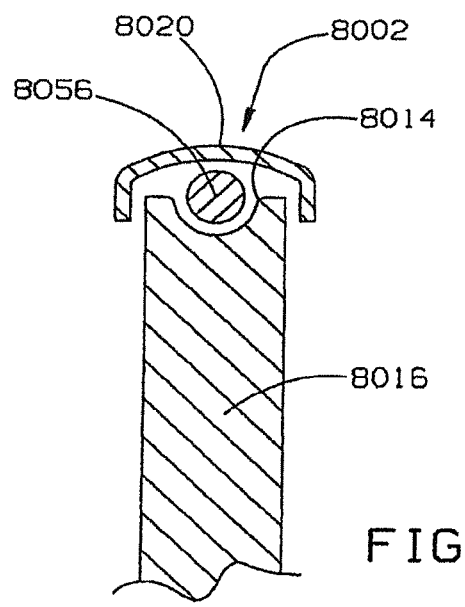
FIG. 70 is a cross-sectional view of the brim member of FIG. 69 generally taken along lines 70-70 showing the channel in the outboard edge sized to receive electrical wiring.

Referring to FIGS. 69 and 70, an alternative form of the profile reducing structure 8002 is illustrated in the form of a channel 8014 along the outboard edge 8008 of the hat brim 8016. In this embodiment, the profile reducing structure 8002 is disposed along the arcuate, outboard edge 8008 rather than the major surface 8017 of the brim 8016. That is, the channel 8014 formed in the area of the edge 8008 and extends therealong from a first end 8015a (i.e., an end of the edge 8008 disposed at an intersection of the brim 8016 with the hat crown) to an opposite end 8015b of the edge 8008 (i.e., a second end of the edge 8008 where the brim 8016 intersects with the hat crown at the other side of the brim).

As illustrated, the outward appearance of the brim edge 8080 with the wiring 8056 therein is minimized or hidden because the wiring 8056 is received within the channel 8014 and preferably covered with a strip of material 8020 extending along the edge 8008, such as the previously described piping material 5044. In this manner, the wiring 8056 is preferably embedded or hidden within the brim edge 8008 in order to render the brim 8016 substantially similar in appearance to a brim without the electrical wiring. While it is preferred that the edge 8008 be covered with the piping material 5044, the wire 8056 and channel 8014 may also be covered with the brim material 8016a or other covering typically used in assembling hat brims.

Figure 71:
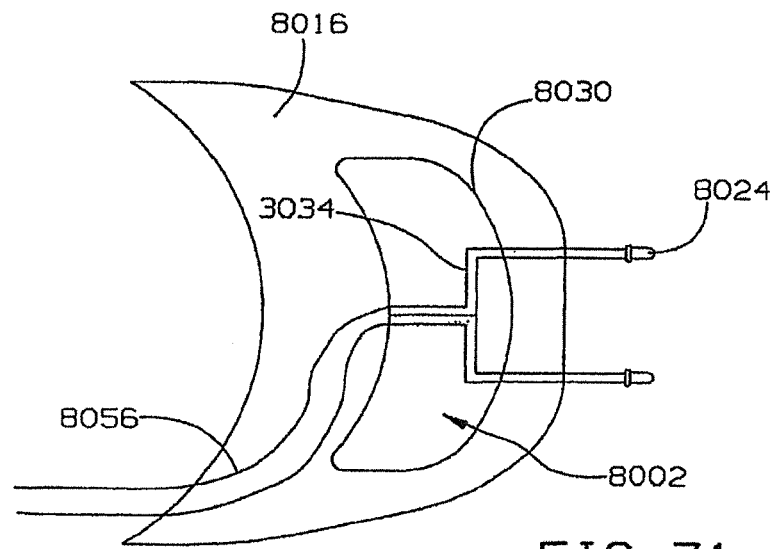
FIG. 71 is a plan view of another alternative brim member for lighted hats described herein showing another alternative profile reducing feature in the form of a flexible printed circuit board adhered to an upper major surface of the brim member.
Figure 72:
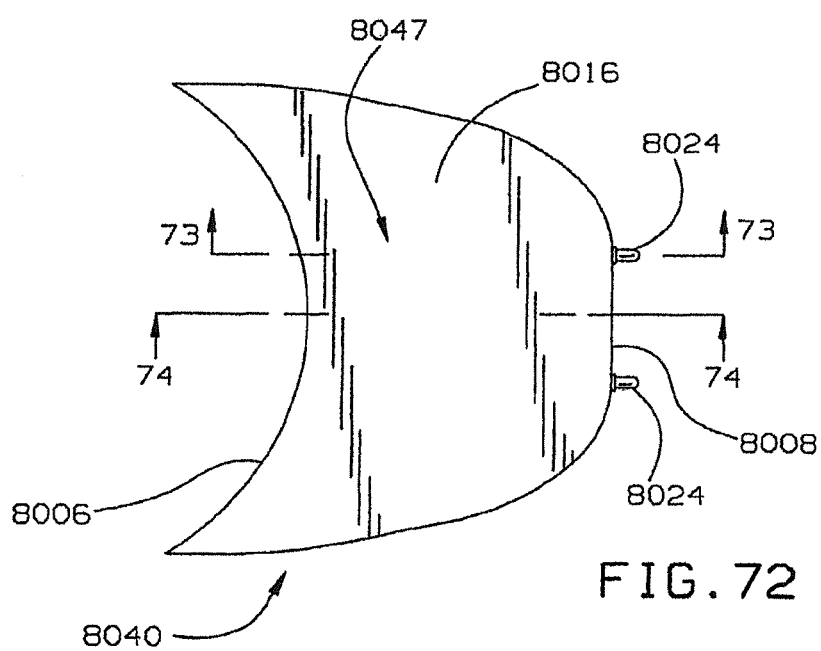
FIG. 72 is a plan view of another alternative brim member for lighted hats described herein showing another alternative profile reducing feature in the form of a laminate of separate brim pieces.

Referring to FIG. 71, another embodiment of the profile reducing structure 8002 is illustrated in the form of a low profile or thin, flexible circuit board 8030 adhered to one of the major surfaces 8017 of the brim 8016. The flexible circuit board 8030 includes a thin elongate ribbon 8032 having circuit traces 8034 thereon. The ribbon 8032 is preferably adhered to the brim material 8016 by a thin layer or separate spots of adhesive, glue or other thin fastener. When installed on a lighted hat, the circuit board 8030 is in electrical communication to the power source (not shown) via electrical wiring 8056 and includes connections to the brim mounted LEDs 8024, which are preferably soldered to the circuit board ribbon 8032. In one form, the profile reducing structure 8002 may be formed from the printed circuit board assembly 4010 previously described in FIGS. 53 and 54.

Referring to FIGS. 72-75, another embodiment of the profile reducing structure 8002 is illustrated in the form of a two-layer or three-layer brim laminate 8040 that permits electrical components to be embedded within multiple brim layers that are combined to form the brim 8016. For example, the brim laminate 8040 includes a first layer of brim material 8042, a second layer of brim material 8044, and a third layer of brim material 8046 sandwiched or compressed together with adhesive, glue, or the like to form the brim 8016. Alternatively, the brim laminate 8040 includes the first and third layers 8042 and 8046, respectively, with the second or intermediate layer 8044 being a flexible circuit board, such as any of the flexible circuit boards described herein.

Figure 73:
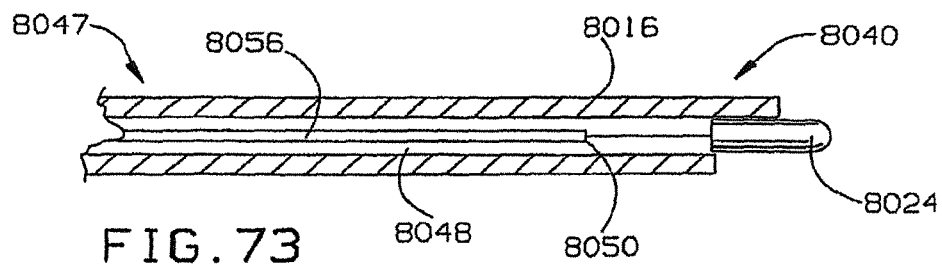
FIG. 73 is a cross-sectional view of the brim member of FIG. 72 generally taken along lines 73-73 showing a portion of the laminate that comprises an upper and lower laminate piece with an inner gap formed therebetween.
Figure 74:
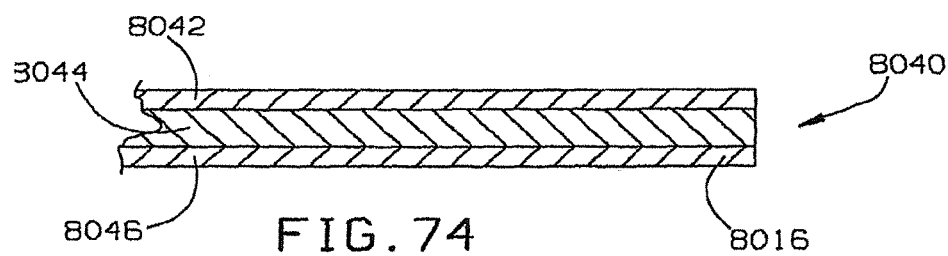
FIG. 74 is a cross-sectional view of the brim member of FIG. 72 generally taken along lines 74-74 showing a portion of the laminate that comprises an upper and lower laminate piece with an intermediate laminate piece therebetween.
Figure 75:
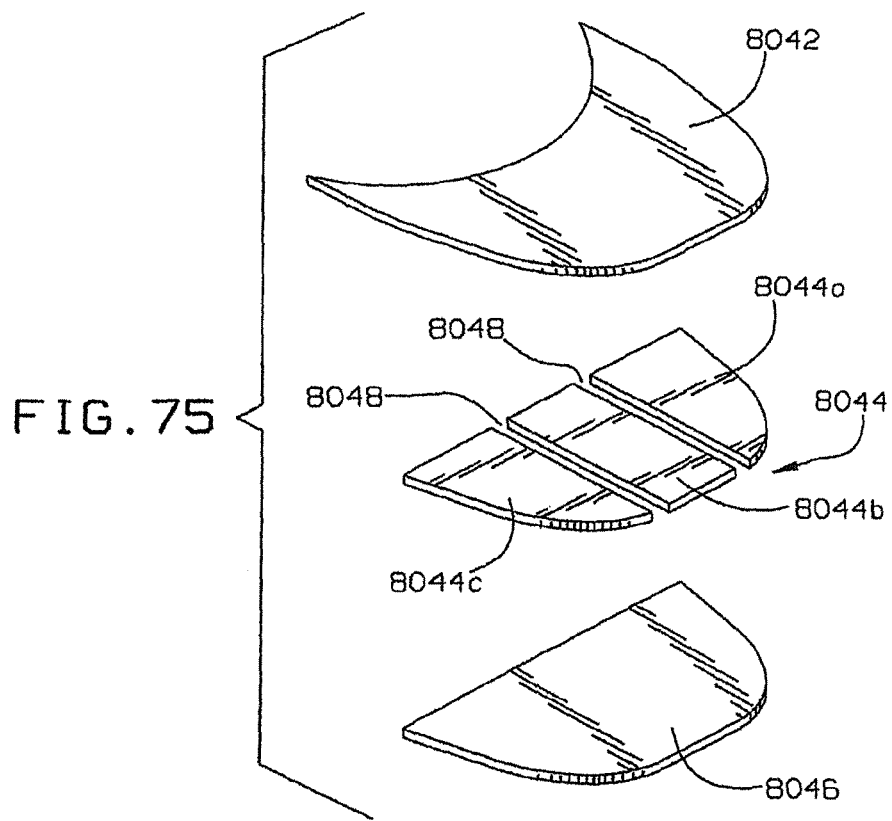
FIG. 75 is an exploded view of an exemplary three-piece laminate showing an intermediate layer formed from three separate pieces to form the gaps between the upper and lower laminate pieces.

As best illustrated in FIGS. 73 and 75, in one form, the brim laminate 8040 is a three-layer laminate that includes portions 8047 thereabout in which the second or middle layer 8044 of the brim laminate 8040 defines voids or other gaps 8048 therein. These voids 8048 provide a space within the laminate 8040 structure, such as a space in the middle layer 8044 for the electrical wiring 8056 or a flexible circuit board (i.e., circuit board 8030) to be contained therein. Preferably these voids 8048 extend from one edge 8006 of the brim to the outboard edge 8008.

For example, the voids 8048 are formed because the middle layer 8044 includes spaced, separate pieces of material 8044a, 8044b, and 8044c to form the gaps 8048 therebetween, as shown in FIG. 75. The electrical wiring 8056 or the circuit board 8030 are disposed in the gaps 8048. Of course, the size and shape of the voids 8048 will vary depending on the size, amount, and length of the wiring 8056 or correspond to the size and shape of the circuit board 8030 to be contained therein.

The three-layer laminate with the voids 8048 or the two-layer laminate with the circuit board sandwiched therebetween are advantageous because the electrical wiring or circuit board is embedded or contained within the laminate, and therefore, any outward appearance of the electrical wiring, such as ridges, bumps, or deformations of the hat is minimized and/or avoided so that the brim 8016 substantially retains the appearance of a traditional hat brim (i.e., a hat without the electrical wiring).

Furthermore, the brim laminate 8040 may also provided enhanced protection to a electrical wiring or a connection 8050 between the wiring 8056/circuit board 8030 with the brim LEDs 8024. As illustrated in FIG. 73, for example, the connection 8050 is also contained within the laminate structure (i.e., the voids) and embedded within the laminate structure. In this manner, the laminate provides protection to the connection 8050 by providing support on opposite sides of the connection 8050. That is, the connection 8050 is protected from stress, bending, or other damage due to the first and second laminate layers 8042 and 8046, respectively, disposed on opposite sides of the connection 8050.

Optionally, the gaps 8048 may also be filled with a sealant to minimize the penetration of water, moisture, or dirt therein. For example, the gaps 8048 may also be filled with the previously described moisture barrier, such as a resin, varnish, or other sealant to minimize moisture penetration therein.

Figure 76:
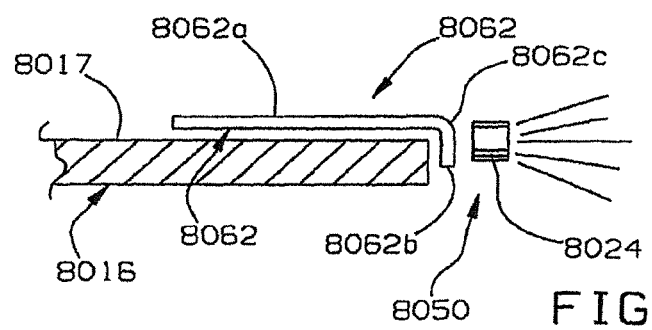
FIG. 76 is an elevational view of a brim member having a flexible printed circuit board thereon with a surface mount LED.

Referring to FIG. 76, an alternative LED mount 8060 is illustrated that also incorporates profile reducing features. The mount 8060 is formed from a flexible circuit board 8062 that is adhered to the brim 8016 through an adhesive or other suitable securement. The circuit board includes a major portion 8062a that extends along one of the brim major surfaces 8017 and a secondary, smaller portion 8062b that extends along the brim outboard edge 8008 and transition portion 8062c therebetween that flexes or bends around an edge of the brim between the major surface 8017 and the outboard edge 8008.

The secondary, smaller portion 8062b of the circuit board 8060 along the outboard edge 8008 is advantageous because it permits the use of smaller, surface mount LEDs 8024 to be joined thereto rather than traditional hole through mounting of parallel LEDs leads. In this manner, the connection 8050 between the LED 8024 and circuit board 8060 is minimized to reduce the profile and outward appearance of the brim 8016 once covered with the brim material 8016a or piping 8020.

Figure 77:
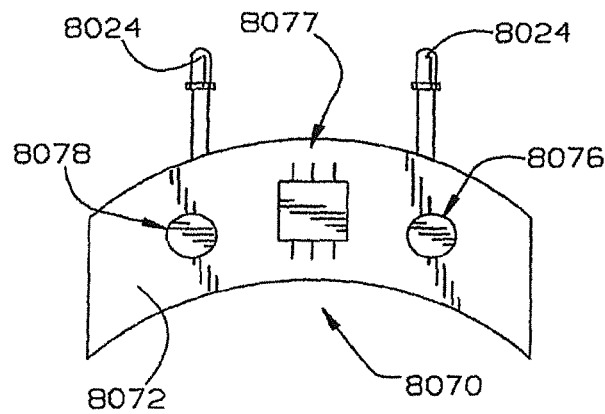
FIG. 77 is a plan view of a flexible printed circuit board that includes a microprocessor, a switch, and a power source.
Figure 78:
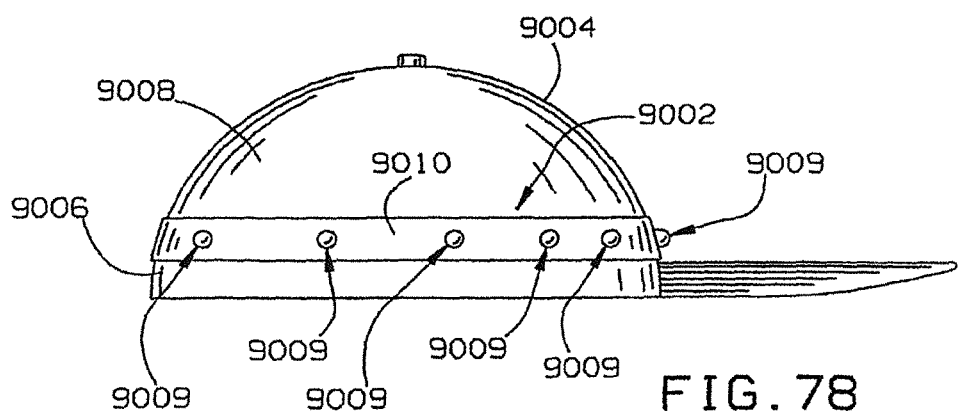
FIG. 78 is an elevational view of a baseball-type cap having a lighted headband wrapped around a lower crown portion thereof.

Referring to FIG. 77, another example of a flexible circuit board 8070 is illustrated that also incorporates profile reducing features. In this embodiment, the circuit board 8070 includes an elongate ribbon 8072 to which the LEDs 8024 are joined. The circuit board 8070 may also be secured to one of the brim major surfaces 8017, such as the top or bottom of the brim using adhesive, glue, or other suitable securing mechanism. The flexible circuit board 8070 is advantageous because it minimizes the profile of the hat brim providing a brim substantially similar to a hat brim without the circuit board.

The circuit board 8070 may includes other electrical components in order to enhance the performance of the LEDs 8024 or provide a more compact configuration such that the circuit board 8070 may be a self-contained illumination module. For example, the circuit board 8070 may also include a microprocessor 8074 that permits the LEDs to illuminate in various modes, such as blinking, flashing, or illumination in patterns, and the like. The microprocessor may also control other functions such a radio, charging features, the light source, an MP3 player, including an iPod, a telephone, and other electrical functions. To energize the LEDs 8024 and activate the processor 8074, the circuit board 8070 includes a switch 8076, such as a dome click switch that is activated through pushing the switch toward the circuit board. Alternatively, the circuit board may also include a slide switch or other types of energizing switches.

In this configuration, the circuit board 8070 may also include a power source 8078 integral therewith. For instance, the ribbon 8072 may include a thin, coin-type battery (or rechargeable battery) mounted on an upper surface of the ribbon 8072 or contained with an opening within the ribbon 8072. As mentioned, the circuit board 8070, therefore, may be a self-contained illumination module encompassing all the electrical components needed for the control and illumination of the LEDs 8024.

The circuit board 8070 may be used in the any of the hat embodiments described herein. For example, one preferred use is to incorporate the circuit board 8070 in the brim laminate 8040. In this regard, the circuit board 8070 may be contained within the voids 8048 or the circuit board 8070 may form the middle brim layer 8044 itself. In addition, the circuit board 8070 may be combined with the other hat features described herein. For instance, the circuit board 8070 may be used with any of the previously described power sources, such as the solar-power generator 50, the wind-based power generator 350, the motion power generator 450, or the photovoltaic cells 59a.

Referring to FIGS. 78-81, there is illustrated another form of hands free-lighting in the form of a lighted band 9002 that may be wrapped around headgear such as a baseball cap 9004 or simply wrapped around a wearers head like a sweat band. The lighted band 9002 is advantageous, therefore, because it may be used to convert a non-illuminated hat into a lighted hat simply by wrapping the lighted band 9002 around any portion of the hat, such as a lower portion 9006 of a crown 9008 of the hat 9004. The lighted band 9002 includes light sources 9009 (such as LEDs) spaced along a length of the band 9002 such that when wrapped around the cap 9004, the cap crown 9008 includes circumferentially spaced lights sources 9009. In one form, the light sources 9009 are differently colored LEDs, such as red, white, UV, or other colored LEDs.

The lighted band 9002 is also advantageous in that the direction of illumination therefrom may be manually adjusted through the placement or rotating adjustment of the band 9002 around the cap 9004. For instance, by rotating the band around the hat crown 9008, the direction of illumination from the light sources 9009 may be adjusted because the position of the light sources 9009 thereon can be positioned in any circumferential direction around the hat crown 9008 as desired by the hat wearer.

Turning to more of the details, the lighted band 9002 preferably includes a flexible, elongate circuit board 9010 of a predetermined length and width such that it may be wrapped around typical headgear, such as the baseball cap 9004. Preferably, the circuit board 9010 may range from about 9 to about 22 inches long and is about 0.5 to about 1.5 inches in width. Most preferably, the circuit board 9010 is about 22 inches long and about 1 inch wide. The board 9010 is formed from a flexible plastic sheet about 0.5 to about 10 mm thick or a laminate of such sheets and may be transparent, translucent, or opaque.

In order to secure the band 9002 around the hat crown 9008 or a wearer's head, in one form, the band 9002 includes portions of a coupling mechanism 9012 on opposite ends thereof. The coupling mechanism 9012 may include snaps, buttons, adhesive, Velcro, a slot/tab, or other known coupling mechanisms. For example, a first end 9002a of the band 9002 may include a projecting button 9012a and the opposite end 9002b of the band 9002 may include a receiving aperture or recess 9012b for snapping the button 9012a therein. Alternatively, the light band 9002 may also include a fastening device on an inner surface 9002c thereof that permits the band to be fastened directed to the hat. For example, the band inner surface 9002c may include spaced sections of Velcro, adhesive, snaps, buttons, tabs, or other fastening devices that permit the band 9002 to be secured directly to the outside of the hat crown 9008. In this instance, the band 9002 would not need to completely encircle the hat crown 9008, but may instead only wrap around a portion of the hat crown 9008.

The lighted band 9002 is preferably a self-contained illumination module that includes all the components necessary to control and energize the light sources 9009. Referring to FIGS. 79 and 80, the lighted band 9002 includes a one or more power sources 9014, a power switch 9016 that is in electrical communication with both the power source 9014 and the light source 9009, and an optional recharging port 9018 (FIG. 80) for external recharging of the power source 9014. The power source 9014 may be a thin, coin-type battery (i.e., a CR2032 size battery) or a small rechargeable battery. The power switch 9009 is a push button, dome-type switch, but may also be other types of switches, such as rocker-type switches, slide-type switches, or other electrical switches that may be used to energize and de-energize the light sources 9009. The recharging portion 9018 preferably includes a cover 9020, such as a rubber cap, that may be received over the port when not in use to protect the connection from moisture, dirt, dust, and water.

As best illustrated in FIG. 81, the lighted band 9002 also includes a seal 9030 surrounding the band 9002 in order to protect and minimize moisture, water, dirt, and/or dust from accumulating on the lighted band 9002, which may adversely effect operation thereof. In one form, the seal 9030 includes a pair of plastic sheets 9030a and 9030b that are sealed around the band 9002 by a heat seal, adhesive, sonic welding, solvent welding, or any other seal 9032 on an upper and lower edge thereof. An example of the plastic sheet may be a thin elongate strip of heat sealable plastic, such as a heat sealable film about 0.5 mm to about 5 mm thick. Preferably, the sheet 9030a on the front face of the band 9002 is transparent or translucent, while the sheet 9030b on the rear face of the band 9002 may be transparent, translucent, or opaque.

It will be understood that various changes in the details, materials, and arrangements of the parts and components that have been described and illustrated in order to explain the nature of the invention as claimed may be made by those skilled in the art within the principle and scope of the invention.

What is claimed is:

1. Headgear having a power module mounted thereto, the headgear comprising:
   a head fitting portion configured for being received on a user's head and having a front portion and a rear portion;
   a brim portion extending generally forwardly from the head fitting portion front portion;
   an adjustable strap portion of the head fitting portion at the rear portion thereof;
   a housing portion of the power module configured for receiving a power source therein;
   a pair of handle portions of the power module disposed on opposite sides of the housing portion;
   openings between the handle portions and the housing portion for receiving the adjustable strap portion of the head fitting portion therethrough for mounting the power module to the headgear;
   an upper handle portion extending from an upper wall portion of the housing portion;
   an upper opening between the upper handle portion and the upper wall portion; and
   an upper strap member coupled to the rear portion of the head fitting portion and extending through the upper opening for securing the power module to the headgear.

2. The headgear of claim 1 further comprising a flexible cover member mounted to the housing portion for securing a power source therein.

3. The headgear of claim 2 wherein the housing portion is generally rigid and the flexible cover member is mounted to the housing portion by a snap fit connection therebetween.

4. The headgear of claim 3 wherein the flexible cover member includes a lip portion; the housing portion includes a channel portion, and the flexible cover member is configured to deflect to allow the lip portion to be received in the housing portion channel portion for creating the snap fit connection.

5. The headgear of claim 2 wherein the housing portion and the flexible cover member have a generally curved profile generally matched to the curvature of a head.

6. The headgear of claim 1 wherein the housing portion has an outward facing surface relative to the head fitting portion, and the adjustable strap portion extends across the outward facing surface of the housing portion.

7. Headgear having a power module mounted thereto, the headgear comprising:
   a head fitting portion of the headgear configured for being received on a user's head and having front and rear portions;
   a brim portion extending generally forwardly from the front portion of the head fitting portion;
   a rear strap portion of the head fitting portion at the rear portion thereof;
   a housing assembly of the power module comprising a housing member and a cover member mounted thereto, the housing member having two longitudinal sidewall portions and upper and lower sidewall portions extending therebetween, and at least two longitudinal handle portions extending from outer surface portions of the two longitudinal sidewall portions, wherein the rear strap portion is received through openings between the two longitudinal handle portions and the corresponding outer surface portions of the two longitudinal sidewall portions for mounting the housing assembly to the headgear;
   a power source compartment of the housing member sized for receiving a power source therein; and
   a main outer surface of the cover member having a generally curved configuration for resting against a user's head.

8. The headgear of claim 7 wherein the cover member and housing member have a snap fit connection therebetween.

9. The headgear of claim 8 wherein the cover member includes an inwardly extending lip portion; the housing member includes an outwardly facing channel portion; and the lip portion of the cover member is sized to be received within the channel portion of the housing member by the snap fit connection therebetween.

10. The headgear of claim 7 wherein the housing member further includes an upper handle portion extending from an outer surface portion of the upper sidewall portion.

11. The headgear of claim 7 wherein the housing member includes a main outer surface having a generally convexly curved configuration and the main outer surface of the cover member has a generally concavely curved configuration.

12. The headgear of claim 7 wherein the cover member comprises a flexible cover member.

13. Headgear having a power module mounted thereto, the headgear comprising:
- a housing assembly of the power module comprising a housing member and a cover member mounted thereto, the housing member having two longitudinal sidewall portions and upper and lower sidewall portions extending therebetween;
- at least two longitudinal handle portions of the housing member extending from outer surface portions of the two longitudinal sidewall portions;
- an upper handle portion of the housing member extending from an outer surface portion of the upper sidewall portion;
- a power source compartment of the housing member sized for receiving a power source therein;
- a main outer surface of the cover member having a generally curved configuration for resting against a user's head;
- a head fitting portion of the headgear configured for being received on a user's head and having front and rear portions;
- a brim portion extending generally forwardly from the front portion of the head fitting portion;
- a laterally extending rear strap portion of the head fitting portion received through openings between the two longitudinal handle portions and the corresponding outer surface portions of the two longitudinal sidewall portions; and
- an upper rear strap of the head fitting portion adjacent to the laterally extending rear strap portion and received through an opening between the upper handle portion and the outer surface of the upper sidewall portion.

14. The headgear of claim 13 wherein the cover member comprises a flexible cover member.

15. The headgear of claim 14 wherein the housing member is generally rigid and the flexible cover member is mounted to the housing member by a snap fit connection therebetween.

16. The headgear of claim 15 wherein flexible cover member includes a lip portion; the housing member includes a channel portion, and the flexible cover member is configured to deflect to allow the lip portion to be received in the housing member channel portion for creating the snap fit connection.

17. The headgear of claim 14 wherein the housing member and the flexible cover member have a generally curved profile generally matched to the curvature of a head.

* * * * *

UNITED STATES PATENT AND TRADEMARK OFFICE
CERTIFICATE OF CORRECTION

PATENT NO. : 9,526,292 B2
APPLICATION NO. : 13/725558
DATED : December 27, 2016
INVENTOR(S) : Michael Waters Page 1 of 1

It is certified that error appears in the above-identified patent and that said Letters Patent is hereby corrected as shown below:

On the Title Page

Item (54) and in the Specification, Column 1, Line 1, Title, delete "MODULES" and insert -- MODULE --, therefor.

Signed and Sealed this
Second Day of May, 2017

Michelle K. Lee
*Director of the United States Patent and Trademark Office*